US005619174A

United States Patent [19]

Kimura et al.

[11] Patent Number: 5,619,174

[45] Date of Patent: Apr. 8, 1997

[54] NOISE FILTER COMPRISING A SOFT MAGNETIC ALLOY RIBBON CORE

[75] Inventors: Youichi Kimura; Akihiro Makino, both of Niigata; Tsuyoshi Masumoto; Akihisa Inoue, both of Miyagi, all of Japan

[73] Assignees: Alps Electric Co., Ltd.; Research Development Corp. of Japan, both of Tokyo; Tsuysohi Masumoto, Sendai, all of Japan

[21] Appl. No.: 283,133

[22] Filed: Jul. 29, 1994

[30] Foreign Application Priority Data

Jul. 30, 1993 [JP] Japan .................................... 5-190673

[51] Int. Cl.[6] .............................. H03H 7/09; H01F 27/02

[52] U.S. Cl. ............................ 333/181; 336/90; 336/100; 420/121; 148/306

[58] Field of Search .................................... 148/305, 306, 148/307, 308, 310; 420/121; 333/181; 336/90, 100

[56] References Cited

U.S. PATENT DOCUMENTS

| | | | |
|---|---|---|---|
| 4,257,830 | 3/1981 | Tsuya et al. | 148/112 |
| 4,325,096 | 4/1982 | Sunohara et al. | 361/45 |
| 4,623,387 | 11/1986 | Masumoto et al. | 420/41 |
| 4,718,475 | 1/1988 | Das et al. | 164/415 |
| 4,735,865 | 4/1988 | Nago et al. | 428/610 |
| 4,750,951 | 6/1988 | Makino et al. | 148/304 |
| 4,842,657 | 6/1989 | Masumoto et al. | 148/403 |
| 4,889,568 | 12/1989 | Datta et al. | 148/108 |
| 4,918,555 | 4/1990 | Yoshizawa et al. | 360/125 |
| 4,985,089 | 1/1991 | Yoshizawa et al. | 148/303 |
| 5,028,280 | 7/1991 | Ihara et al. | 148/306 |
| 5,069,731 | 12/1991 | Yoshizawa et al. | 148/305 |
| 5,144,999 | 9/1992 | Makino et al. | 164/423 |
| 5,148,855 | 9/1992 | Ashok | 164/479 |
| 5,160,379 | 11/1992 | Yoshizawa et al. | 148/108 |
| 5,225,006 | 7/1993 | Sawa et al. | 148/307 |
| 5,443,664 | 8/1995 | Nakajima et al. | 148/307 |

FOREIGN PATENT DOCUMENTS

| | | | |
|---|---|---|---|
| 242063 | 9/1960 | Australia . | |
| 0072893 | 5/1982 | European Pat. Off. . | |
| 0271657 | 10/1987 | European Pat. Off. . | |
| 1227371 | 9/1989 | Japan | 439/620 |
| 2-125801 | 5/1990 | Japan . | |
| WO84/03852 | 10/1981 | WIPO . | |
| WO87/00462 | 1/1987 | WIPO . | |

OTHER PUBLICATIONS

Inoue, A., et al., "Mechanical Properties and Thermal Stability of Hf–Poor (Fe, Co, Ni)–Hf Binary Amorphous Alloys", *Conference on Metallic Glasses: Science and Technology, Budapest,* 217–221, (1980).

Yoshizawa, Y., et al., "Fe–Based Soft Magnetic Alloys Composed of Ultrafine Grain Structure", vol. 31, No. 4, *Materials Transaction JIM,* 307–314, (1990).

*Primary Examiner*—Benny T. Lee
*Assistant Examiner*—Justin P. Bettendorf
*Attorney, Agent, or Firm*—Guy W. Shoup; Patrick T. Bever

[57] ABSTRACT

A noise filter includes an annular magnetic core made of a soft magnetic alloy ribbon mainly made of Fe and containing B and at least one element selected from a group consisting of Ti, Zr, Hf, Nb, Ta, Mo and W, at least 50% of the soft magnetic alloy structure being composed of body-centered cubic structured fine grains having an average grain size of 30 nm or below, a casing for accommodating the magnetic core and having an insulating plate, a pair of coils separated from each other by the insulating plate, and an electronic circuit for connecting a core element made up of the magnetic core, the casing and the coils.

53 Claims, 40 Drawing Sheets

NOISE FILTER COMPRISING A SOFT MAGNETIC ALLOY RIBBON CORE

BACKGROUND OF THE INVENTION

The present invention relates to a noise filter incorporated in, for example, a switching power source or a DC-DC converter.

In recent years, a reduction in the size, weight and production cost of the office automation (OA) equipment has advanced, and the significance of the above-described types of power sources in the OA equipment has grown, thus increasing a demand for a reduction in the size of such a power source or a noise filter incorporated in the power source.

Noise filters, whose size reduction has been demanded, must have a higher attenuation capability in order to cope with higher frequencies.

Generally, the characteristics required for the soft magnetic material for use in a magnetic core of a noise filter are as follows:

(1) High saturation magnetization (2) High magnetic permeability (3) Low coercive force, and (4) Thin shape which can easily be formed.

In view of the above, various alloys have been studied in the course of developing such soft magnetic alloys for use as in a magnetic core of a noise filter. Particularly, alloys exhibiting higher saturation magnetization and higher permeability have been studied in order to achieve reduction in the size of the noise filter and an increase in the frequencies that the noise filter can cope with.

Conventional materials for use in the magnetic core of a noise filter are crystalline alloys, such as Fe—Al—Si alloy Permalloy or silicon steel, and Fe-based or Co-based amorphous alloys.

However, Fe—Al—Si alloy suffers from a disadvantage in that the saturation magnetization thereof is as low as about 11 kG, although it exhibits excellent soft magnetic characteristics. Permalloy, which has an alloy composition exhibiting excellent soft magnetic characteristics, also has a saturation magnetization as low as about 8 kG. Silicon steel (Fe—Si alloys) has inferior soft magnetic characteristics, although they have a high saturation magnetization.

Co-based amorphous alloys have an insufficient saturation magnetization, which is about 10 kG, although they exhibit excellent soft magnetic characteristics. Fe-based amorphous alloys tend to exhibit insufficient soft magnetic characteristics, although they have a high saturation magnetization, which is 15 kG or above. Further, amorphous alloys are insufficient in terms of the heat stability and this deficiency may cause a problem.

Thus, it is conventionally difficult to provide a material exhibiting both high saturation magnetization and excellent soft magnetic characteristics. This in turn makes it difficult to provide a noise filter exhibiting sufficient attenuation characteristics.

SUMMARY OF THE INVENTION

The present invention provides a noise filter which comprises: an annular magnetic core made of a soft magnetic alloy ribbon mainly made of Fe and containing B and at least one element selected from a group consisting of Ti, Zr, Hf, Nb, Ta, Mo and W, at least 50% of the soft magnetic alloy structure being composed of body-centered cubic structured fine grains having an average grain size of 30 nm or below; a casing accommodating the magnetic core; a pair of coils separated from each other; and an electrical circuit for connecting a core element made up of the magnetic core, the casing and the coils.

In the present invention, various modifications and changes in the composition of the soft magnetic core ribbon may be made. Composition examples of the soft magnetic alloy ribbon will be described below. Composition 1: $Fe_b B_x M_y$ where M is at least one element selected from a group consisting of Ti, Zr, Hf, V, Nb, Ta, Mo and W combined with Zr and/or Hf, 75<b<93 atomic percent, 0.5<x<10 atomic percent, and 4<y<9 atomic percent. Composition 2: $Fe_b B_x M_y X_u$ where M is at least one element selected from a group consisting of Ti, Zr, Hf, V, Nb, Ta, Mo and W combined with Zr and/or Hf, X is at least one element selected from a group consisting of Cr, Ru, Rh and Ir, 75<b<93 atomic percent, 0.5<x<10 atomic percent, 4<y<9 atomic percent, and u<5 atomic percents. Composition 3: $(Fe_{1-a} Z_a)_b B_x M_y$ where Z is Co and/or Ni, M is at least one element selected from a group consisting of Ti, Zr, Hf, V, Nb, Ta, Mo and W combined with Zr and/or Hf, a<0.1 atomic percents, 75<b<93 atomic percent, 0.5<x<10 atomic percent, and 4<y<9 atomic percent. Composition 4: $(Fe_{1-a} Z_a)_b B_x M_y X_u$ where Z is Co and/or Ni, M is at least one element selected from a group consisting of Ti, Zr, Hf, V, Nb, Ta, Mo and W combined with Zr and/or Hf, X is at least one element selected from a group consisting of Cr, Ru, Rh and Ir, a <0.1 atomic percent, 75<b<93 atomic percent, 0.5<x<10 atomic percent, 4<y<9 atomic percent, and u<5 atomic percent. Composition 5: $Fe_b B_x M'_y$ where M' is at least one element selected from a group consisting of Ti, V, Nb, Ta, Mo and W combined with Nb, 75<b<93 atomic percent, 6.5<x<10 atomic percent, and 4<y<9 atomic percent. Composition 6: $Fe_b B_x M'_y X_u$ where M' is at least one element selected from a group consisting of Ti, V, Nb, Ta, Mo and W combined with Nb, X is at least one element selected from a group consisting of Cr, Ru, Rh and Ir, 75<b<93 atomic percent, 6.5<x<10 atomic percent, 4<y<9 atomic percent, and u<5 atomic percents. Composition 7: $(Fe_{1-a} Z_a)_b B_x M'_y$ where Z is Co and/or Ni, M' is at least one element selected from a group consisting of Ti, V, Nb, Ta, Mo and W combined with Nb, a<0.1 atomic percent, 75<b<93 atomic percent, 6.5<x<10 atomic percent, and 4<y<9 atomic percent. Composition 8: $(Fe_{1-a} Z_a)_b B_x M'_y X_u$ where Z is Co and/or Ni, M' is at least one element selected from a group consisting of Ti, V, Nb, Ta, Mo and W combined with Nb, X is at least one element selected from a group consisting of Cr, Ru, Rh and It, a<0.1 atomic percent, 75<b<93 atomic percent, 6.5<x<10 atomic percents, 4<y<9 atomic percents, and u<–5 atomic percents. Composition 9: $Fe_b B_x M_y T_z$ where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, 75<b<93 atomic percents, 0.5<x<18 atomic percent, 4<y<10 atomic percents, and z<4.5 atomic percent. Composition 10: $Fe_b B_x M_y T_z X_u$ where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and Ir, 75<b<93 atomic percent, 0.5<x<18 atomic percents, 4<y<10 atomic percent, z<4.5 atomic percent, and u<5 atomic percents. Composition 11: $(Fe_{1-a} Z_a)_b B_x M_y T_z$ where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, a<0.1 atomic percent, 75<b<93 atomic percent, 0.5<x<18 atomic percent, 4<y<10 atomic percent, and z<4.5 atomic percent. Composition 12: $(Fe_{1-a} Z_a)_b B_x M_y T_z X_u$ where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and It, a <0.1 atomic percent, b<75 to 93 atomic percent, 0.5<x<18 atomic percent, 4<y<10 atomic percent, z<4.5 atomic percent, and u<5 atomic percent, and Composition 13: $Fe_b B_x M'_y T_z$ where M' is at least one element selected from a group consisting of Ti, V, Nb, Ta, Mo and W and combined with any of Ti, Nb and Ta, T is at least one element selected from a group consisting of Cu, Ag, Au, Pd, Pt and Bi, 75<b<93 atomic percent, 6.5<x<18 atomic percent, 4<y<10 atomic percent, and z<4.5 atomic percent. Composition 14: $Fe_b B_x M'_y T_z X_u$ where M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, X is at least one element selected from a group consisting of Cr, Ru, Rh and Ir, 75<b<93 atomic percent, 6.5<x<18 atomic percent, 4<y<10 atomic percent, z<4.5 atomic percent, and u<5 atomic percent. Composition 15: $(Fe_{1-a} Z_a)_b B_x M'_y T_z$ where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, a<0.1 atomic percent, 75<b<93 atomic percent, 6.5<x<18 atomic percent, 4<y<10 atomic percent, and z<4.5 atomic percent. Composition 16: $(Fe_{1-a} Z_a)_b B_x M'_y T_z X_u$ where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, X is at least one element selected from a group consisting of Cr, Ru, Rh and Ir, a<0.1 atomic percent, 75<b<93 atomic percent, 6.5<x<18 atomic percent, 4<y<10 atomic percent, z<4.5 atomic percent, and u<5 atomic percent.

In each of the above compositions preferably 0.2<z<4.5 atomic percent.

BRIEF DESCRIPTION OF THE DRAWINGS

FIG. 1 (*b*) is a section taken along the line b—b of FIG. 1 (*a*);

FIG. 1 (*c*) is a perspective view of a magnetic core of the noise filter of FIG. 1 (*a*);

FIG. 3 (*b*) is a graphic representation showing the relationship between the effective permeability and the annealing temperature of an alloy according to the present invention;

FIG. 28 (*b*) is a graphic representation showing the relationship between the effective permeability and the annealing temperature in an alloy according to the present invention;

FIG. 34 (*b*) is a graphic representation showing the relationship between the proportion of Co and the magnetostriction in an alloy according to the present invention;

FIG. 34 (*c*) is a graphic representation showing the relationship between the proportion of Co and the permeability in an alloy according to the present invention;

DETAILED DESCRIPTION OF THE INVENTION

Figure 1A:
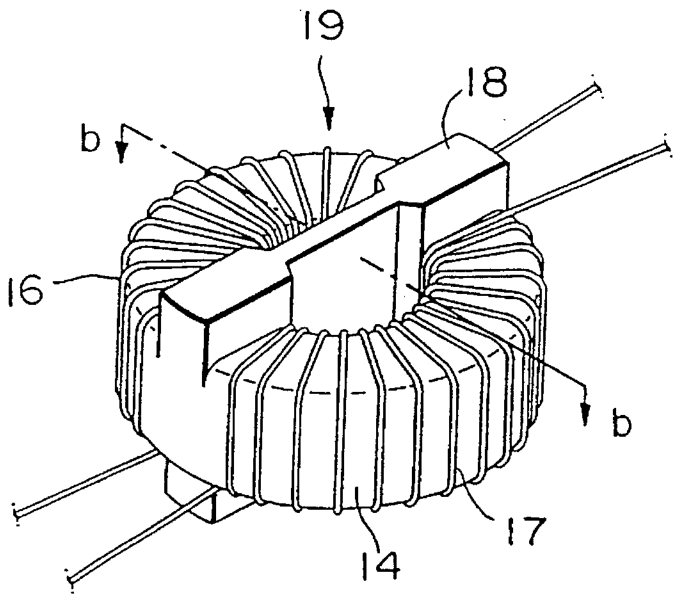
FIG. 1 (*a*) is a perspective view of a core element of a noise filter according to the present invention.

The present invention will be described below in more detail.

Since the noise filter according to the present invention employs, as a magnetic core, a special soft magnetic alloy exhibiting high saturation magnetization and high permeability, it exhibits excellent attenuation characteristics and can thus cope with high frequencies.

A manufacturing method of the soft magnetic alloy used in the noise filter according to the present invention can be obtained by a process in which an amorphous alloy having the foregoing composition or a crystalline alloy including an amorphous phase is rapidly cooled (quenched) from a melted state. The manufacturing process includes performing a vapor quenching method such as sputtering or deposition on the quenched alloy, and heat treating the alloy subjected to quenching and vapor quenching processes to precipitate fine grains.

It is possible according to the above-described quenching method to readily manufacture a ribbon-shaped magnetic substance. The annular magnetic core of the noise filter can be formed by coiling the ribbon in a toroidal fashion.

The soft magnetic alloy constituting the magnetic core of the noise filter according to the present invention contains boron (B). B enhances the amorphous phase forming ability of a soft magnetic alloy, improves thermal stability of Fe-base microcrystalline (fine crystalline) structure consisting of Fe and M (=Zr, Hf, Nb and so on) serves as a barrier for the grain growth, and leaves thermally stable amorphous phase in the grain boundary.

Consequently, in the heat treatment conducted at a wide temperature range of 400° to 750° C., it is possible to obtain a structure mainly composed of body-centered cubic phase (bcc phase) fine grains which have a grain size of 30 nm or below and which do not adversely affect the magnetic characteristics.

Like B, Al, Si, C and P are also elements normally used as amorphous phase forming elements. The soft magnetic alloy according to the present invention may contain these elements.

In order to readily obtain an amorphous phase in the soft magnetic alloy having any of composition Nos. 1 through 4 and 9 through 12, either Zr or Hf, exhibiting excellent amorphous phase forming ability, is added.

Part of the Zr or Hf can be replaced by Ti, V, Nb, Ta, Mo or W from the 4A through 6A group elements of the periodic table. In that case, sufficient amorphous phase forming ability can be obtained by making the proportion of B between 0.5 and 10 atomic percentage. In a case where T (Cu, Ag, Au, Pd, Pt or Bi) is added, the proportion of B is made 0.5 to 18 atomic percent. Further, the addition of Zr or Hf in a solid solution, which does not form a solid solution with Fe, reduces magnetostriction. That is, the amount of Zr or Hf added in a solid solution can be adjusted by changing the heat treatment conditions, whereby magnetostriction can be adjusted to a small value.

Thus, the requirements for low magnetostriction are that fine grains can be obtained under wide heat treatment conditions. Because the addition of B enables fine grains to be manufactured under wide heat treatment conditions, it assures an alloy having low magnetostriction and small crystal magnetic anisotropy and hence excellent magnetic characteristics.

Furthermore, the addition of Cr, Ru, Rh, Ir or V (element X) to the above-described composition improves corrosion resistance. The proportion of any of these elements must be 5 atomic percent or below in order to maintain saturation magnetization to 10 kG or above.

That fine grains can be obtained by partially crystallizing Fe—M (M=Zr, Hf) type amorphous alloy by a special method has been described from page 217 to page 221 in "CONFERENCE ON METALLIC SCIENCE AND TECHNOLOGY BUDAPEST". The present inventors discovered through researches that the same effect can be obtained with the above-described compositions. This invention is based on that knowledge.

The present inventors consider that the reason why fine grains can be obtained is that the constitutional fluctuation which has already occurred in quenching, which is the amorphous phase forming stage in the manufacture of the alloy, becomes the sites for non-uniform nucleation, thus generating uniform and fine nuclei.

In the soft magnetic alloy employed in the magnetic core of the noise filter according to the present invention, the proportion (b) of Fe or Fe, Co and Ni is 93 atomic percent or below, because the presence of more than 93 atomic percent makes it impossible to obtain a high permeability. The addition of 75 atomic percent or above is more preferable in terms of the saturation magnetization of 10 kG or above.

In the soft magnetic alloy having any of composition Nos. 9 through 16, the inclusion of 4.5 atomic percentage or below of at least one element (element T) selected from a group consisting of Cu, Ag, Au, Pd, Pt and Bi is preferable. Although the presence of 0.2 atomic percents or below of any of these elements makes it difficult to obtain excellent soft magnetic characteristics by the heat treatment process, since permeability is improved and saturation magnetization is slightly improved by increasing the heating rate, the proportion of any of these elements can be 4.5 atomic percent or below, as shown in composition example Nos. 9 through 16. However, when the proportion of any of these elements is between 0.2 and 4.5 atomic percent, excellent soft magnetic characteristics can be obtained without greatly increasing the heating rate. Thus, the more preferred proportion is between 0.2 and 4.5 atomic percent.

Among the above-mentioned elements, the addition of Cu is particularly effective. Although the mechanism in which the addition of Cu, Pd or the like greatly improves soft magnetic characteristics is not known, the present inventors measured the crystallization temperature by the differential thermal analysis, and found that the crystallization temperature of the alloy to which Cu, Pd or the like is added is slightly lower than that of the alloy to which no such an element is added. The present inventors consider that this occurred because the addition of the element accelerated the constitutional fluctuation in the amorphous phase, reducing the stability of the amorphous phase and making crystal phase readily precipitated.

Further, when the non-uniform amorphous phase is crystallized, it is partially crystallized and thus non-uniformly nucleated. Accordingly, fine grains ensuring excellent magnetic characteristics can be obtained.

Further, grain refinement is accelerated by increasing the heating rate. Thus, when the heating rate is great, the proportion of Cu, Pd or the like can be made less than 0.2 atomic percent.

Cu, which does not readily form a solid solution with Fe, has a tendency for phase separation. Accordingly, microstructure fluctuation occurs by heating, and non-uniform amorphous phase, contributing to grain refinement, is readily generated.

Therefore, any element of the same group as Cu, Pd and Pt can be used as long as it lowers the crystallization temperature. Also, other elements, such as Bi, whose solution in Fe is limited, can have the same effect as the above-described one.

In the soft magnetic alloy shown by composition Nos. 5 through 8 and 13 through 17, the addition of Nb and B having amorphous phase forming ability is mandatory in order to facilitate formation of amorphous phase.

Ti, V, Ta, Mo and W which have the same effect as that of Nb, Nb, V and Mo relatively restrict generation of oxide, and thus improve manufacturing yield. Therefore, the addition of these elements eases the manufacturing conditions and ensures inexpensive manufacture, which in turn ensures a reduction in the cost. In a practical operation, an alloy can be manufactured in air or an atmosphere having a gas pressure while an inert gas is partially supplied to a distal end portion of a nozzle.

However, any of these elements is inferior to Zr or Hf in terms of the amorphous phase forming ability. Therefore, the proportion of B is increased in the soft magnetic alloy having any of composition example Nos. 5 through 8 and 13 through 16, and the lower limit of B is set to 6.5 atomic percent.

Where T is added, as in the cases of composition Nos. 13 through 16, the upper limit of B is increased to 18 atomic percent. However, where no T is added, as in the cases of composition Nos. 5 through 8, since the addition of 10 atomic percentage or above of B deteriorates the magnetic characteristics, the upper limit thereof is set to 10 atomic percent.

The reasons for limiting the component elements contained in the soft magnetic alloy employed in the present invention have been described. In addition to the above-mentioned elements, Cr, platinum group elements, such as Ru, Rh or Ir, may also be added in order to improve corrosion resistance. Further, magnetostriction can be adjusted, when necessary, by adding any of elements including Y, rare earth elements, Zn, Cd, Ga, In, Ge, Sn, Pb, As, Sb, Se, Te, Li, Be, Mg, Ca, Sr and Ba.

The composition of the soft magnetic alloy employed in the noise filter according to the present invention remains the same if unavoidable impurities such as H, N, O or S are present in the alloy in an amount which does not deteriorate desired characteristics thereof.

To manufacture the soft magnetic alloy employed in the present invention, it is desirable to perform a heat treatment in which the ribbon obtained by quenching is heated at a predetermined temperature increasing rate, is maintained in a predetermined temperature range and then cooled. A desirable heat treatment temperature is between 400° and 750° C. A desirable heating rate in the heat treatment is 1.0° C./min or above.

The present inventors found that the heating rate during heat treatment affects the permeability of the soft magnetic alloy subjected to the heat treatment. When the heating rate is 1.0° C./min or above, it is possible to manufacture a soft magnetic alloy exhibiting high permeability.

The heating rate is a value obtained by differentiating the temperature of an alloy in a heating furnace with respect to the time.

Examples of the present invention will now be described.

Figure 1B:
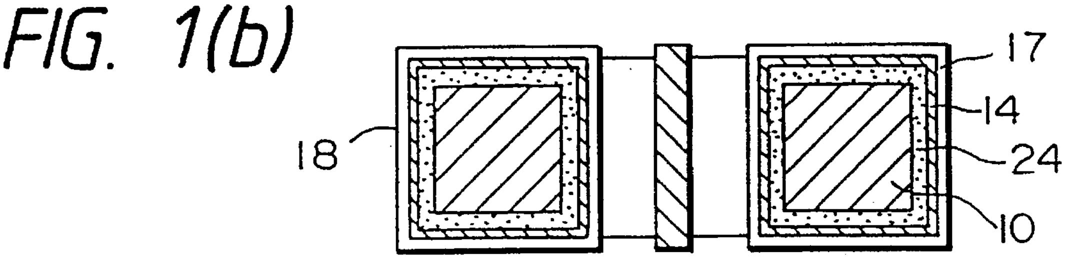
Figure 1C:
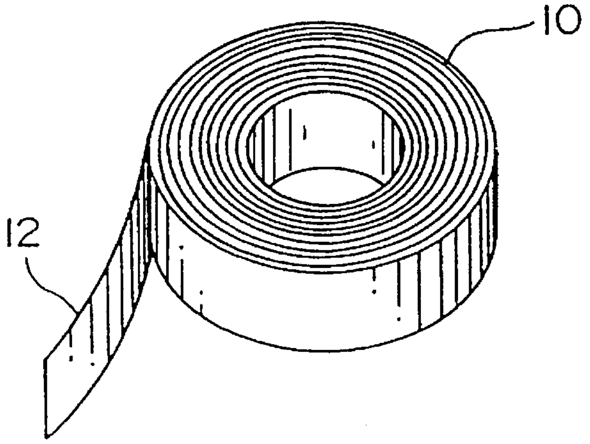

In the following examples, a magnetic core 10 of a noise filter has an annular shape formed by winding an alloy ribbon 12 in a toroidal fashion, as shown in FIG. 1 (*c*). The magnetic core 10 is accommodated in a casing 14 made of an insulating material, as shown in FIG. 1 (*b*). Coils 16 and 17 are wound around the casing 14 in the manner shown in FIG. 1 (*a*) in a state wherein they are separated from each other by an insulating plate 18, whereby a core element 19 is formed.

A resin such as a silicon type adhesive fills a space 24 in the casing 14 to fix the magnetic core 10.

Any insulating material, such as a polyester resin with a filler filled therein, is used to form the casing 14. The provision of the casing 14 may not be necessary in terms of the formation of the core element 19. However, when the magnetic core 10 is accommodated in the rigid casing 14, it is possible to prevent application of a stress caused by the coil 16 to the magnetic core 10 and a resultant damage thereto.

Figure 47:
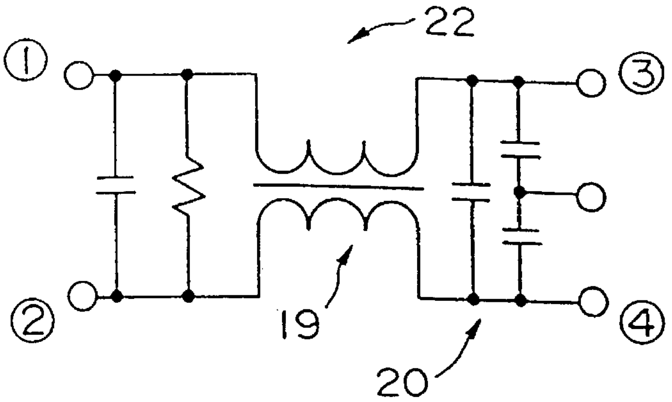
FIG. 47 is a circuit diagram of a noise filter.

The core element 19 is disposed in an electrical circuit 20 such as that shown in FIG. 47 to constitute a noise filter 22.

According to the present invention, the magnetic material is the alloy ribbon constituting the magnetic core.

The alloy ribbon is manufactured by the single roller melt spinning method. That is, the ribbon is manufactured by ejecting molten metal from a nozzle placed above a single rotating steel roller onto the roller under the pressure of an argon gas, for quenching.

Several types of soft magnetic alloys that can be employed in the noise filter and the characteristics thereof will be described below. Each of the alloy ribbons manufactured in the above method has a width of about 15 mm and a thickness of 15 to 40 μm. However, the width of the ribbon can be changed between 4.5 and 30 mm, while the thickness can be altered between several μm and 50 μm.

Permeability was measured in Examples 1 through 6 by the inductance method on a coiled ribbon ring having an outer diameter of 10 mm and an inner diameter of 6 mm. In Examples 7 through 17, a ribbon formed into a ring-like shape having an outer diameter of 10 mm and an inner diameter of 5 mm was used for measuring permeability.

EXAMPLE 1

Figure 2:
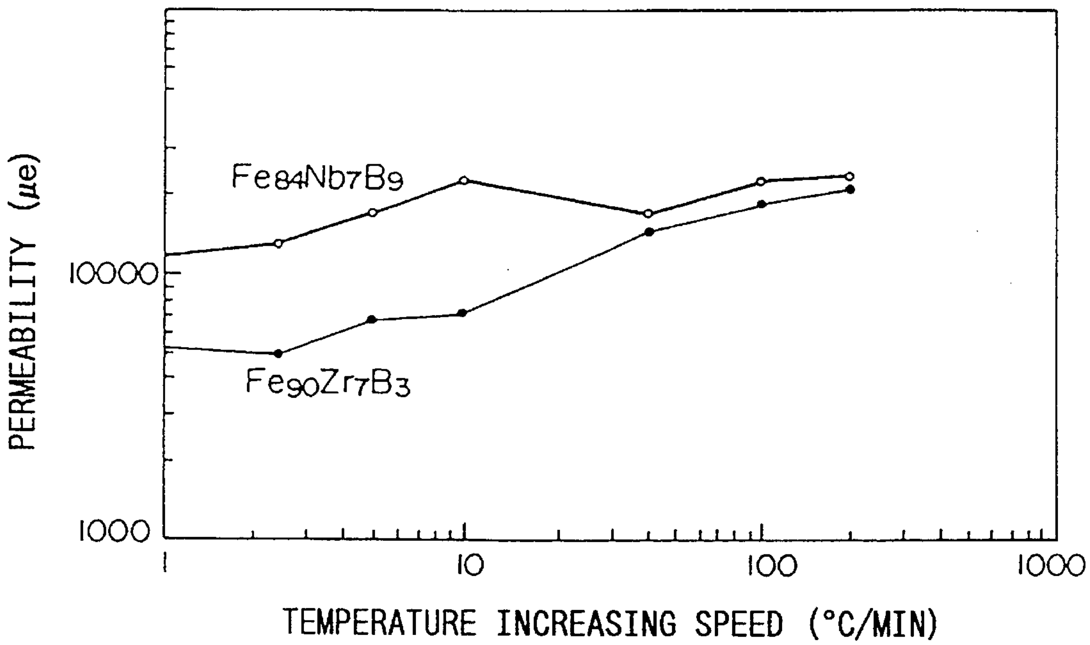
FIG. 2 is a graphic representation showing the relationship between the heating rate and the permeability of alloys according to the present invention.

We examined the relationship between the heating rate in the heat treatment and the permeability of the soft magnetic alloy subjected to that heat treatment. In this test, heat treatment was conducted on the alloys respectively having the compositions shown in Table 1 at different heating rates (°C./min) and the permeability (μ) of the heat treated alloys was measured. Heat treatment was performed using an infrared image furnace which held the alloy in a vacuum at 650° C. The cooling rate after the heat treatment was fixed to 10° C./min. Permeability was measured under the conditions of 1 kHz and 0.4 A/m (5 mOe) using an impedance analyzer. The results of the measurements are shown in Table 1 and FIG. 2.

In order to further examine the relationship between various heating rates and the permeabilities of the samples obtained at various rates, permeability measurements were performed using the samples respectively having the compositions shown in Tables 2 through 5. Table 2 shows the measurement results of the sample permeability when the heating rate was 0.5° C./min. Table 3 shows the measurement results of the sample permeability when the heating rate was 5° C./min. Table 4 shows the measurement results of the sample permeability when the heating rate was 80° C./min. Table 5 shows the measurement results of the sample permeability when the heating rate was 160° C./min. The other measurement conditions were the same as those of the above-described measurements. In the Tables, Ta indicates the heat treating temperature.

TABLE 1

| Heating range (°C./m) | $Fe_{90}Zr_7B_3$ | $Fe_{89}Zr_7B_4$ | $Fe_{89}Zr_6B_5$ M (1 kHz) | $Fe_{89}Zr_7B_4$ | $Fe_{84}Zr_7B_9$ |
|---|---|---|---|---|---|
| 0.5 | 1800 | | | 4500 | 5500 |
| 1.5 | 5100 | | | 8800 | 12100 |
| 2.5 | 5000 | | | 11700 | 14300 |
| 5 | 6800 | 5600 | | 13600 | 17500 |
| 10 | 7400 | | 9200 | 13400 | 23000 |
| 40 | 15100 | 10900 | | 21500 | 17300 |
| 100 | 19000 | | | 20600 | 23500 |
| 200 | 22000 | 15000 | 18400 | 32000 | 24000 |

TABLE 2

| Sample No. | Alloy composition (at %) | Ta(°C.) | μ(1 kHz) |
|---|---|---|---|
| 1 | $Fe_{91}Zr_7B_2$ | 650 | 2100 |
| 2 | $Fe_{90}Zr_7B_2$ | 650 | 1800 |
| 3 | $(Fe_{99.5}Co_{0.5})_{90}Zr_7B_3$ | 650 | 1810 |
| 4 | $(Fe_{99}Co_1)_{90}Zr_7B_3$ | 650 | 2250 |
| 5 | $(Fe_{98.5}Co_{1.5})_{90}Zr_7B_3$ | 650 | 1840 |
| 6 | $(Fe_{98}Co_2)_{90}Zr_7B_3$ | 650 | 1780 |
| 7 | $(Fe_{95}Co_5)_{90}Zr_7B_3$ | 650 | 1690 |
| 8 | $(Fe_{99.5}Ni_{0.5})_{90}Zr_7B_3$ | 600 | 1450 |
| 9 | $(Fe_{95}Ni_5)_{90}Zr_7B_3$ | 600 | 1900 |
| 10 | $Fe_{89}Zr_7B_3Cu_1$ | 600 | 14500 |
| 11 | $Fe_{89}Zr_7B_3Ru_1$ | 600 | 1760 |
| 12 | $Fe_{89.5}Zr_7B_3Pd_{0.5}$ | 650 | 2400 |
| 13 | $Fe_{89}Zr_7B_3Pd_1$ | 650 | 5010 |
| 14 | $(Fe_{99}Co_1)_{84}Nb_7B_9$ | 650 | 5850 |
| 15 | $(Fe_{95}Co_5)_{84}Nb_7B_9$ | 650 | 4670 |
| 16 | $(Fe_{99}Ni_1)_{84}Nb_7B_9$ | 650 | 5160 |
| 17 | $Fe_{81}Ti_7B_{11}Cu_1$ | 600 | 7300 |
| 18 | $Fe_{81}Ta_7B_{11}Cu_1$ | 600 | 6620 |
| 19 | $Fe_{87}Ti_1Zr_2Hf_2V_1Nb_1B_6$ | 600 | 3720 |
| 20 | $Fe_{89}Zr_7B_3Bi_1$ | 600 | 1520 |
| 21 | $(Fe_{99}Ni_1)_{90}Zr_7B_3$ | 600 | 1590 |

Heating-rate: 0.5° C./m
Shape of sample: Ring (inner diameter 6 mm, outer diameter 10 mm)
Measured magnetic field: 5 mOe

TABLE 3

| Sample No. | Alloy composition (at %) | Ta(°C.) | μ(1 kHz) |
|---|---|---|---|
| 22 | $Fe_{91}Zr_7B_2$ | 650 | 4700 |
| 23 | $Fe_{90}Zr_7B_2$ | 650 | 6800 |
| 24 | $(Fe_{99.5}Co_{0.5})_{90}Zr_7B_3$ | 650 | 4000 |
| 25 | $(Fe_{99}Co_1)_{90}Zr_7B_3$ | 650 | 4100 |
| 26 | $(Fe_{98.5}Co_{1.5})_{90}Zr_7B_3$ | 650 | 4700 |
| 27 | $(Fe_{98}Co_2)_{90}Zr_7B_3$ | 650 | 5000 |
| 28 | $(Fe_{95}Co_5)_{90}Zr_7B_3$ | 650 | 4400 |
| 29 | $(Fe_{99.5}Ni_{0.5})_{90}Zr_7B_3$ | 600 | 6100 |
| 30 | $(Fe_{95}Ni_5)_{90}Zr_7B_3$ | 600 | 7900 |
| 31 | $Fe_{89}Zr_7B_3Cu_1$ | 600 | 20400 |
| 32 | $Fe_{89}Zr_7B_3Ru_1$ | 600 | 5600 |
| 33 | $Fe_{89.5}Zr_7B_3Pd_{0.5}$ | 650 | 7400 |
| 34 | $Fe_{89}Zr_7B_3Pd_1$ | 650 | 9300 |
| 35 | $(Fe_{99}Co_1)_{84}Nb_7B_9$ | 650 | 9100 |
| 36 | $(Fe_{95}Co_5)_{84}Nb_7B_9$ | 650 | 5010 |
| 37 | $(Fe_{99}Ni_1)_{84}Nb_7B_9$ | 650 | 7900 |
| 38 | $Fe_{81}Ti_7B_{11}Cu_1$ | 600 | 8100 |
| 39 | $Fe_{81}Ta_7B_{11}Cu_1$ | 600 | 8200 |
| 40 | $Fe_{87}Ti_1Zr_2Hf_2V_1Nb_1B_6$ | 600 | 5500 |
| 41 | $Fe_{89}Zr_7B_3Bi_1$ | 600 | 5600 |
| 42 | $(Fe_{99}Ni_1)_{90}Zr_7B_3$ | 600 | 6800 |

Heating-rate: 5° C./m
Shape of sample: Ring (inner diameter 6 mm, outer diameter 10 mm)
Measured magnetic field: 5 mOe

TABLE 4

| Sample No. | Alloy composition (at %) | Ta(°C.) | μ(1 kHz) |
|---|---|---|---|
| 43 | $Fe_{91}Zr_7B_2$ | 650 | 17900 |
| 44 | $Fe_{90}Zr_7B_2$ | 650 | 19200 |
| 45 | $(Fe_{99.5}Co_{0.5})_{90}Zr_7B_3$ | 650 | 24300 |
| 46 | $Fe_{99}Co_1)_{90}Zr_7B_3$ | 650 | 17300 |
| 47 | $(Fe_{98.5}Co_{1.5})_{90}Zr_7B_3$ | 650 | 18100 |
| 48 | $(Fe_{98}Co_2)_{90}Zr_7B_3$ | 650 | 18400 |
| 49 | $(Fe_{95}Co_5)_{90}Zr_7B_3$ | 650 | 8220 |
| 50 | $(Fe_{99.5}Ni_{0.5})_{90}Zr_7B_3$ | 600 | 28000 |
| 51 | $(Fe_{95}Ni_5)_{90}Zr_7B_3$ | 600 | 9040 |
| 52 | $Fe_{89}Zr_7B_3Cu_1$ | 600 | 45200 |
| 53 | $Fe_{89}Zr_7B_3Ru_1$ | 600 | 16200 |
| 54 | $Fe_{89.5}Zr_7B_3Pd_{0.5}$ | 650 | 17700 |
| 55 | $Fe_{89}Zr_7B_3Pd_1$ | 650 | 20800 |
| 56 | $(Fe_{99}Co_1)_{84}Nb_7B_9$ | 650 | 14700 |
| 57 | $(Fe_{95}Co_5)_{84}Nb_7B_9$ | 650 | 8520 |
| 58 | $(Fe_{99}Ni_1)_{84}Nb_7B_9$ | 650 | 14800 |

TABLE 4-continued

| Sample No. | Alloy composition (at %) | Ta(°C.) | μ(1 kHz) |
|---|---|---|---|
| 59 | $Fe_{81}Ti_7B_{11}Cu_1$ | 600 | 16500 |
| 60 | $Fe_{81}Ta_7B_{11}Cu_1$ | 600 | 14500 |
| 61 | $Fe_{87}Ti_1Zr_2Hf_2V_1Nb_1B_6$ | 600 | 9130 |
| 62 | $Fe_{89}Zr_7B_3Bi_1$ | 600 | 16500 |
| 63 | $(Fe_{99}Ni_1)_{90}Zr_7B_3$ | 600 | 23400 |

Heating-rate: 80° C./m
Shape of sample: Ring (inner diameter 6 mm, outer diameter 10 mm)
Measured magnetic field: 5 mOe

TABLE 5

| Sample No. | Alloy composition (at %) | Ta(°C.) | μ(1 kHz) |
|---|---|---|---|
| 64 | $Fe_{91}Zr_7B_2$ | 650 | 18700 |
| 65 | $Fe_{90}Zr_7B_2$ | 650 | 24100 |
| 66 | $(Fe_{99.5}Co_{0.5})_{90}Zr_7B_3$ | 650 | 27000 |
| 67 | $Fe_{99}Co_1)_{90}Zr_7B_3$ | 650 | 22100 |
| 68 | $(Fe_{98.5}Co_{1.5})_{90}Zr_7B_3$ | 650 | 23300 |
| 69 | $(Fe_{98}Co_2)_{90}Zr_7B_3$ | 650 | 19600 |
| 70 | $(Fe_{95}Co_5)_{90}Zr_7B_3$ | 650 | 10300 |
| 71 | $(Fe_{99.5}Ni_{0.5})_{90}Zr_7B_3$ | 600 | 17300 |
| 72 | $(Fe_{95}Ni_5)_{90}Zr_7B_3$ | 600 | 18700 |
| 73 | $Fe_{89}Zr_7B_3Cu_1$ | 600 | 44200 |
| 74 | $Fe_{89}Zr_7B_3Ru_1$ | 600 | 19800 |
| 75 | $Fe_{89.5}Zr_7B_3Pd_{0.5}$ | 650 | 22000 |
| 76 | $Fe_{89}Zr_7B_3Pd_1$ | 650 | 22400 |
| 77 | $(Fe_{99}Co_1)_{84}Nb_7B_9$ | 650 | 18300 |
| 78 | $(Fe_{95}Co_5)_{84}Nb_7B_9$ | 650 | 9750 |
| 79 | $(Fe_{99}Ni_1)_{84}Nb_7B_9$ | 650 | 16100 |
| 80 | $Fe_{81}Ti_7B_{11}Cu_1$ | 600 | 16800 |
| 81 | $Fe_{81}Ta_7B_{11}Cu_1$ | 600 | 16500 |
| 82 | $Fe_{87}Ti_1Zr_2Hf_2V_1Nb_1B_6$ | 600 | 10800 |
| 83 | $Fe_{89}Zr_7B_3Bi_1$ | 600 | 18900 |
| 84 | $(Fe_{99}Ni_1)_{90}Zr_7B_3$ | 600 | 19200 |

Heating-rate: 160° C./m
Shape of sample: Ring (inner diameter 6 mm, outer diameter 10 mm)
Measured magnetic field: 5 mOe It is clear from the measurement results shown in Tables 1 through 5 and FIG. 2 that the permeability of the soft magnetic alloy samples greatly depends on the heating rate in the heat treatment, and that as the greater the heating rate, the higher the permeability. Thus, we came to the conclusion from the measurement results shown in Tables 1 through 5 and FIG. 2 that the heating rate must be 1.0° C./min or above in order to maintain permeability to 5000 or above.

In the subsequent examples, we measured the effective permeability (μe) under conditions of 10 mOe and 1 kHz. measured the coercive force (Hc) with a d.c. B-H loop tracer. We calculated the saturation magnetization (Bs) from the magnetization measured under the conditions of 10 kOe by VSM.

In Examples 2 through 6, the magnetic characteristics shown are those of the alloys which have been subjected to water quenching after heating at a temperature of 600° C. or 650° C. for an hour. The magnetic characteristics shown in Examples 7 through 17 are those of the alloys which have been subjected to heating at a temperature ranging from 500° to 700° C. for an hour. The heating rate was between 80° and 100° C./min.

EXAMPLE 2

Regarding the effect of the heat treatment on the magnetic characteristics and structure of the alloy described in the above-described composition 1, those of the $Fe_{90}Zr_7B_3$ alloy, one of the basic compositions, will be described below.

The crystallization initiation temperature of the $Fe_{90}Zr_7B_3$ alloy, obtained by the differential thermal analysis at a heating rate of 10° C./min, was 480° C.

Figure 3:
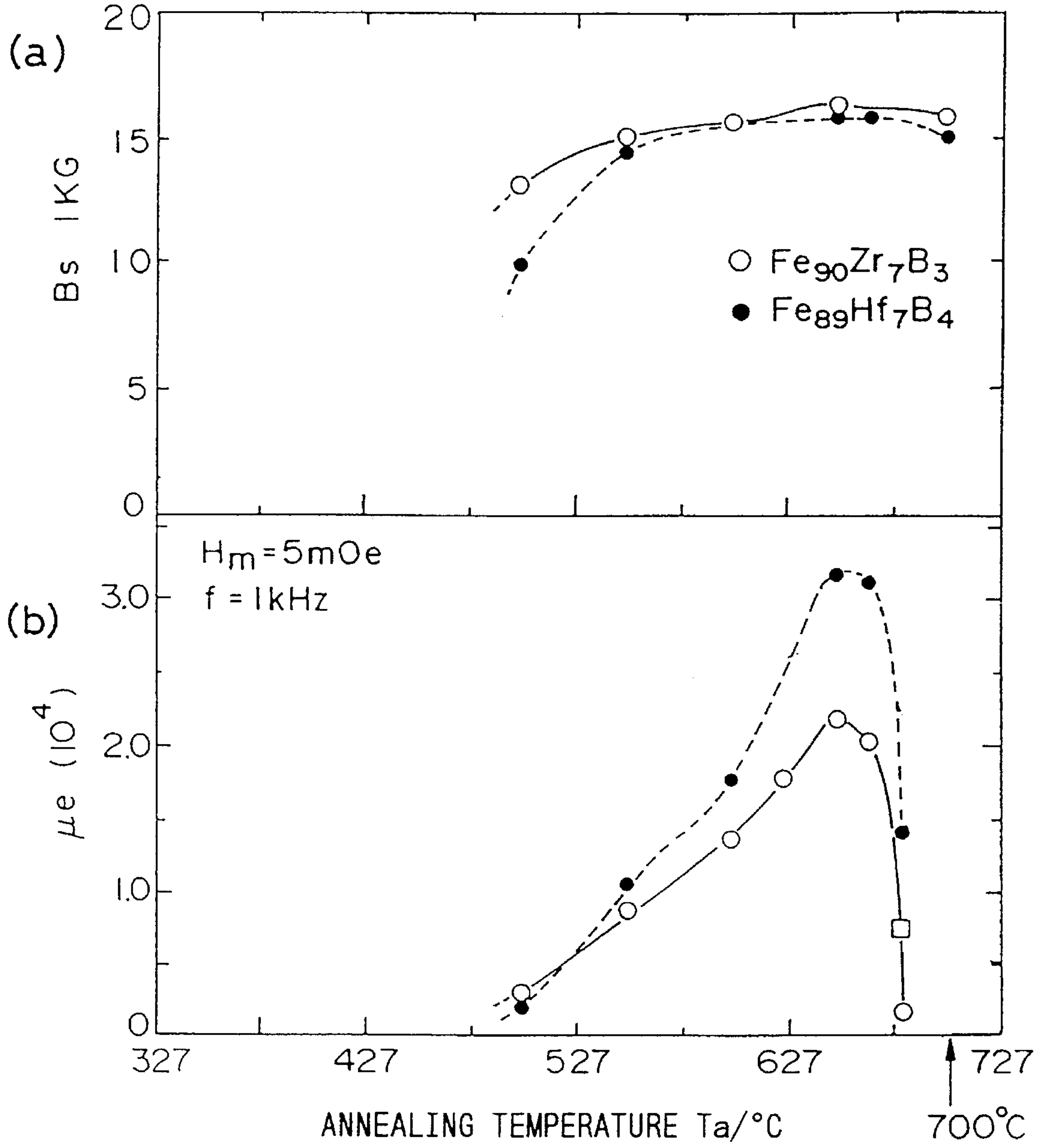
FIG. 3 (*a*) is a graphic representation showing the relationship between the saturation magnetization and the annealing temperature of an alloy according to the present invention.

FIG. 3 is a graphic illustration showing the effect of annealing (retained for an hour at each temperature) on the effective permeability of the $Fe_{90}Zr_7B_3$ alloy. It is clear from FIG. 3 that the effective permeability of the alloy according to the present invention, which decreases as the annealing temperature decreases, increases rapidly due to the annealing at a temperature of 500° to 650° C.

We investigated frequency dependency of the permeability of a 20 μm-thick sample which was subjected to the heat treatment at 650° C., and found the sample exhibited excellent soft magnetic characteristics at high frequencies, like 26500 at 1 kHz, 19800 at 10 kHz and 7800 at 100 kHz.

We investigated changes in the structure of the $Fe_{90}Zr_7B_3$ alloy, caused by the heat treatment, by the X-ray diffraction method. Also, we observed the structure of the heat treated alloy using a transmission type electronic microscope. The results are shown in FIGS. 4 and 5, respectively.

Figure 4:
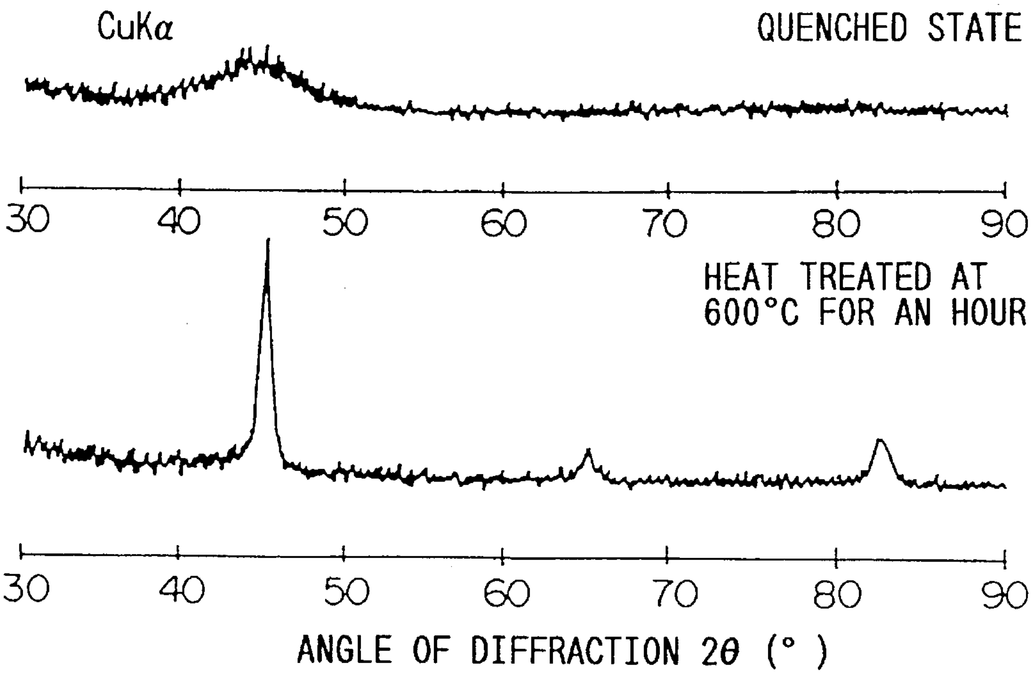
FIG. 4 is an X-ray diffraction pattern showing changes in the structure of an alloy according to the present invention caused by the heat treatment.

As shown in FIG. 4, the haloed diffraction pattern characteristic to the amorphous phase is observed in a quenched state, while the diffraction pattern inherent in the body-centered cubic structure is observed after heat treatment. It is thus clear that the structure of the alloy according to the present invention changed from the amorphous phase to the body-centered cubic structure as a consequence of the heat treatment.

Figure 5:
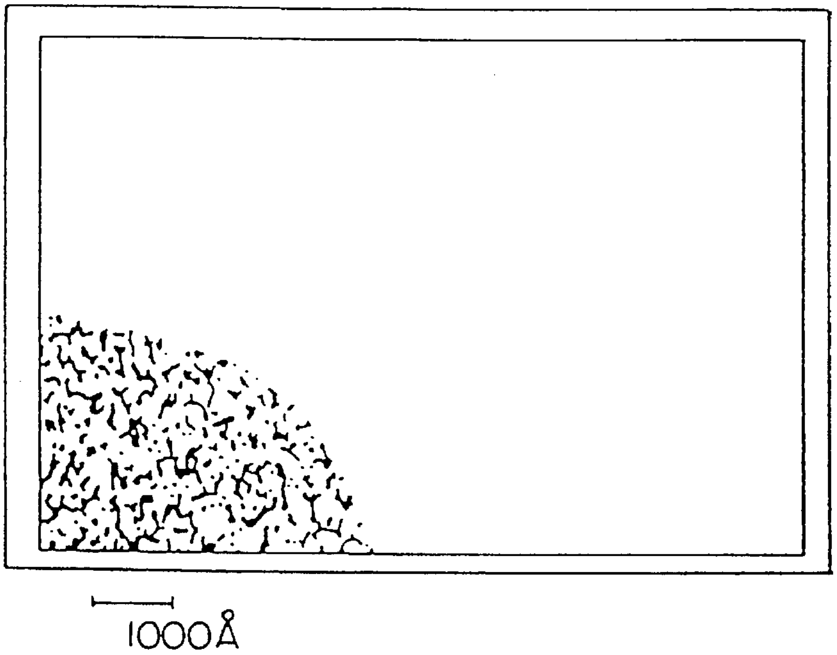
FIG. 5 is a schematic view of a microscopic photograph showing the structure of a heat treated alloy according to the present invention.
Figure 6:
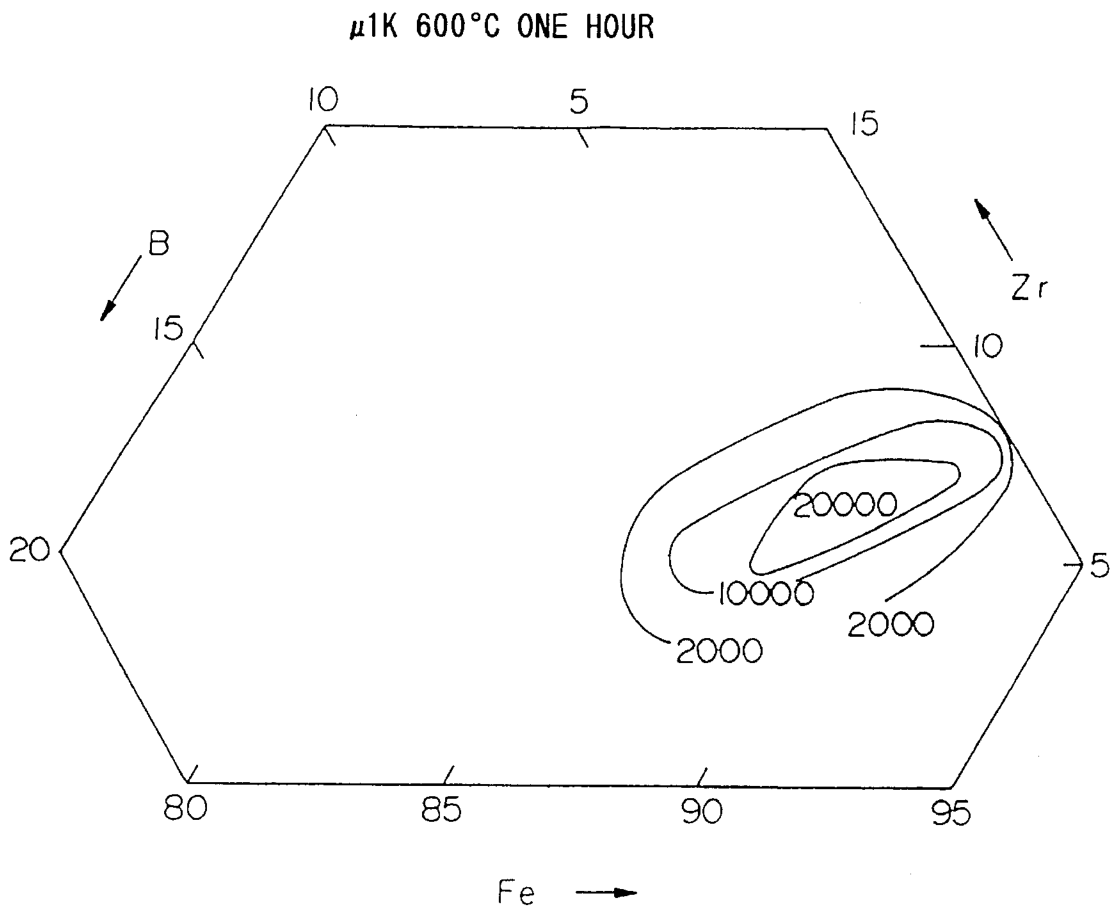
FIG. 6 shows permeability when the proportion of Zr, that of B and that of Fe in an alloy heat treated at 600° C. according to the present invention are changed.
Figure 7:
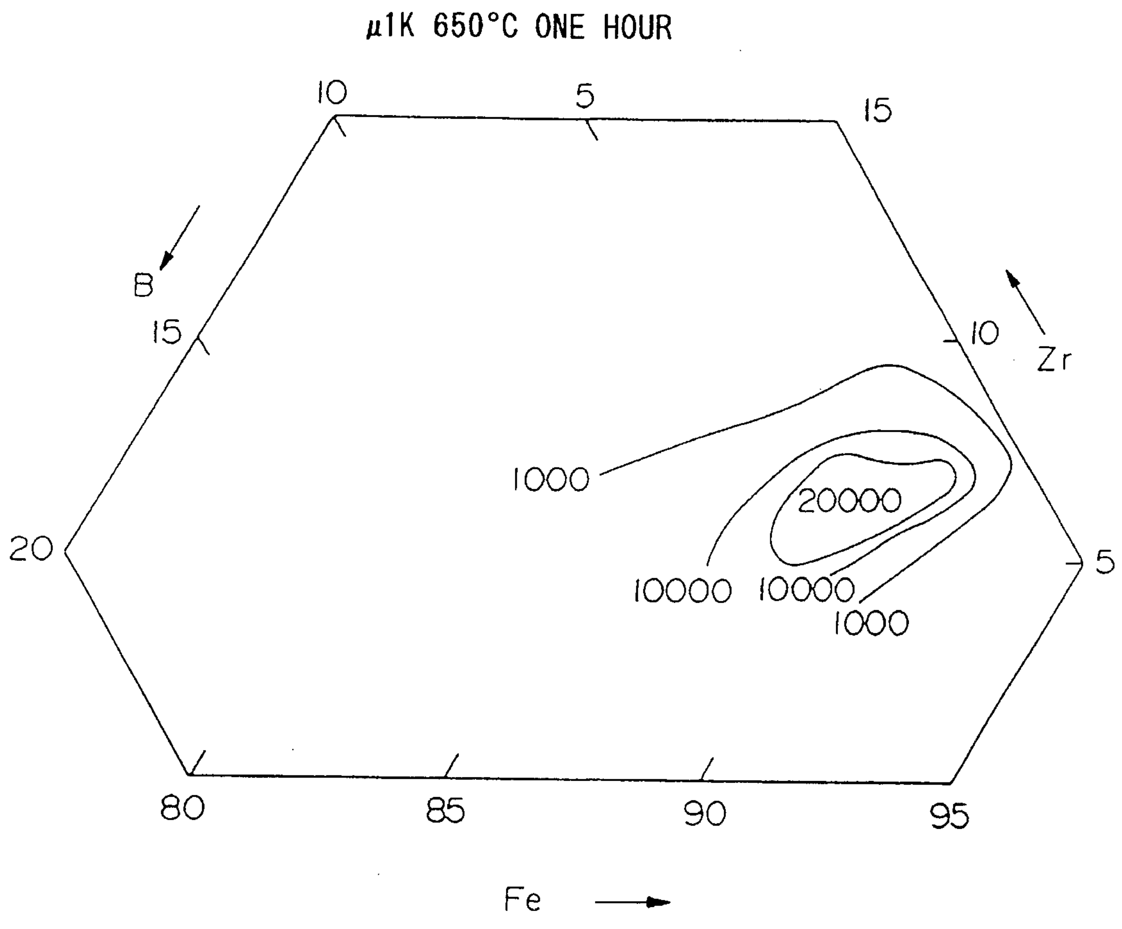
FIG. 7 shows permeability when the proportion of Zr, that of B and that of Fe in an alloy heat treated at 650° C. according to the present invention are changed.
Figure 8:
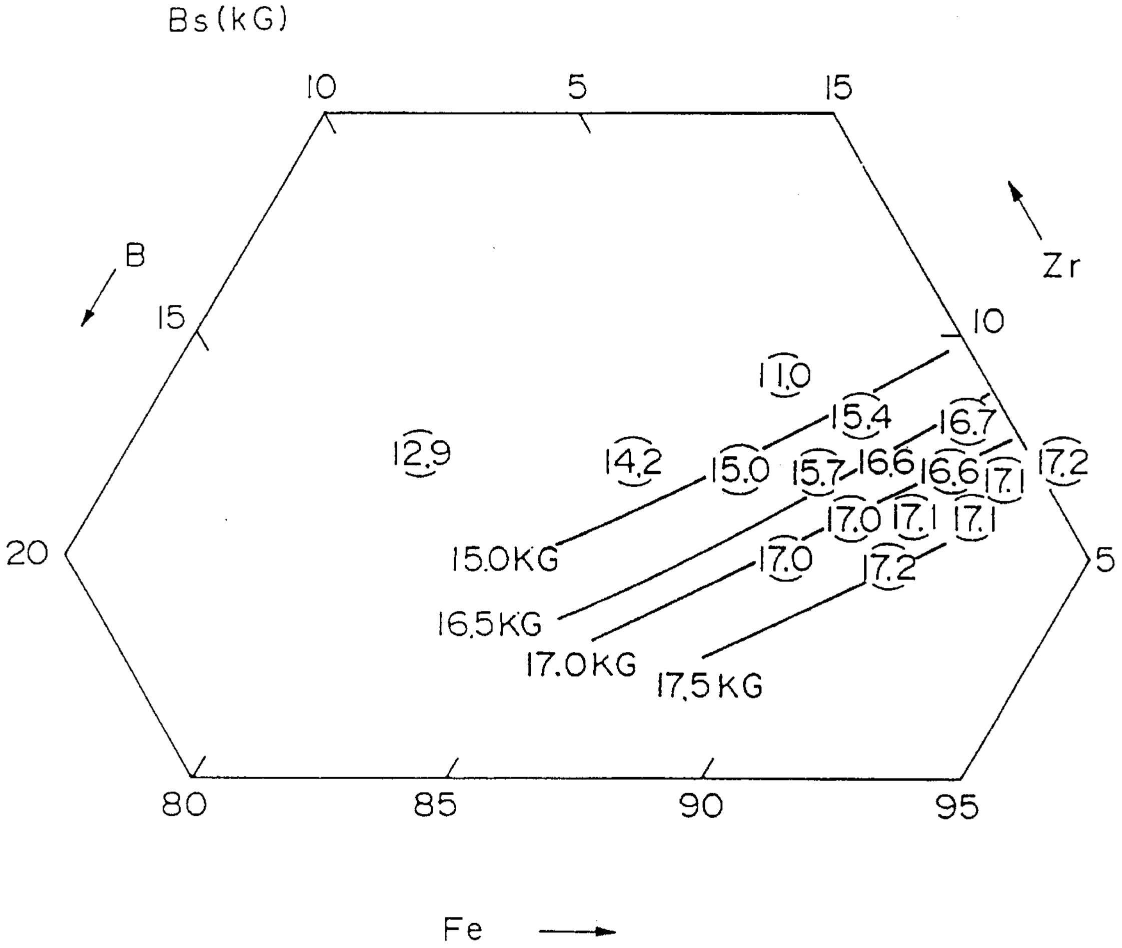
FIG. 8 shows saturation magnetization when the proportion of Zr, that of B and that of Fe in an alloy according to the present invention are changed.
Figure 9:
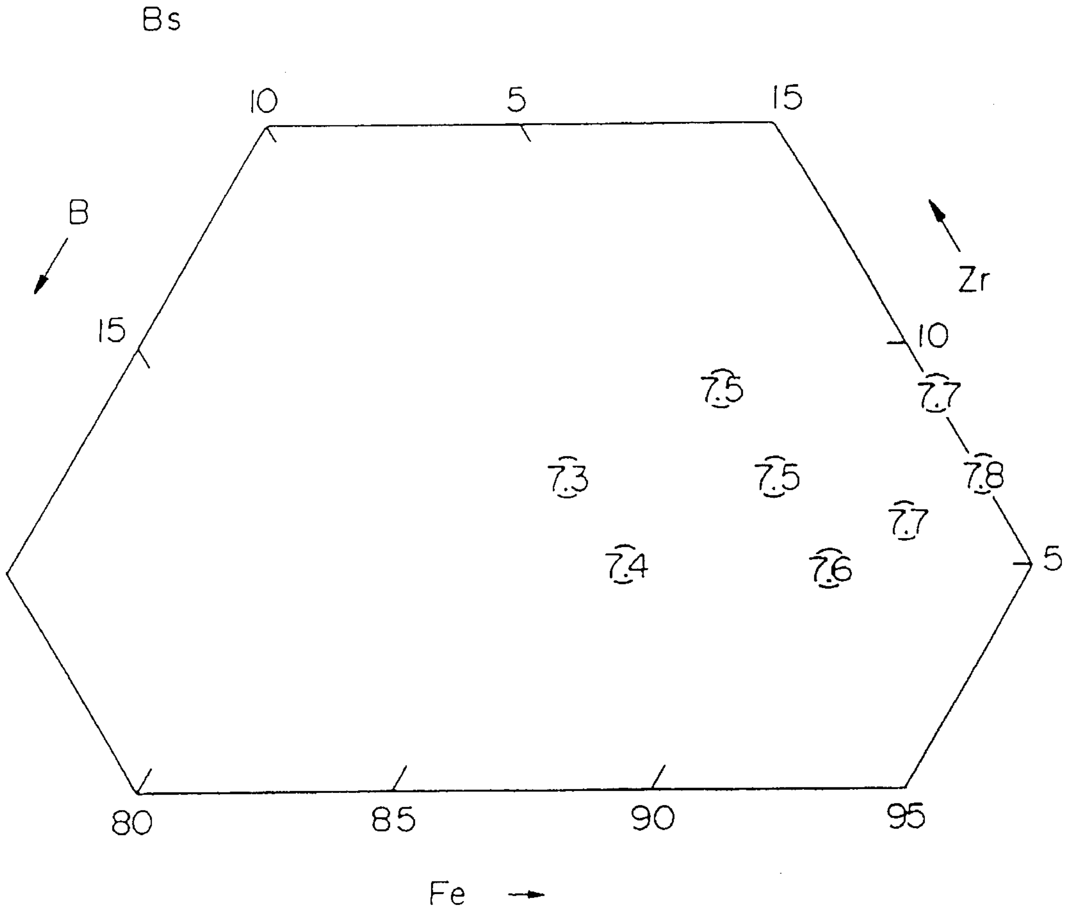
FIG. 9 shows saturation magnetization when the proportion of Zr, that of B and that of Fe in an alloy according to the present invention are changed.

It is also clear from the results of the structure observation shown in FIG. 5 that the heat treated structure was composed of fine grains having a grain size of about 100 to 200 Å (10 to 20 nm).

We examined changes in the hardness of the $Fe_{90}Zr_7B_3$ alloy, caused by the heat treatment, and found that the hardness increased from 750 DPN, Vickers hardness obtained in a quenched state, to a high value of 1400 DPN which cannot be conventionally obtained, after the heat treatment.

It is therefore clear that the structure mainly composed of super fine grains, obtained by heat treating and thereby crystallizing the amorphous alloy having the aforementioned composition, exhibits high saturation magnetization, excellent soft magnetic characteristics, a high hardness and high thermal stability.

Further, the present inventors examined how the magnetic characteristics of the alloy changed when the proportion of Zr and that of B in the alloy were varied. Table 6 and FIGS. 6 through 9 show the magnetic characteristics of the annealed alloy.

TABLE 6

| Sample No. | Alloy composition (at %) | Heat treatment °Clh | Permeability μ(1 KHz) | Saturation magnetization Bs(G) | |
|---|---|---|---|---|---|
| 85 | $Fe_{91}Zr_8B_1$ | 600 | 12384 | 16700 | |
| 86 | $Fe_{91}Zr_9$ | 600 | 1056 | 16500 | (Comparative example) |
| 87 | $Fe_{89}Zr_5B_6$ | 600 | 24384 | 17000 | |
| 88 | $Fe_{87}Zr_5B_8$ | 600 | 10829 | 16000 | |
| 89 | $Fe_{87}Zr_3B_{10}$ | 600 | 296 | 17200 | |
| 90 | $Fe_{87}B_{13}$ | 600 | 192 | 18000 | (Comparative example) |
| 91 | $Fe_{81}Zr_7B_{12}$ | 600 | 230 | 12900 | (Comparative example) |
| 92 | $Fe_{85}Zr_{11}B_4$ | 600 | 2 | 9000 | (Comparative example) |
| 93 | $Fe_{91}Zr_7B_2$ | 600 | 24384 | 16600 | |
| 94 | $Fe_{89}Zr_7B_4$ | 600 | 20554 | 16000 | |
| 95 | $Fe_{92}Zr_7B_1$ | 600 | 17184 | 17100 | |
| 96 | $Fe_{90}Zr_7B_3$ | 600 | 23808 | 16600 | |
| 97 | $Fe_{88}Zr_7B_5$ | 600 | 8794 | 15500 | |
| 98 | $Fe_{91}Zr_6B_3$ | 600 | 19776 | 17100 | |
| 99 | $Fe_{90}Zr_6B_4$ | 600 | 22464 | 17000 | |
| 100 | $Fe_{90}Zr_8B_2$ | 600 | 10944 | 15900 | |
| 101 | $Fe_{89}Zr_8B_3$ | 600 | 8083 | 15400 | |

Heating-rate: 80° C./min to 100° C./min

It is clear from Table 6 and FIGS. 6 through 9 that high permeability and high saturation magnetization can be readily obtained when the proportion of Zr is between 4 and 9 atomic percent. It is also clear that effective permeability was not increased to 5000 or above, preferably, 10000 or above when the proportion of Zr is less than 4 atomic percent and that permeability rapidly decreases and saturation magnetization decreases when the proportion of Zr exceeds 9 atomic percent. Hence, the present inventors limited the proportion of Zr contained in the alloy having any of compositions 1 through 4 to between 4 and 9 atomic percent.

Similarly, when the proportion of B is between 0.5 and 10 atomic percent, effective permeability can be readily increased to 5000 or above, preferably, to 10000 or above. Consequently, the present inventors limited the proportion of B to between 0.5 and 10 atomic percent. Further, even when the proportion of Zr and that of B are within the above range, high permeability cannot be obtained if the proportion of Fe exceeds 93 atomic percent. Thus, the present inventors limited the proportion of Fe to 93 atomic percent or below in the alloy used in the present invention.

EXAMPLE 3

A Fe—Hf—B alloy system, obtained by substituting Hf for Zr in the Fe—Zr—B alloy system shown in Example 2, will be described.

Table 7 shows the magnetic characteristics obtained when the proportion of Hf in the Fe—Hf—B alloy system is changed from 4 to 9 atomic percent.

TABLE 7

| Sample No. | Alloy composition (at %) | Permeability μ(1 KHz) | Saturation magnetization Bs(G) |
|---|---|---|---|
| 102 | $Fe_{88}Hf_4B_6$ | 8200 | 16200 |
| 103 | $Fe_{89}Hf_5B_6$ | 17200 | 16000 |
| 104 | $Fe_{90}Hf_6B_4$ | 24800 | 15500 |
| 105 | $Fe_{89}Hf_7B_4$ | 28000 | 15000 |
| 106 | $Fe_{88}Hf_8B_4$ | 25400 | 14500 |

TABLE 7-continued

| Sample No. | Alloy composition (at %) | Permeability μ(1 KHz) | Saturation magnetization Bs(G) |
|---|---|---|---|
| 107 | $Fe_{87}Hf_9B_4$ | 12100 | 14000 |
| 108 | $Fe_{91}Zr_4Hf_3B_2$ | 27800 | 16500 |

It is apparent from the characteristics shown in Table 7 that the effective permeability of the Fe—Hf—B alloy system is equivalent to that of the Fe—Zr—B alloy system when the proportion of Hf is between 4 and 9 atomic percent.

Further, the magnetic characteristics of the $Fe_{91}Zr_4Hf_3B_2$ alloy shown in Table 7 are the same as those of Fe—Zr—B alloy system of Example 2. Thus, it is clear that Zr in the Fe—Zr—B alloy system shown in Example 2 can be replaced by Hf partially or entirely in its limited composition range from 4 to 9 atomic percent.

EXAMPLE 4

An alloy in which part of Zr and/or Hf of Fe—(Zr, Hf)—B alloy system, shown in Examples 2 and 3, is replaced by Nb will now be described.

Table 8 shows the magnetic characteristics of the alloys in which part of Zr of the Fe—Zr—B alloy system has been replaced by 1 to 5 atomic percent of Nb.

TABLE 8

| Sample No. | Alloy composition (at %) | Permeability μ(1 KHz) | Saturation magnetization Bs(G) | |
|---|---|---|---|---|
| 109 | $Fe_{90}Zr_6Nb_1B_6$ | 21000 | 16600 | |
| 110 | $Fe_{89}Zr_5Nb_2B_4$ | 14000 | 16200 | |
| 111 | $Fe_{88}Zr_6Nb_2B_4$ | 12500 | 15400 | |
| 112 | $Fe_{87}Zr_7Nb_2B_4$ | 7600 | 14500 | |
| 113 | $Fe_{86}Zr_8Nb_2B_4$ | 2300 | 14000 | (Comparative example) |
| 114 | $Fe_{89}Zr_6Nb_3B_2$ | 8200 | 15900 | |
| 115 | $Fe_{88}Zr_6Nb_4B_2$ | 4100 | 14500 | (Comparative example) |
| 116 | $Fe_{87}Zr_6Nb_5B_2$ | 1800 | 14000 | (Comparative example) |
| 117 | $Fe_{86}Ni_1Zr_4Nb_3B_6$ | 17900 | 15400 | |

It is clear from Table 8 that the proportion of Zr+Nb assuring high permeability is between 4 and 9 atomic percent, as in the case of Zr in the Fe—Zr—B alloy system) and that the inclusion of Nb has the same effect as that of Zr.

Therefore, it is clear that part of Zr, Hf in the Fe—(Zr, Hf)—B alloy system can be replaced by Nb.

EXAMPLE 5

An alloy in which Nb in the Fe—(Zr, Hf)—Nb—B alloy system is replaced by Ti, V, Ta, Mo or W will be described.

Table 9 shows the magnetic characteristics of the Fe—Zr—M'—B (M' is either of Ti, V, Ta, Mo or W) alloy system.

TABLE 9

| Sample No. | Alloy composition (at %) | Permeability (1 KHz) | Saturation magnetization Bs(G) | |
|---|---|---|---|---|
| 118 | $Fe_{89}Zr_6Ti_2B_3$ | 12800 | 15800 | |
| 119 | $Fe_{89}Zr_6V_2B_3$ | 11100 | 15800 | |
| 120 | $Fe_{89}Zr_6Ta_2B_3$ | 15600 | 15200 | |
| 121 | $Fe_{89}Zr_6Mo_2B_3$ | 12800 | 15300 | |
| 122 | $Fe_{89}Zr_6W_2B_3$ | 13100 | 15100 | |
| 123 | Fe—Si—B Amorphous alloy | 5000 | 14100 | (Comparative example) |
| 124 | Silicon steel (Si 6.5 wt %) | 2400 | 18000 | (Comparative example) |
| 125 | Fe—Si—Al alloy | 20000 | 11000 | (Comparative example) |
| 126 | Fe—Ni alloy (Permalloy) | 15000 | 8000 | (Comparative example) |
| 127 | Co—Fe—Si—B Amorphous alloy | 65000 | 8000 | (Comparative example) |

In Table 9, the effective permeability of the alloys according to the present invention is higher than 5000, which is the effective permeability of a comparative example of a Fe-based amorphous alloy (sample No. 123) and that of a comparative example of a silicon steel (sample No. 124), while the saturation magnetization thereof is better than that of a Fe—Si—Al alloy (sample No. 125), that of a Fe—Ni alloy (sample No. 126) or that of a Co-based amorphous alloy (sample No. 127). It is thus clear from Table 9 that the alloys according to the present invention exhibit both excellent permeability and excellent saturation magnetization, and that Nb in the Fe—(Zr, Hf)Nb—B alloy system can be replaced by Ti, V, Ta, Mo or W.

EXAMPLE 6

The reasons for limiting the proportion of Co and that of Ni to those described in the above-described compositions will be described below.

Figure 10:
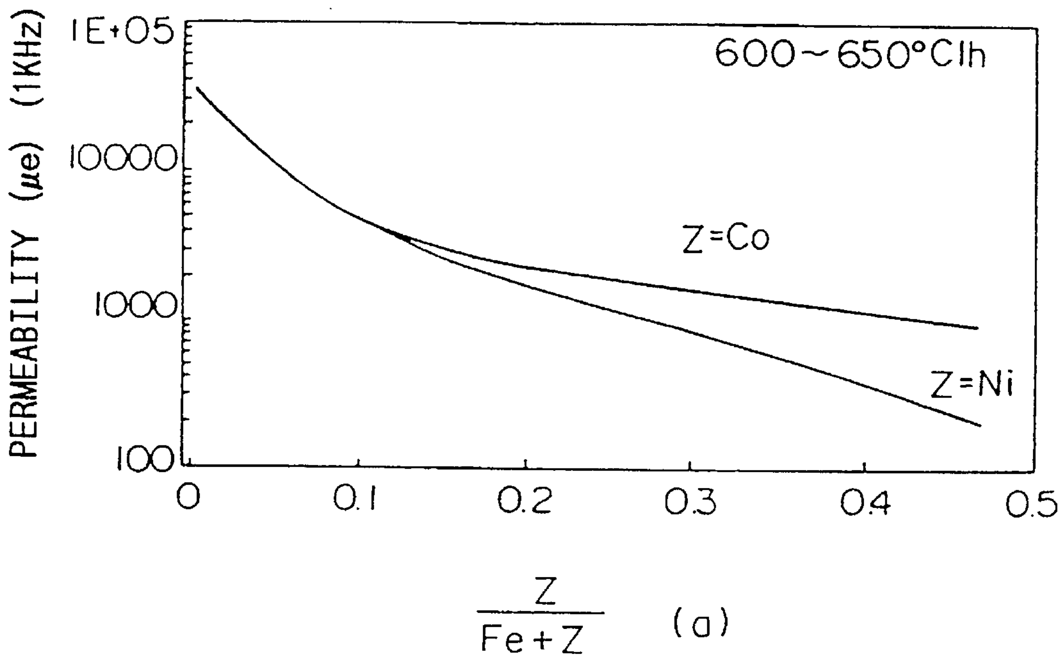
FIG. 10 is a graphic representation showing the relationship between the proportion of Co or Ni in an alloy according to the present invention and the permeability thereof.

FIG. 10 shows the relationship between the proportion of Co and that of Ni (a) in the alloy having a composition expressed by $(Fe_{1-a} Z_a)_{91} Zr_7 B_2$ (Z=Co, Ni) and permeability thereof.

It is apparent from the results shown in FIG. 10 that effective permeability is increased to 5000 or above, which is higher than that of the Fe-based amorphous alloy, when the proportion of Co or Ni (a) is 0.1 or below, while effective permeability rapidly decreases when the proportion of Co or Ni exceeds 0.1. Thus, the present inventors limited the proportion of Co and that of Ni (a) in the alloys described in the above composition to 0.1 or below. In order to obtain effective permeability of 10000 or above, a more preferable a is 0.05 or below.

EXAMPLE 7

Regarding the effect of the heat treatment on the magnetic characteristics and structure of the alloys having composition examples 9 through 12, those of the $Fe_{86} Zr_7 B_6 Cu_1$ alloy, one of the basic compositions, will be described below.

The crystallization initiation temperature of the $Fe_{86} Zr_7 B_6 Cu_1$ alloy, obtained by the differential thermal analysis at a heating rate of 10° C./min, was 503° C.

Figure 11:
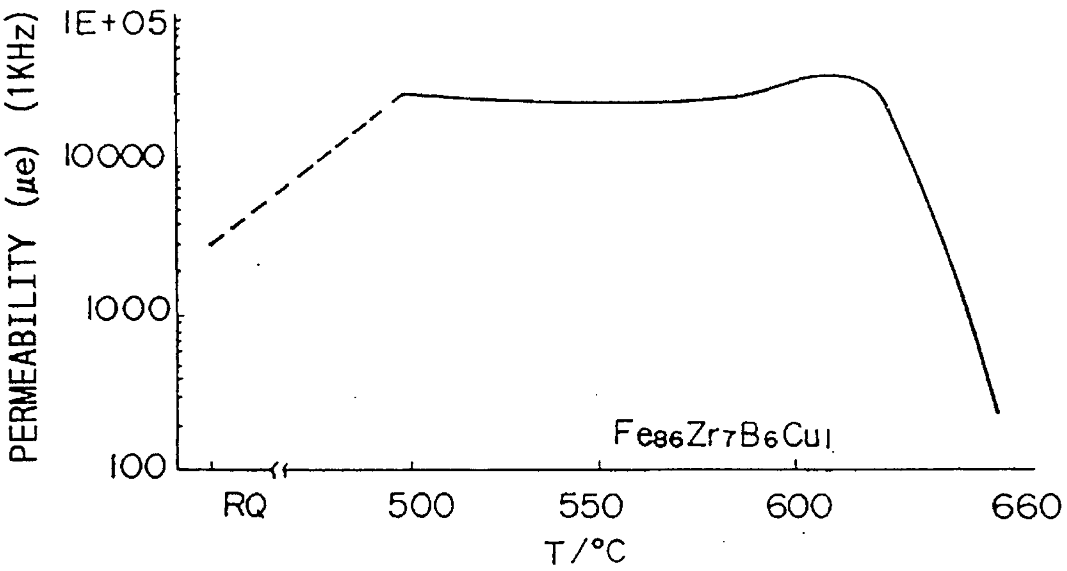
FIG. 11 shows the relationship between the effective permeability and the annealing temperature in an alloy according to the present invention.

FIG. 11 is a graphic illustration showing the effect of annealing (retained for an hour at each temperature) on the effective permeability of the $Fe_{86}Zr_7B_6Cu_1$ alloy.

It is clear from FIG. 11 that the effective permeability of the alloy according to the present invention in a quenched state (RQ), which is as low as that of the Fe-based amorphous alloy, increases to a value which is about ten times that of the value in the quenched state, due to the annealing at a temperature ranging from 500° to 620° C. We investigated frequency dependency of the permeability of a 20 μm-thick sample which was subjected to the heat treatment at 650° C., and found the sample exhibited excellent soft magnetic characteristics at high frequencies, like 32000 at 1 kHz, 25600 at 10 kHz and 8330 at 100 kHz.

The magnetic characteristics of the alloy used in the present invention can be adjusted by adequately selecting the heat treating conditions, such as the heating rate, and improved by, for example, annealing in a magnetic field.

We investigated changes in the structure of the $Fe_{86}Zr_7B_6Cu_1$ alloy, caused by the heat treatment, by the X-ray diffraction method. Also, we observed the structure of the heat treated alloy using a transmission type electronic microscope. The results are shown in FIGS. 12 and 13, respectively.

Figure 12:
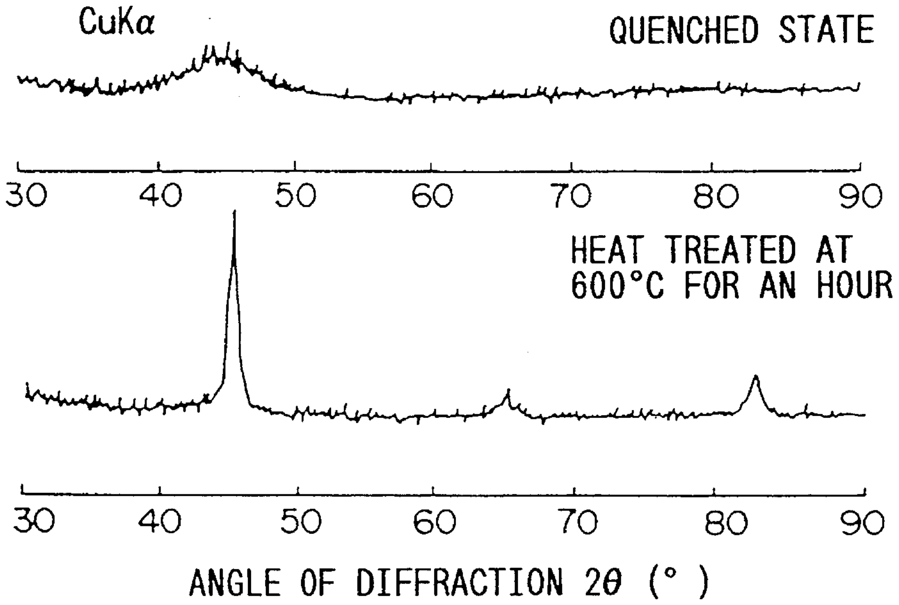
FIG. 12 is an X-ray diffraction pattern showing changes in the structure of an alloy according to the present invention caused by the heat treatment.

As shown in FIG. 12, the haloed diffraction pattern characteristic to the amorphous phase is observed in a quenched state, while the diffraction pattern inherent in the body-centered cubic structure is observed after heat treatment. It is thus clear that the structure of the alloy according to the present invention changed from the amorphous phase to the body-centered cubic structure as a consequence of the heat treatment.

Figure 13:
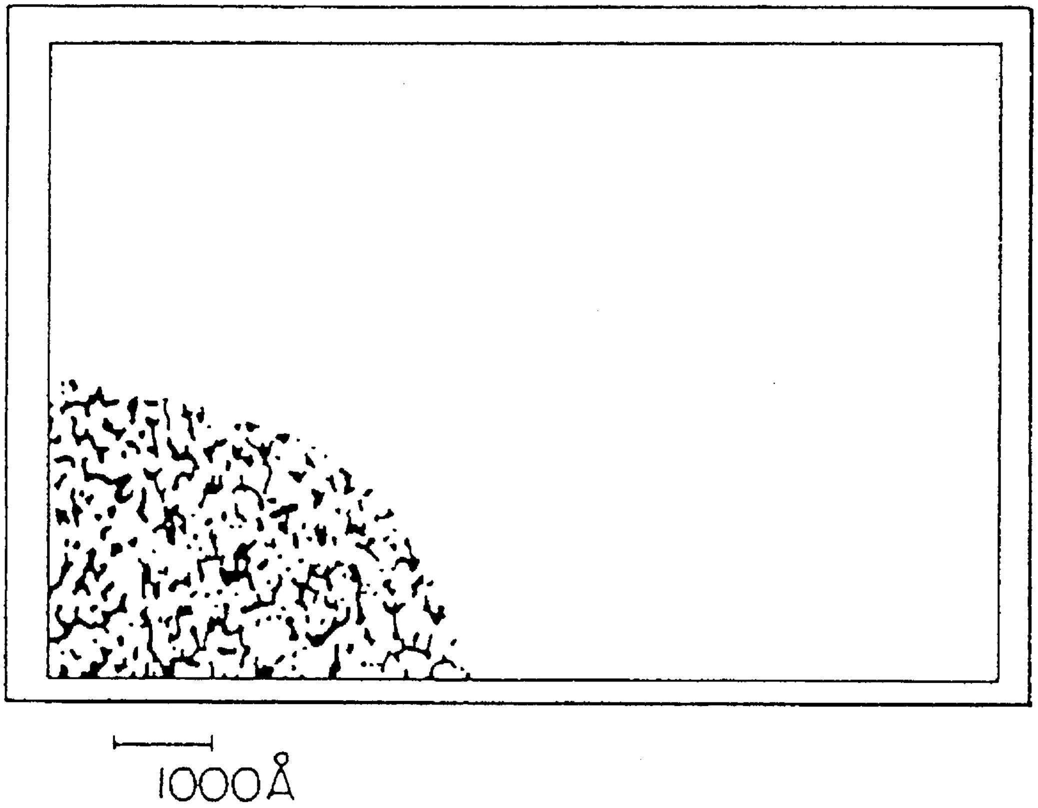
FIG. 13 is a schematic view of a microscopic photograph showing the structure of a heat treated alloy according to the present invention.

It is also clear from the transmission electronic microscopic photograph of the metallic structure shown in FIG. 13 that the heat treated structure is composed of fine grains having a grain size of about 100 Å (10 nm).

We examined changes in the hardness of the $Fe_{86}Zr_7B_6Cu_1$ alloy, caused by the heat treatment, and found that the hardness increased from 740 DPN, Vickers hardness obtained in a quenched state, to 1390 DPN which cannot be obtained in conventional amorphous materials, after the heat treatment.

It is therefore clear that the structure mainly composed of super fine grains, obtained by heat treating and thereby crystallizing the amorphous alloy having the aforementioned composition, exhibits high saturation magnetization, excellent soft magnetic characteristics, a high hardness and high thermal stability.

The present inventors examined how the magnetic characteristics of the alloy having composition examples 9 and 11 changed when the proportion of Zr and that of B in the alloy were varied. Table 10 and FIG. 14 show the magnetic characteristics of the annealed alloy.

TABLE 10

| Sample No. | Alloy composition (at %) | Permeability μe (1 K) | Coercive force Hc(Oe) | magnetization Bs(KG) |
|---|---|---|---|---|
| 128 | $Fe_{85}Zr_4B_{10}Cu_1$ | 9250 | 0.150 | 14.9 |
| 129 | $Fe_{83}Zr_4B_{12}Cu_1$ | 7800 | 0.170 | 14.2 |
| 130 | $Fe_{88}Zr_5B_6Cu_1$ | 15500 | 0.190 | 16.7 |
| 131 | $Fe_{86}Zr_5B_8Cu_1$ | 23200 | 0.032 | 15.2 |
| 132 | $Fe_{84}Zr_5B_{10}Cu_1$ | 21100 | 0.055 | 14.5 |
| 133 | $Fe_{82}Zr_5B_{12}Cu_1$ | 12000 | 0.136 | 13.9 |
| 134 | $Fe_{89}Zr_6B_4Cu_1$ | 30300 | 0.038 | 17.0 |
| 135 | $Fe_{88}Zr_6B_5Cu_1$ | 15200 | 0.052 | 16.3 |
| 136 | $Fe_{87}Zr_6B_6Cu_1$ | 18300 | 0.040 | 15.7 |
| 137 | $Fe_{86}Zr_6B_7Cu_1$ | 15400 | 0.042 | 15.2 |
| 138 | $Fe_{91}Zr_7B_1Cu_1$ | 20700 | 0.089 | 17.1 |
| 139 | $Fe_{90}Zr_7B_2Cu_1$ | 32200 | 0.030 | 16.8 |
| 140 | $Fe_{89}Zr_7B_3Cu_1$ | 32400 | 0.036 | 16.2 |
| 141 | $Fe_{88}Zr_7B_4Cu_1$ | 31300 | 0.102 | 15.8 |
| 142 | $Fe_{87}Zr_7B_5Cu_1$ | 31000 | 0.082 | 15.3 |
| 143 | $Fe_{86}Zr_7B_6Cu_1$ | 32000 | 0.044 | 15.0 |
| 144 | $Fe_{84}Zr_7B_8Cu_1$ | 25700 | 0.044 | 14.2 |
| 145 | $Fe_{82}Zr_7B_{10}Cu_1$ | 19200 | 0.038 | 13.3 |
| 146 | $Fe_{80}Zr_7B_{12}Cu_1$ | 23800 | 0.044 | 12.5 |
| 147 | $Fe_{78}Zr_7B_{14}Cu_1$ | 13300 | 0.068 | 11.8 |
| 148 | $Fe_{76}Zr_7B_{16}Cu_1$ | 10000 | 0.20 | 11.1 |
| 149 | $Fe_{88}Zr_8B_3Cu_1$ | 29800 | 0.084 | 15.4 |
| 150 | $Fe_{85}Zr_8B_6Cu_1$ | 28000 | 0.050 | 14.2 |
| 151 | $Fe_{84}Zr_8B_7Cu_1$ | 20400 | 0.044 | 13.8 |
| 152 | $Fe_{88}Zr_9B_2Cu_1$ | 11700 | 0.112 | 15.1 |
| 153 | $Fe_{86}Zr_9B_4Cu_1$ | 12900 | 0.160 | 14.3 |
| 154 | $Fe_{84}Zr_9B_6Cu_1$ | 11800 | 0.108 | 13.1 |
| 155 | $Fe_{86}Zr_{10}B_4Cu_1$ | 6240 | 0.210 | 12.8 |
| 156 | $Fe_{83}Zr_{10}B_6Cu_1$ | 5820 | 0.220 | 12.0 |

Figure 14:
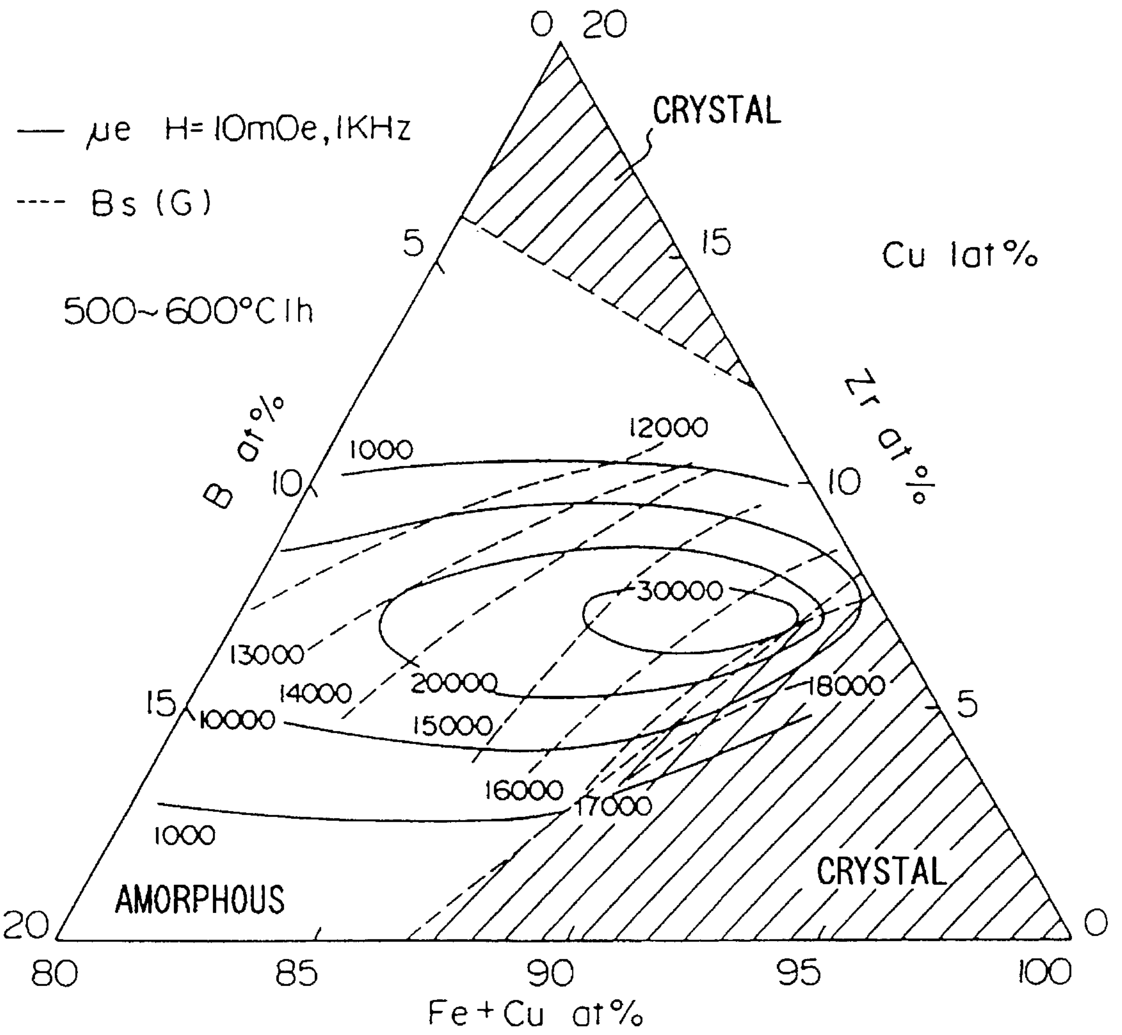
FIG. 14 shows the magnetic characteristics when the proportion of Fe+Cu, that of B and that of Zr are changed in an alloy according to the present invention.

It is clear from Table 10 and FIG. 14 that high permeability can be readily obtained when the proportion of Zr is between 4 and 10 atomic percent. It is also clear that effective permeability was not increased to more than 5000 to 10000 when the proportion of Zr is less than 4 atomic percent and that permeability rapidly decreases and saturation magnetization decreases when the proportion of Zr exceeds 10 atomic percent. Hence, the present inventors limited the proportion of Zr contained in the alloy according to the present invention to between 4 and 10 atomic percent.

Similarly, when the proportion of B is between 0.5 and 18 atomic percent, effective permeability can be readily increased to 5000 or above. Hence, the present inventors limited the proportion of B to between 0.5 and 18 atomic percent.

Further, even when the proportion of Zr and that of B are within the above range, high permeability cannot be obtained if the proportion of Fe exceeds 93 atomic percent. Thus, the present inventors limited the proportion of Fe+Co (b) in the alloy having composition examples 9 and 11 to 93 atomic percent or below.

EXAMPLE 8

A Fe—Hf—B—Cu alloy system, obtained by substituting Hf for Zr in the Fe—Zr—B—Cu alloy system shown in Example 7, will be described.

Figure 15:
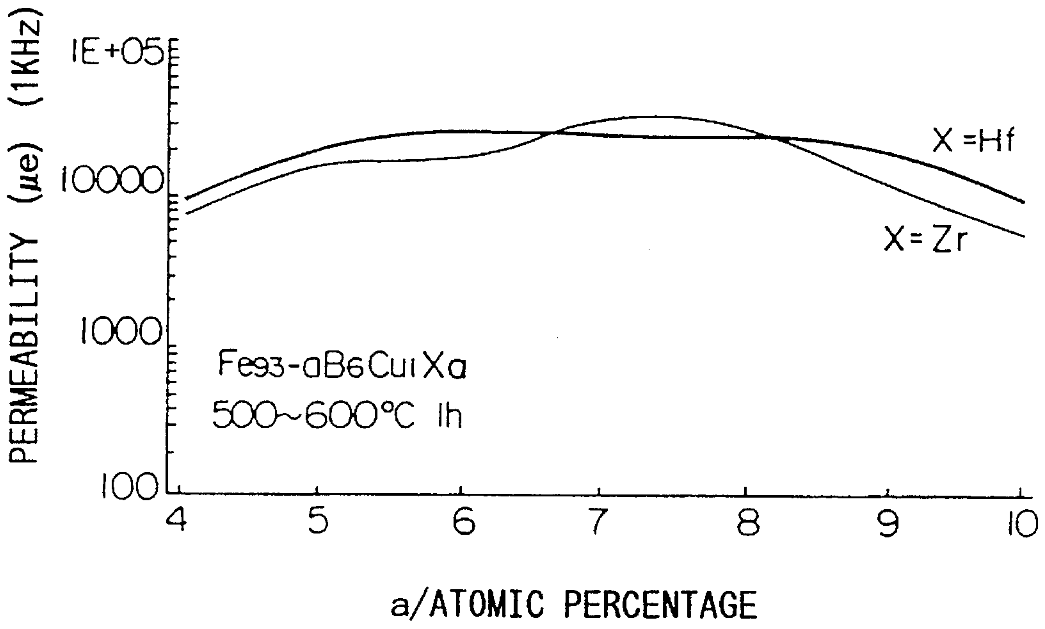
FIG. 15 is a graphic representation showing the relationship between changes in the proportion of Hf in an alloy according to the present invention and the permeability thereof.

Table 11 shows the magnetic characteristics of the alloys having various compositions in which the proportion of B is fixed to 6 atomic percent and the proportion of Cu is fixed to 1 atomic percent. FIG. 15 shows permeability obtained when the proportion of Hf is varied from 4 to 10 atomic percent. For comparison, the effective permeability of the Fe—Zr—$B_6$—$Cu_1$ alloy system is also shown in FIG. 15.

TABLE 11

| Sample No. | Alloy composition (atm %) | Permeability μ(1 K) | Coercive force Hc(Oe) | Saturation magnetization Bs(KG) |
|---|---|---|---|---|
| 157 | $Fe_{89}Hf_4B_6Cu_1$ | 9350 | 0.150 | 16.1 |
| 158 | $Fe_{88}Hf_5B_6Cu_1$ | 20400 | 0.048 | 15.7 |
| 159 | $Fe_{87}Hf_6B_6Cu_1$ | 26500 | 0.028 | 15.2 |
| 160 | $Fe_{86}Hf_7B_6Cu_1$ | 25200 | 0.028 | 14.7 |
| 161 | $Fe_{85}Hf_8B_8Cu_1$ | 25200 | 0.038 | 14.1 |
| 162 | $Fe_{84}Hf_9B_6Cu_1$ | 19600 | 0.068 | 13.5 |
| 163 | $Fe_{83}Hf_{10}B_6Cu_1$ | 9860 | 0.104 | 12.8 |
| 164 | $Fe_{86}Zr_4Hf_3B_6Cu_1$ | 39600 | 0.032 | 14.8 |

It is apparent from the characteristics shown in Table 11 and FIG. 15 that the effective permeability of the Fe—Hf—B—Cu alloy system is equivalent to that of the Fe—Zr—B—Cu alloy system when the proportion of Hf is between 4 and 9 atomic percent. Further, the magnetic characteristics of the $Fe_{86}$ $Zr_4$ $Hf_3$ $B_6$ $Cu_1$ alloy shown in Table 11 are the same as those of Fe—Zr—B—Cu alloy system of Example 7. Thus, it is clear that Zr in the Fe—Zr—B—Cu alloy system shown in Example 7 can be replaced by Hf partially or entirely within its limited composition range from 4 to 10 atomic percent.

EXAMPLE 9

A case in which part of the Zr and/or Hf of Fe—(Zr, Hf)—B—Cu alloy system, shown in Examples 7 and 8, is replaced by Nb will now be described.

Figure 16:
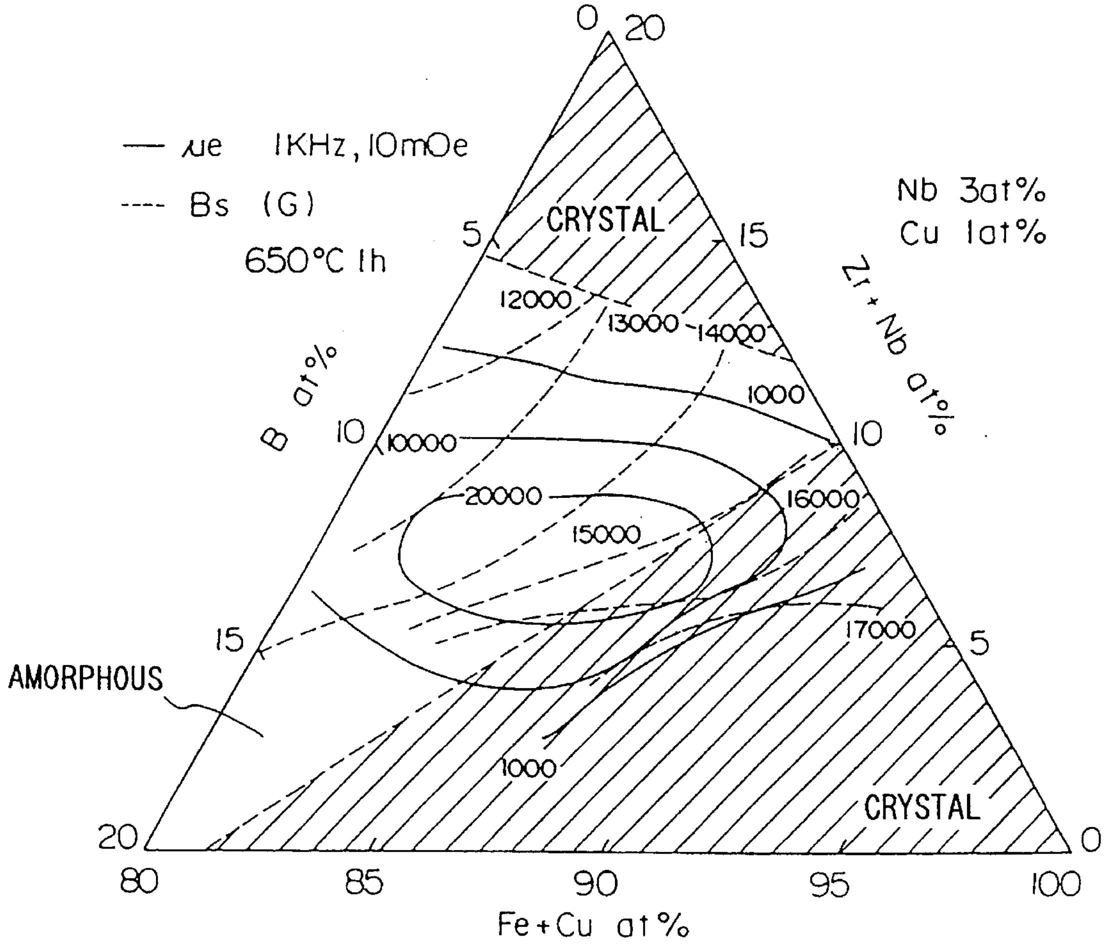
FIG. 16 shows the magnetic characteristics when the proportion of B, that of Zr+Nb and that of Fe+Cu in an alloy according to the present invention are changed.

Table 12 shows the magnetic characteristics of the alloys in which part of Zr of the Fe—Zr—B—Cu alloy system has been replaced by 1 to 5 atomic percentage of Nb. FIG. 16 shows the magnetic characteristics of the Fe—Zr—Nb—B—Cu alloy system in which the proportion of Nb is 3 atomic percent.

TABLE 12

| Sample No. | Alloy composition (at %) | Permeability μ(1K) | Coercive force Hc(Oe) | Saturation magnetization Bs(KG) |
|---|---|---|---|---|
| 165 | $Fe_{88}Zr_4Nb_1B_6Cu_1$ | 11300 | 0.108 | 16.9 |
| 166 | $Fe_{87}Zr_4Nb_2B_6Cu_1$ | 37400 | 0.042 | 15.9 |
| 167 | $Fe_{86}Zr_4Nb_4B_6Cu_1$ | 35700 | 0.046 | 15.3 |
| 168 | $Fe_{85}Zr_4Nb_4B_6Cu_1$ | 30700 | 0.050 | 14.3 |
| 169 | $Fe_{84}Zr_4Nb_5B_6Cu_1$ | 14600 | 0.092 | 13.7 |
| 170 | $Fe_{86}Zr_2Nb_3B_8Cu_1$ | 14900 | 0.108 | 16.6 |
| 171 | $Fe_{84}Zr_2Nb_3B_{10}Cu_1$ | 15900 | 0.085 | 16.2 |
| 172 | $Fe_{87}Zr_3Nb_3B_6Cu_1$ | 33800 | 0.048 | 16.0 |
| 173 | $Fe_{85}Zr_3Nb_3B_8Cu_1$ | 24100 | 0.095 | 15.5 |
| 174 | $Fe_{88}Zr_4Nb_3B_4Cu_1$ | 16900 | 0.076 | 15.6 |
| 175 | $Fe_{84}Zr_4Nb_3B_8Cu_1$ | 38700 | 0.038 | 14.6 |
| 176 | $Fe_{86}Zr_5Nb_3B_5Cu_1$ | 24200 | 0.048 | 14.8 |
| 177 | $Fe_{84}Zr_5Nb_3B_7Cu_1$ | 21700 | 0.038 | 14.0 |
| 178 | $Fe_{84}Zr_8Nb_3B_6Cu_1$ | 17300 | 0.110 | 13.9 |
| 179 | $Fe_{82}Zr_6Nb_3B_8Cu_1$ | 20400 | 0.045 | 13.2 |
| 180 | $Fe_{79}Zr_7Nb_3B_{10}Cu_1$ | 10800 | 0.125 | 12.4 |

It is clear from Table 12 and FIG. 16 that the proportion of Zr+Nb assuring high permeability is between 4 and 10 atomic percent, as in the case of Zr in the Fe—Zr—Cu alloy system, and that the inclusion of Nb in the above range assures effective permeability as high as that of the Fe—Zr—B—Cu alloy system. Therefore, it is clear that part of Zr, Hf in the Fe—(Zr, Hf)—Cu alloy system can be replaced by Nb.

EXAMPLE 10

A case in which Nb in the Fe—(Zr, Hf)—Nb—B—Cu alloy is replaced by Ti, V, Ta, Mo or W will be described.

Table 13 shows the magnetic characteristics of the Fe—Zr—M'—B—$Cu_1$ (M' is either of Ti, V, Ta, Mo and W) alloy system.

TABLE 13

| Sample No. | Alloy composition (at %) | Permeability μ(1K) | Coercive force Hc(Oe) | Saturation magnetization Bs(KG) |
|---|---|---|---|---|
| 181 | $Fe_{80}Zr_1Ti_6B_{12}Cu_1$ | 13800 | 0.105 | 12.8 |
| 182 | $Fe_{86}Zr_4Ti_3B_6Cu_1$ | 12700 | 0.110 | 14.7 |
| 183 | $Fe_{84}Zr_4V_5B_6Cu_1$ | 6640 | 0.201 | 13.5 |
| 184 | $Fe_{86}Zr_4To_3B_6Cu_1$ | 20900 | 0.096 | 15.1 |
| 185 | $Fe_{84}Zr_4To_5B_6Cu_1$ | 8310 | 0.172 | 14.0 |
| 186 | $Fe_{86}Zr_4Mo_3B_6Cu_1$ | 9410 | 0.160 | 15.3 |
| 187 | $Fe_{84}Zr_4Mo_5B_6Cu_1$ | 9870 | 0.160 | 13.7 |
| 188 | $Fe_{86}Zr_4W_3B_6Cu_1$ | 11700 | 0.098 | 14.8 |
| 189 | $Fe_{84}Zr_4W_5B_6Cu_1$ | 6910 | 0.211 | 13.2 |

In Table 13, the effective permeability of the alloys shown in Table 13 is higher than 5000, which is the effective permeability of a Fe-based amorphous alloy. It is thus clear that Nb in the Fe—(Zr, Hf)Nb—B—Cu alloy system can be replaced by Ti, V, Ta, Mo or W.

EXAMPLE 11

The reasons for limiting the proportion of Cu to that described in the above-described compositions 9 and 11 will be described below.

Figure 17:
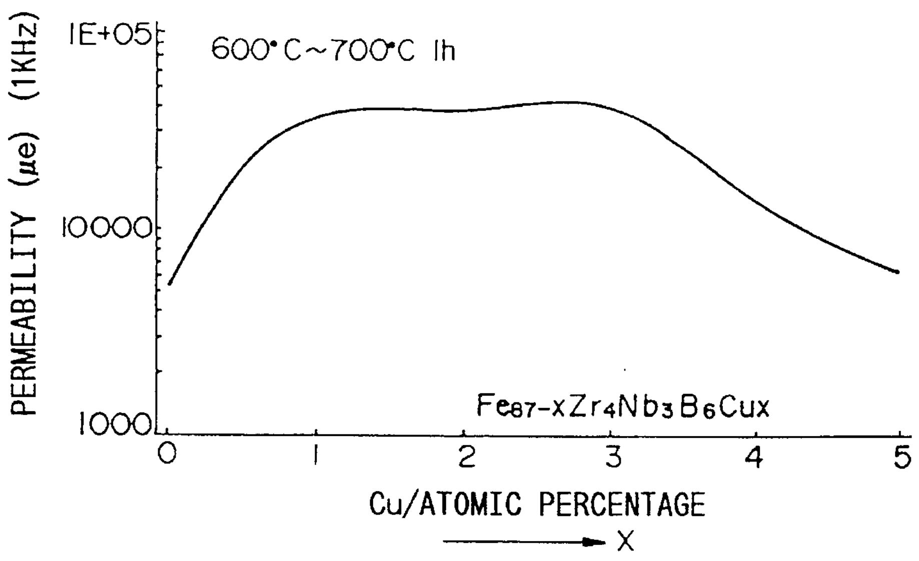
FIG. 17 is a graphic representation showing the relationship between the proportion of Cu and the effective permeability in an alloy according to the present invention.

FIG. 17 shows the relationship between the proportion of Cu (x) in the alloy having a composition expressed by $Fe_{87-x}$ $Zr_4$ $Nb_3$ $B_6$ $Cu_x$ and permeability.

It is apparent from the results shown in FIG. 17 that effective permeability of 10000 or above can be obtained when x=0.2 to 4.5 atomic percent. When x is less than 0.2 atomic percent, the effect of the addition of Cu is not obvious. When x is more than 4.5 atomic percents, the permeability of the alloy deteriorates. Therefore, the addition of more than 4.5 atomic percent of Cu is not practical. However, even when x is less than 0.2 atomic percent, effective permeability of 5000 or above can be obtained and the saturation magnetization improves due to an increase in the proportion of Fe resulting from a reduction in the proportion of Cu. Thus, the proportion of Cu may also be between 0 and 0.2 atomic percent. Consequently, the present inventors limited the proportion of Cu in the alloys described in the above compositions 9 and 11 to 4.5 atomic percent or below.

EXAMPLE 12

A case in which Cu in the alloys having compositions 7 through 11 is replaced by Ag, Ni, Pd or Pt will be described.

Table 14 shows the magnetic characteristics of the $Fe_{86}$ $Zr_4$ $Nb_3$ $B_6$ $T_1$ (T=Ag, Au, Pd, Pt) alloy.

TABLE 14

| Sample No. | Alloy composition (at %) | Permeability μ(1K) | Coercive force Hc(Oe) | Saturation magnetization Bs(KG) |
|---|---|---|---|---|
| 190 | $Fe_{86}Zr_4Nb_3B_6Pd_1$ | 18800 | 0.064 | 15.4 |
| 191 | $Fe_{86}Zr_4Nb_3B_6Pt_1$ | 19900 | 0.096 | 14.8 |
| 192 | $Fe_{86}Zr_4Nb_3B_6Ag_1$ | 17800 | 0.090 | 15.3 |
| 193 | $Fe_{86}Zr_4Nb_3B_6Au_1$ | 21500 | 0.076 | 15.2 |

It is clear from Table 14 that effective permeability of 10000 or above can be obtained, i.e., the magnetic characteristics as excellent as those of Cu can be obtained. It is thus apparent that Cu in the alloys having compositions 9 and 11 is replaceable with Ag, Au, Pd or Pt.

EXAMPLE 13

The reasons for limitation of the proportion of Co in the alloy having composition 11 will be described.

Figure 18:
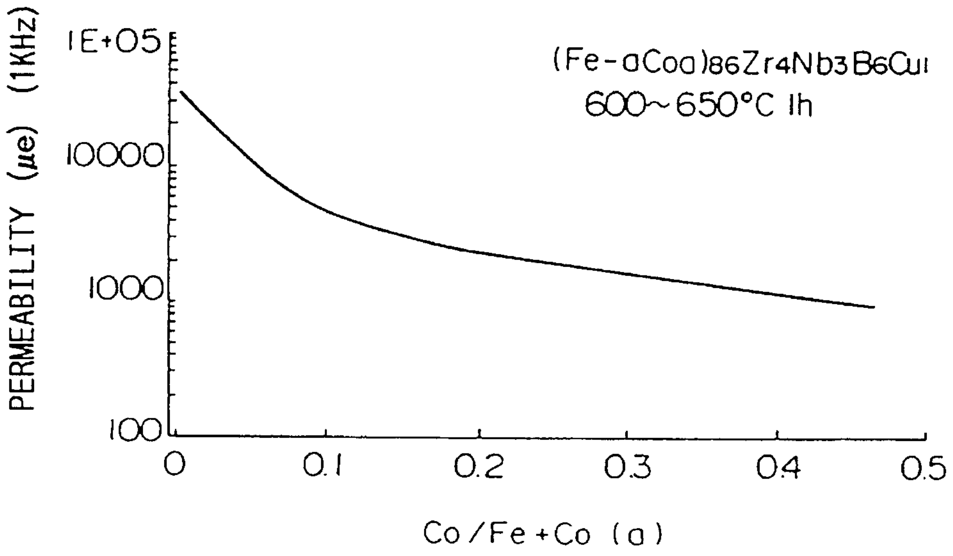
FIG. 18 is a graphic representation showing the relationship between the proportion of Co and the permeability in an alloy according to the present invention.

FIG. 18 shows the relation between permeability and the proportion of Co (a) in the $(Fe_{1-a}\ Co_a)_{86}\ Zr_4\ Nb_3\ B_6\ Cu_1$.

It is apparent from FIG. 18 that when a is 0.1 or below, effective permeability of 5000 or above, which is higher than that of the Fe-type amorphous alloy, can be obtained. Thus, the present inventors limited the proportion of Co (a) in the alloy having composition 11 to 0.1 or below. In order to increase effective permeability to 10000 or above, a desirable proportion of Cu is 0.05 or below.

EXAMPLE 14

Regarding the effect of the heat treatment on the magnetic characteristics and structure of the alloys having compositions 13 through 16, those of the $Fe_{80}$ $Nb_7$ $B_{12}$ $Cu_1$ alloy, one of the basic compositions 13 to 16, will be described below.

The crystallization initiation temperature of the above alloy, obtained by the differential thermal analysis at a heating rate of 10° C./min, was 470° C. In the case of this composition, the addition of Nb is mandatory. The same magnetic characteristics as those obtained when Nb is added can be obtained even when part of Nb is replaced by Ti or Ta.

Figure 19:
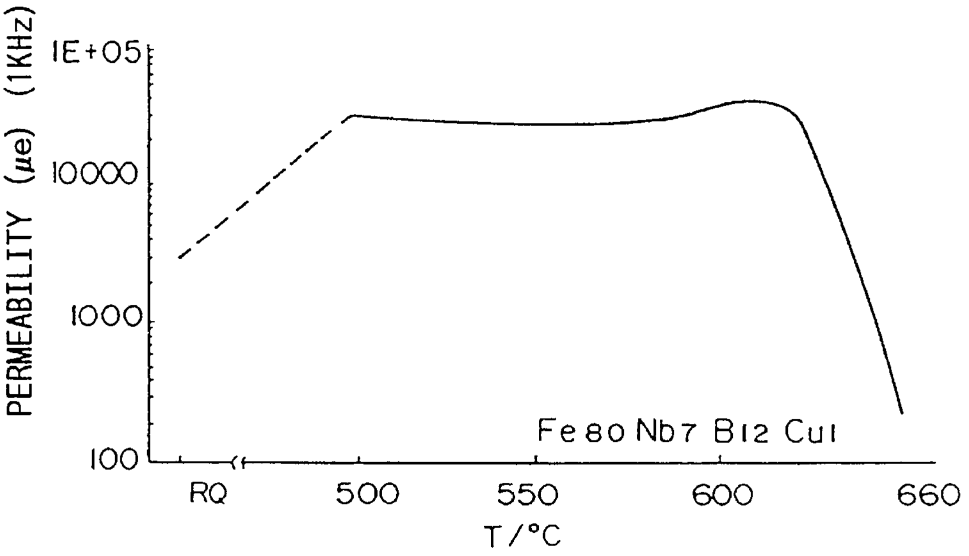
FIG. 19 is a graphic representation showing the relationship between the effective permeability and the annealing temperature in an alloy according to the present invention.

FIG. 19 is a graphic illustration showing the effect of annealing (retained for an hour at each temperature) on the effective permeability of the $Fe_{80}$ $Nb_7$ $B_{12}$ $Cu_1$ alloy.

It is clear from FIG. 19 that the effective permeability of the alloy according to the present invention in a quenched state (RQ), which is as low as that of the Fe-based amorphous alloy, increases to a value which is about ten times that of the value in the quenched state, due to the annealing at a temperature ranging from 500° to 620° C. We investigated the frequency dependency of the permeability of an approximately 20 μm-thick sample which was subjected to the heat treatment at 600° C., and found the sample exhibited excellent soft magnetic characteristics at high frequencies, like 28800 at 1 kHz, 25400 at 10 kHz and 7600 at 100 kHz.

Figure 20:
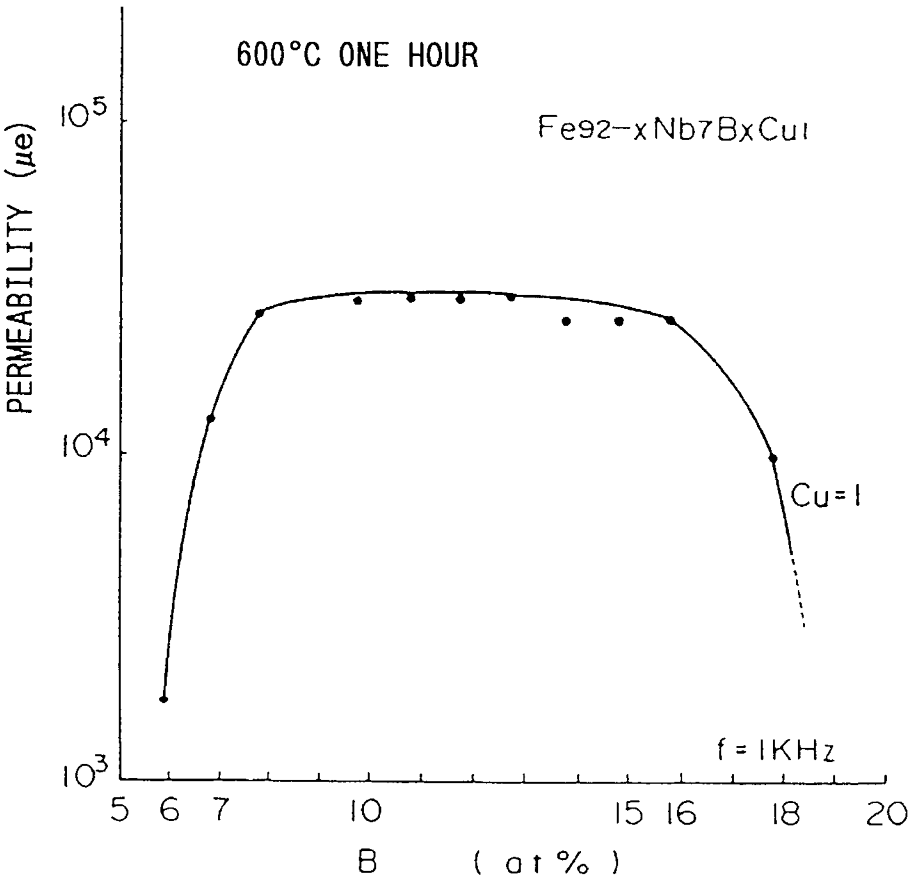
FIG. 20 is a graphic representation showing the relationship between the proportion of B and the effective permeability in an alloy according to the present invention.

FIG. 20 shows the results of the measurements regarding an influence of the proportion of B on the effective permeability of the $Fe_{92-x}$ $Nb_7$ $B_x$ $Cu_1$ alloy. In FIG. 20, we examined how permeability changed when the proportion of B was varied between 6 and 18 atomic percent.

It is clear from FIG. 20 that when the proportion of B is between 6.5 and 18 atomic percent, excellent permeability can be obtained. Thus, the present inventors limited the proportion of B to 6.5 to 18 atomic percent in the alloy having either of compositions 13 through 16.

EXAMPLE 15

Figure 21:
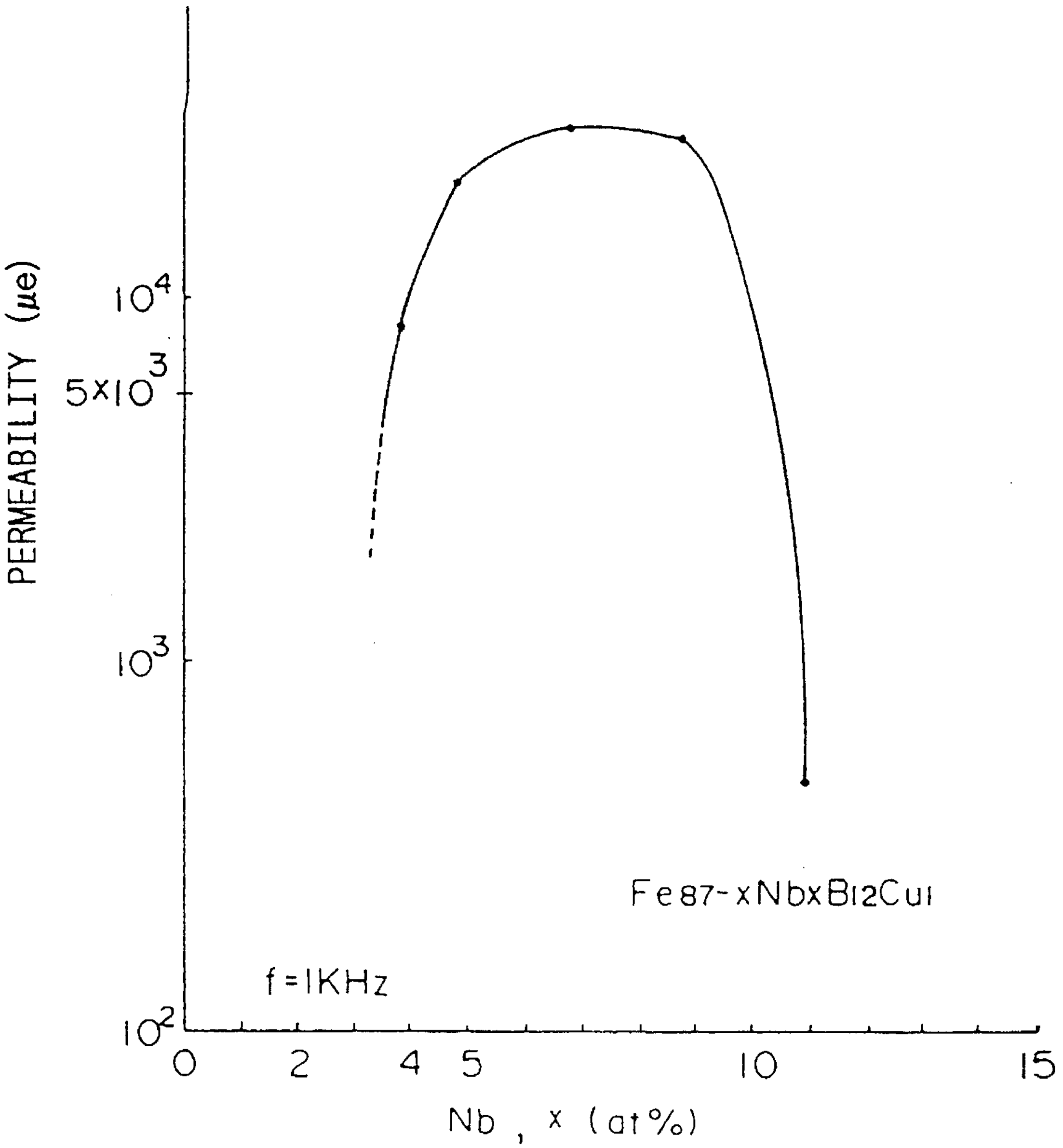
FIG. 21 is a graphic representation showing the relationship between the proportion of Nb and the effective permeability in an alloy according to the present invention.

FIG. 21 shows the results of the measurements conducted to examine an influence of the proportion of Nb on the effective permeability of the $Fe_{87-x}$ $Nb_x$ $B_{12}$ $Cu_1$ alloy. In the measurements shown FIG. 21, we examined how permeability changed when the proportion of Nb was varied between 3 and 11 atomic percent.

It is clear from FIG. 21 that when the proportion of Nb is between 4 and 10 atomic percent, excellent permeability can be obtained. Thus, the present inventors limited the proportion of Nb to 4 to 10 atomic percent in the alloy having either of compositions 9 through 16.

We investigated changes in the structure of the $Fe_{92-x}$ $Nb_7$ $B_x$ $Cu_1$ alloy, caused by the heat treatment, by the X-ray diffraction method. Also, we observed the structure of the heat treated alloy using a transmission type electronic microscope. The results are shown in FIGS. 22 and 23, respectively.

Figure 22:
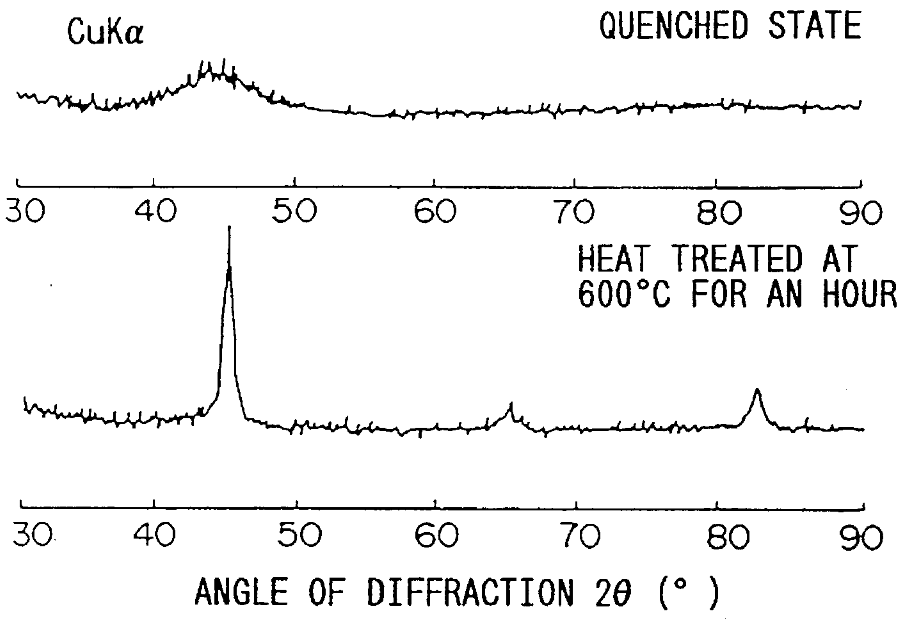
FIG. 22 is an X-ray diffraction pattern showing changes in the structure of an alloy according to the present invention caused by the heat treatment.

As shown in FIG. 22, the haloed diffraction pattern characteristic to the amorphous phase is observed in a quenched state, while the diffraction pattern inherent in the crystalline structure is observed after heat treatment. It is thus clear that the structure of the alloy according to the present invention changed from the amorphous phase to the crystalline structure as a consequence of the heat treatment.

Figure 23:
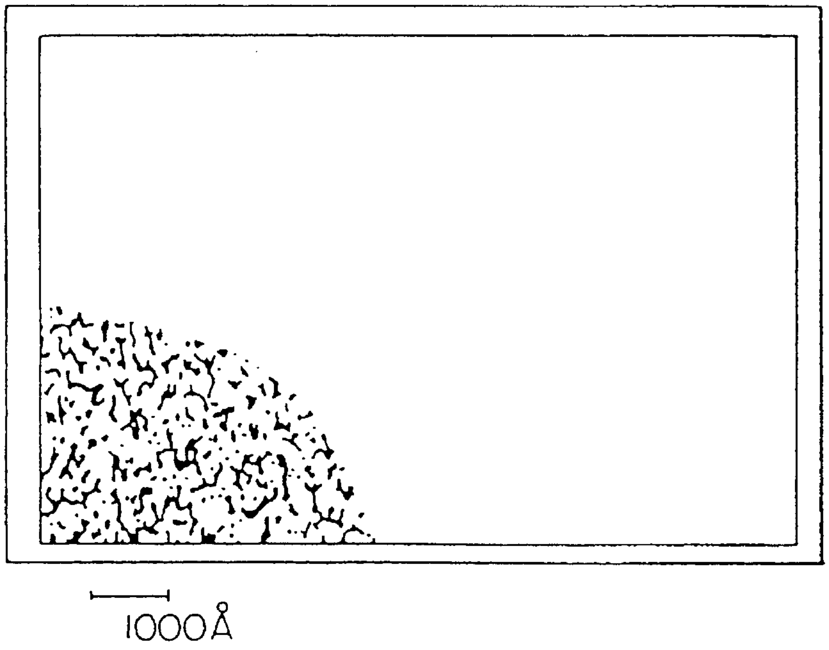
FIG. 23 is a schematic view of a microscopic photograph showing the structure of a heat treated alloy according to the present invention.

It is also clear from FIG. 23 that the heat treated structure is composed of fine grains having a grain size of about 100 Å (10 nm).

We examined changes in the hardness of the $Fe_{80}$ $Nb_{12}$ $B_7$ $Cu_1$ alloy, caused by the heat treatment, and found that the hardness increased from 650 DPN, Vickers hardness obtained in a quenched state, to 950 DPN, after the heat treatment.

In the alloy according to the present invention having any of the compositions 5 through 8 and 13 through 16, the structure mainly composed of super fine grains, obtained by heat treating and thereby crystallizing the amorphous alloy having any of the aforementioned compositions, exhibits high saturation magnetization, excellent soft magnetic characteristics, a high hardness and high thermal stability. Further, since the major elements employed in the alloy according to the present invention do not tend to readily generate an oxide and are thus not readily oxidized during manufacture, manufacture of the alloy is facilitated.

We measured changes in the permeability of the soft magnetic alloy according to the present invention having any of the compositions 13 through 16, caused by changes in the proportions of Fe+Cu, of B and of Nb. The results of the measurements are shown in FIG. 24.

Figure 24:
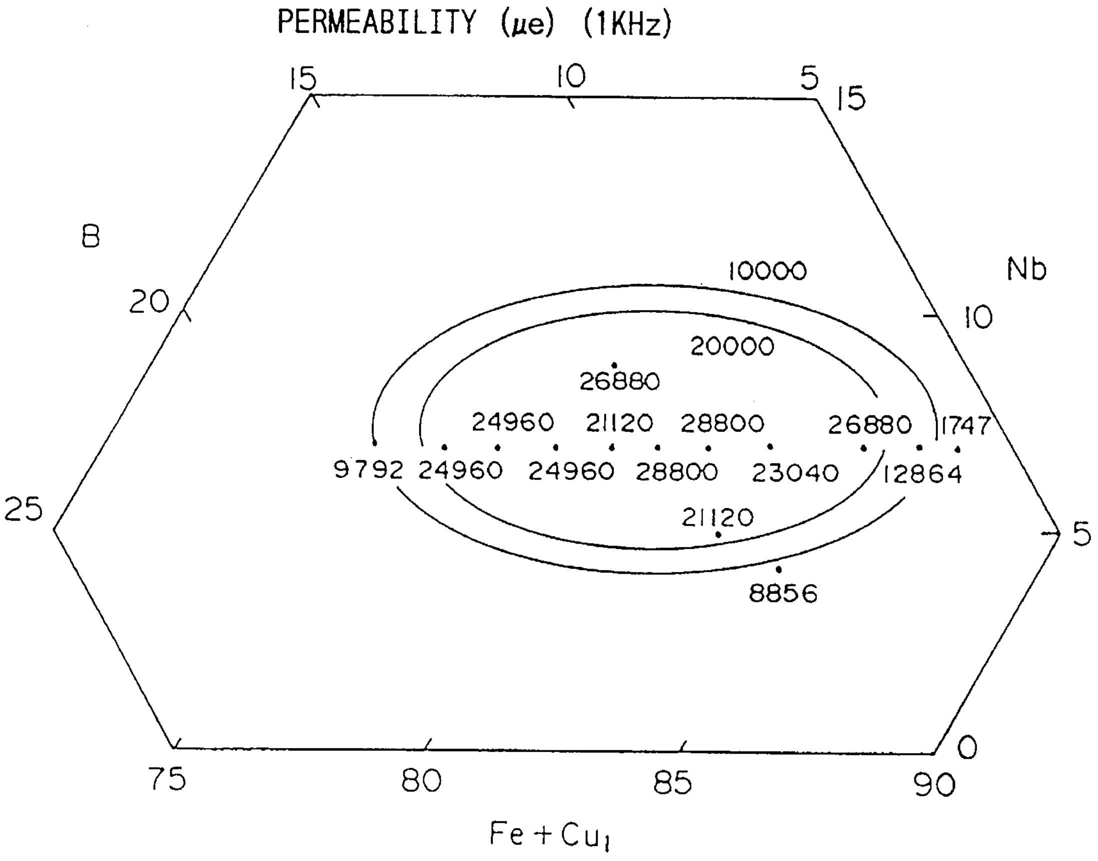
FIG. 24 shows permeability when the proportion of Fe+Cu, that of B and that of Nb are changed in an alloy according to the present invention.

It is clear from FIG. 24 that permeability of about 10000 can be obtained when the proportion of Nb is between 4 and 10 atomic percent and when the proportion of B is between 6.5 and 18 atomic percent.

We measured changes in the saturation magnetization of the soft magnetic alloy according to the present invention described in compositions 13 through 16, caused by changes in the proportions of Fe+Cu, of B and of Nb. The results of the measurements are shown in FIG. 25.

Figure 25:
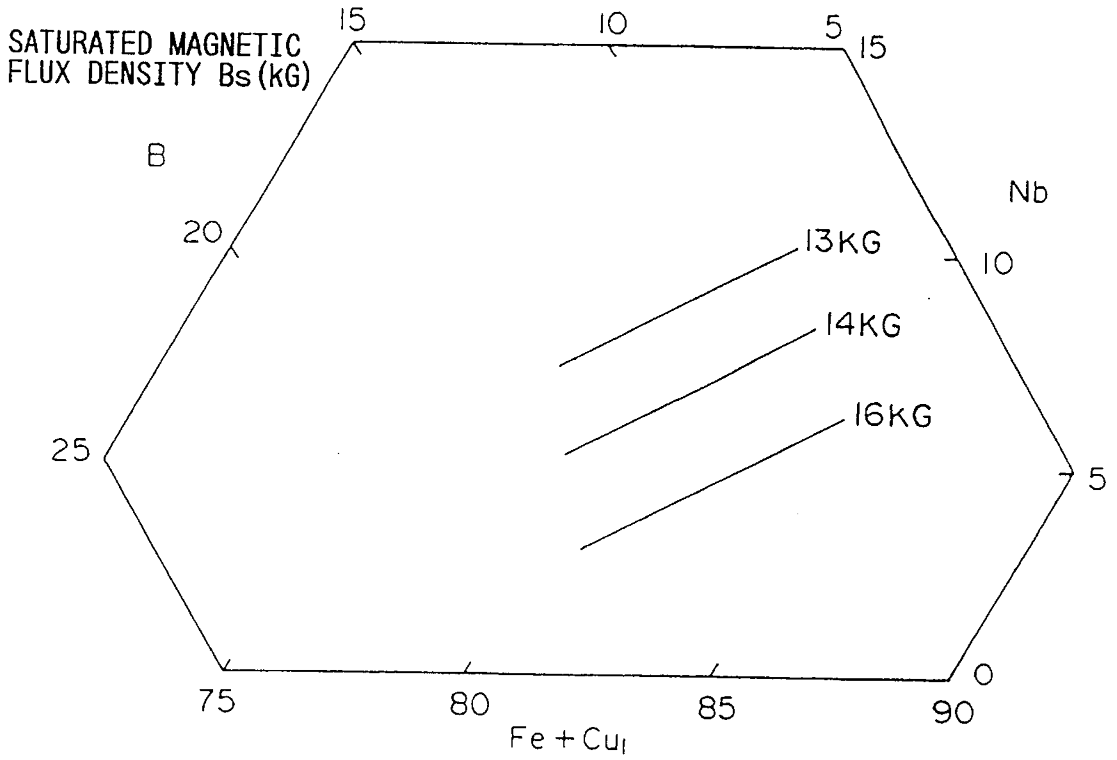
FIG. 25 shows saturation magnetization when the proportion of Fe+Cu, that of B and that of Nb are changed in an alloy according to the present invention.

It is clear from FIG. 25 that excellent saturation magnetization of 13 kG to 16 kG can be obtained in the alloy composition range according to the present invention.

The reasons for limitation of the proportion of Cu in the alloy described in compositions 13 through 16 will be described below.

Figure 26:
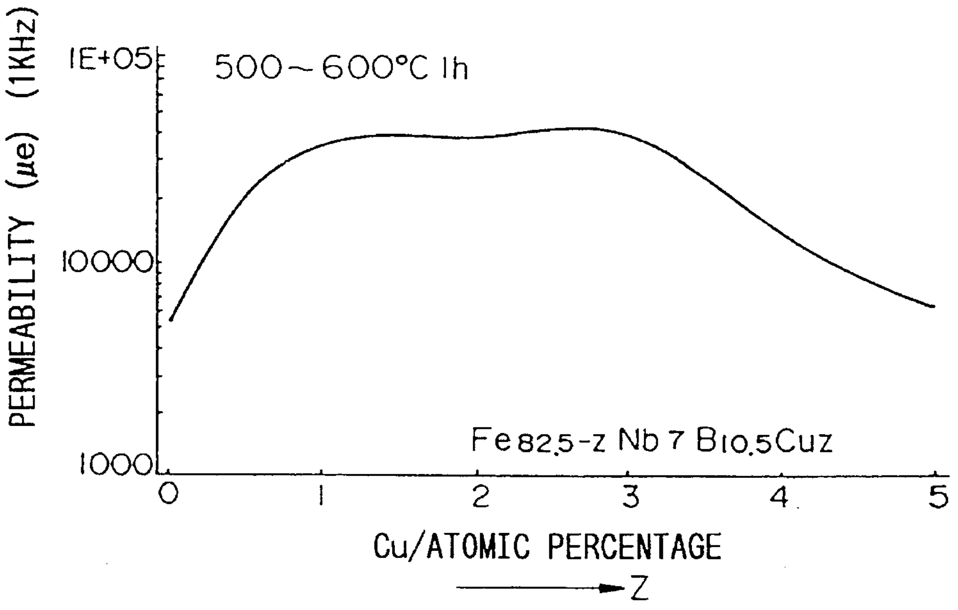
FIG. 26 is a graphic representation showing the relationship between the proportion of Cu and the effective permeability in an alloy according to the present invention.

FIG. 26 shows the relation between the proportion of Cu (z) in the alloy having a composition expressed by $Fe_{82.5-z}$ $Nb_7$ $B_{10.5}$ $Cu_z$ and permeability.

It is apparent from the results shown in FIG. 26 that excellent effective permeability can be obtained when z=0.2 to 4.5 atomic percent. When z is less than 0.2 atomic percent, the effect of the addition of Cu is not obvious. When z is more than 4.5 atomic percent, the permeability of the alloy deteriorates. Therefore, the addition of more than 4 atomic percentage of Cu is not practical. However, when z is less than 0.2 atomic percent, practical effective permeability of 5000 or above can be obtained, and saturation magnetization can be slightly increased. Thus, the proportion of Cu may also be 0.2 atomic percent or below. Consequently, the present inventors limited the proportion of Cu in the alloy employed in the present invention to 4.5 atomic percent or below.

An alloy, such as a Fe—Nb—Ta—B—Cu alloy system, a Fe—Nb—Ti—B—Cu alloy system or a Fe—Nb—Ta—Ti—B—Cu alloy system, obtained by replacing Nb in the Fe—Nb—B—Cu alloy system by a plurality of elements, will be described.

Figure 27:
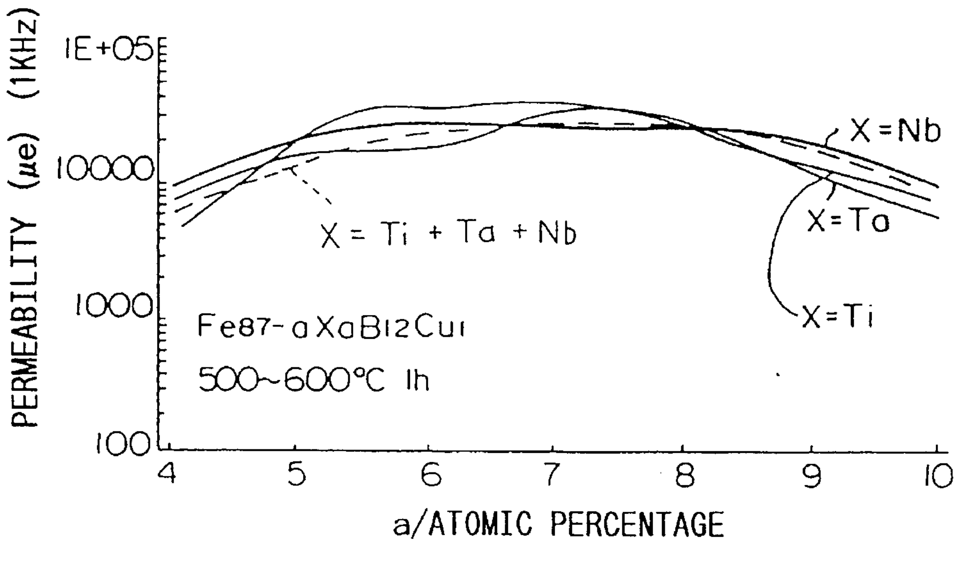
FIG. 27 is a graphic representation showing the relationship between the proportion of Nb, that of Ta and that of Ti and the permeability in an alloy according to the present invention.

FIG. 27 shows the permeability of the alloy in which Nb and part of Nb are respectively replaced by 4 to 10 atomic percent of Ta and 4 to 10 atomic percent of Ti with proportion of B and that of Cu fixed to 12 atomic percent and 1 atomic percent, respectively.

It is clear from the results shown in FIG. 27 that almost the same permeability is obtained in the alloys having various compositions.

Further, we measured the saturation magnetization (kG) of the alloy having compositions shown in Table 15.

TABLE 15

| Alloy composition (atm %) | Saturation magnetic flux density Bs(KG) | Permeability μ(1 kHz) |
|---|---|---|
| $Fe_{84}Nb_7B_8Cu_1$ | 15.3 (kG) | 31000 |
| $Fe_{80}Ta_7B_{12}Cu_1$ | 12.0 | 20000 |
| $Fe_{82}Ti_7B_{10}Cu_1$ | 14.0 | 26000 |
| $Fe_{82}Ta_4Ti_3B_{10}Cu_1$ | 14.0 | 24000 |
| $Fe_{82}Nb_3Ta_2Ti_2B_{10}Cu_1$ | 14.1 | 20000 |

It can be seen from Table 15 that Nb in the Fe—Nb—B—Cu alloy system can be replaced by Ta and/or Ti, e.g., that Nb can be replaced by Nb and Ti, Ta and Ti or Nb, Ta and Ti.

As will be understood from the above description, the soft magnetic alloy having any of compositions 9 through 16 exhibits a high permeability of 10000 or above, saturation magnetization of 12 to 15.3 kG, excellent heat resistance and a high hardness.

Thus, the above-described soft magnetic alloy is suitable for use as a magnetic core for a noise filter, a magnetic head, a transformer or chalk coil. The use of the above soft magnetic alloy improves performance and reduces the size and weight of such components.

EXAMPLE 16

Regarding the effect of the heat treatment on the magnetic characteristics and structure of the alloy having any of compositions 5 through 8, those of the $Fe_{84}$ $Nb_7$ $B_9$ alloy, one of the basic compositions 5 through 8, will be described below. The crystallization initiation temperature of the above alloy, obtained by the differential thermal analysis at a heating rate of 10° C./min, was 490° C.

Figure 28:
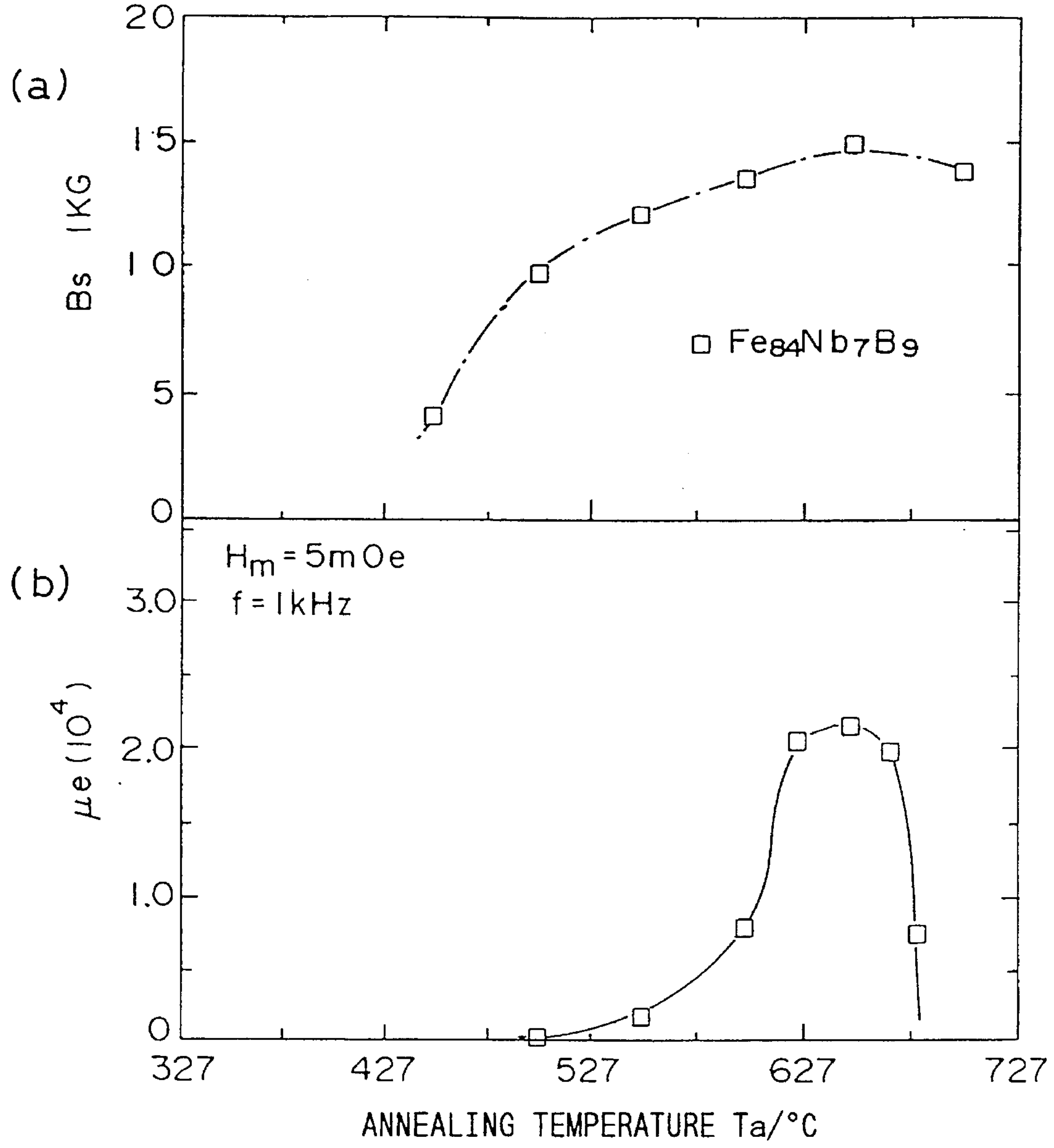
FIG. 28 (*a*) is a graphic representation showing the relationship between the saturation magnetization and the annealing temperature in an alloy according to the present invention.

FIG. 28 is a graphic illustration showing the effect of annealing (retained for an hour at each temperature) on the effective permeability (μe) and saturation magnetization (Bs) of the above alloy.

It is clear from FIG. 28 that the effective permeability of the alloy according to the present invention, which is low in a quenched state (RQ) of the alloy, rapidly increases due to the annealing at a temperature ranging from 550° to 680° C. We investigated frequency dependency of the permeability of an approximately 20 μm-thick sample which was subjected to the heat treatment at 650° C., and found the sample exhibited excellent soft magnetic characteristics at high frequencies, like 22000 at 1 kHz, 19000 at 10 kHz and 8000 at 100 kHz. It thus became clear that the magnetic characteristics of the alloy according to the present invention can be adjusted by adequately selecting the heat treating conditions, such as the temperature increasing rate, and improved by annealing in a magnetic field.

In the soft magnetic alloy employed in the present invention, the heat treating temperature should be adequately selected according to the composition thereof in a range from 400° to 750° C.

Figure 29:
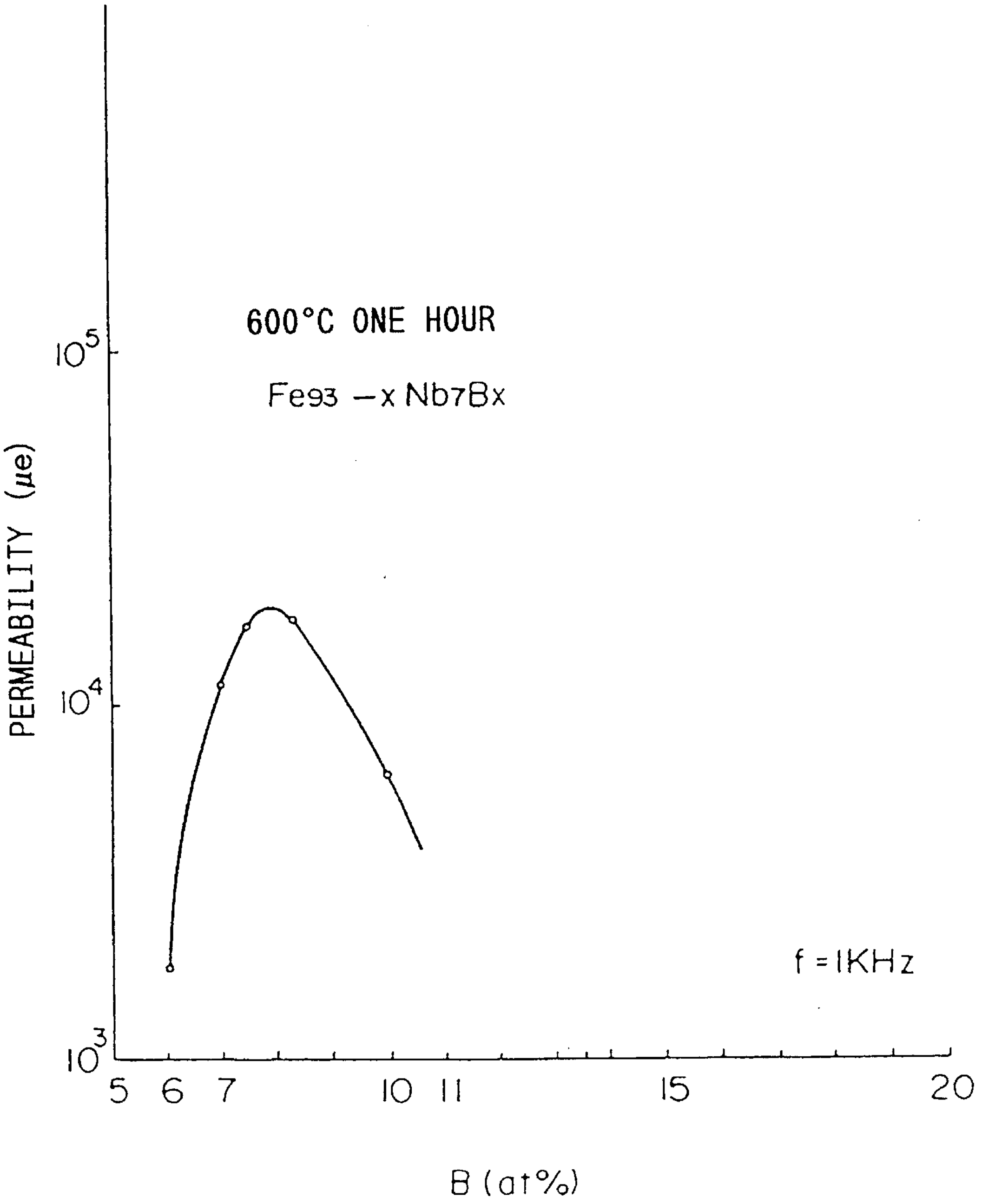
FIG. 29 is a graphic representation showing the relationship between the proportion of B and the effective permeability in an alloy according to the present invention.

FIG. 29 shows the results of the measurements regarding an influence of the proportion of B on the effective permeability of the $Fe_{93-x}$ $Nb_7$ $B_x$ alloy. In FIG. 29, we examined how permeability changed when the proportion of B was varied between 6 and 10 atomic percent.

It is clear from FIG. 29 that when the proportion of B is between 6.5 and 10 atomic percent, excellent permeability can be obtained. Thus, the present inventors limited the proportion of B to 6.5 to 10 atomic percent in the alloy having either of composition examples 5 through 8.

We investigated changes in the structure of the $Fe_{93-x}$ $Nb_7$ $B_x$ alloy, caused by the heat treatment, by the X-ray diffraction method. Also, we observed the structure of the heat treated alloy using a transmission type electronic microscope. The results are shown in FIGS. 30 and 31, respectively.

Figure 30:
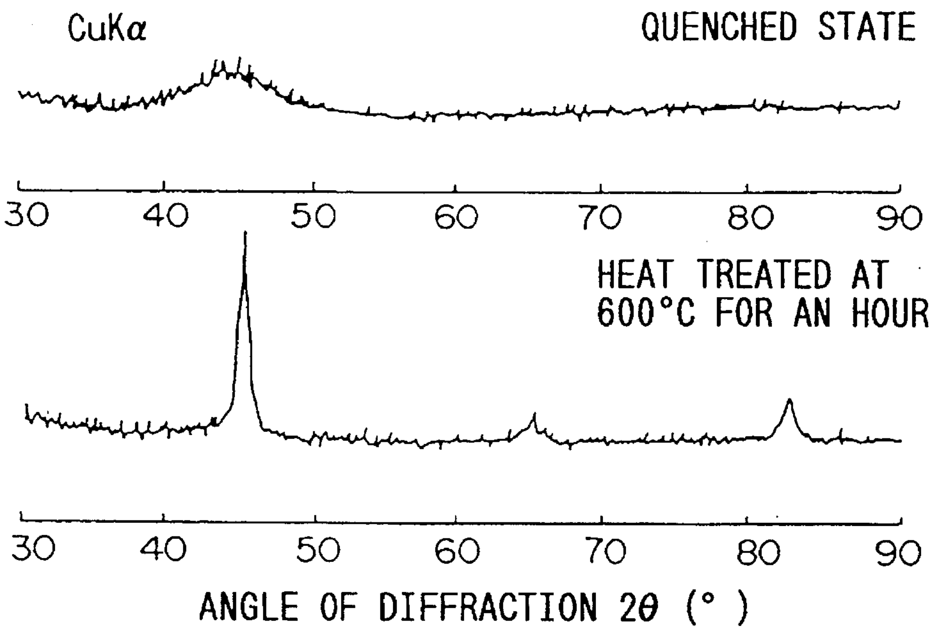
FIG. 30 is an X-ray diffraction pattern showing changes in the structure of an alloy according to the present invention caused by the heat treatment.

As shown in FIG. 30, the haloed diffraction pattern characteristic to the amorphous phase is observed in a quenched state, while the diffraction pattern inherent in the crystalline structure is observed after heat treatment. It is thus clear that the structure of the alloy according to the present invention changed from the amorphous phase to the crystalline structure as a consequence of the heat treatment.

Figure 31:
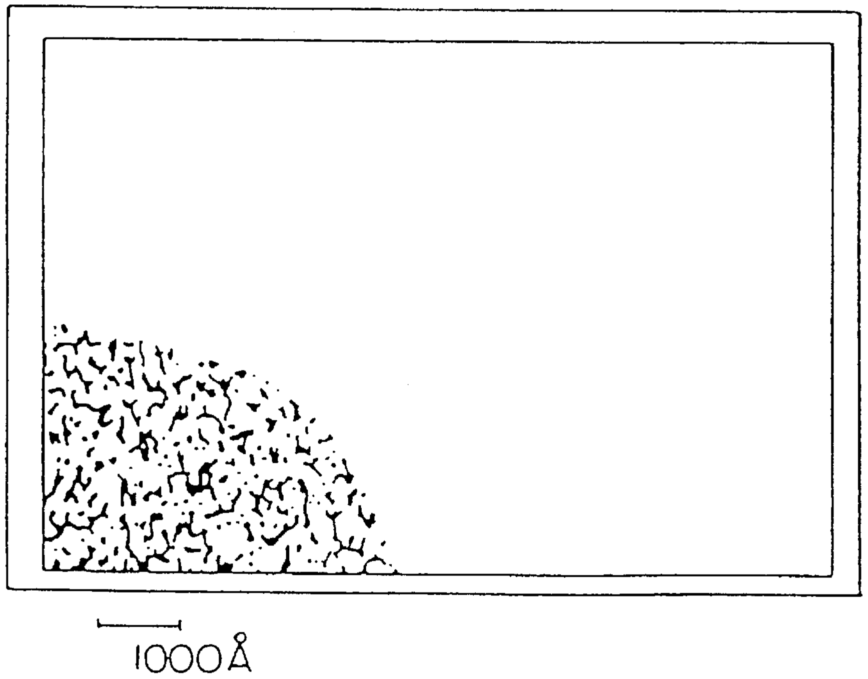
FIG. 31 is a schematic view of a microscopic photograph showing the structure of a heat treated alloy according to the present invention.

It is also clear from FIG. 31 that the heat treated structure is composed of fine grains having a grain size of about 100 to 200 Å (10 to 20 nm).

We examined changes in the hardness of the $Fe_{84} Nb_7 B_9$ alloy, caused by the heat treatment, and found that the hardness increased from 650 DPN, Vickers hardness obtained in a quenched state, to 950 DPN, after the heat treatment.

In the alloy according to the present invention having any of the compositions 5 through 8, the structure mainly composed of super fine grains, obtained by heat treating and thereby crystallizing the amorphous alloy having any of the aforementioned compositions, exhibits high saturation magnetization, excellent soft magnetic characteristics, a high hardness and high thermal stability. Further, since the major elements employed in the alloy according to the present invention do not tend to readily generate an oxide and are thus not readily oxidized during manufacture, manufacture of the alloy is facilitated.

We measured changes in the saturation magnetization of the soft magnetic alloy according to the present invention described in compositions 5 through 8, caused by changes in the proportions of Fe, that of B and that of Nb. The results of the measurements are shown in FIG. 32.

Figure 32:
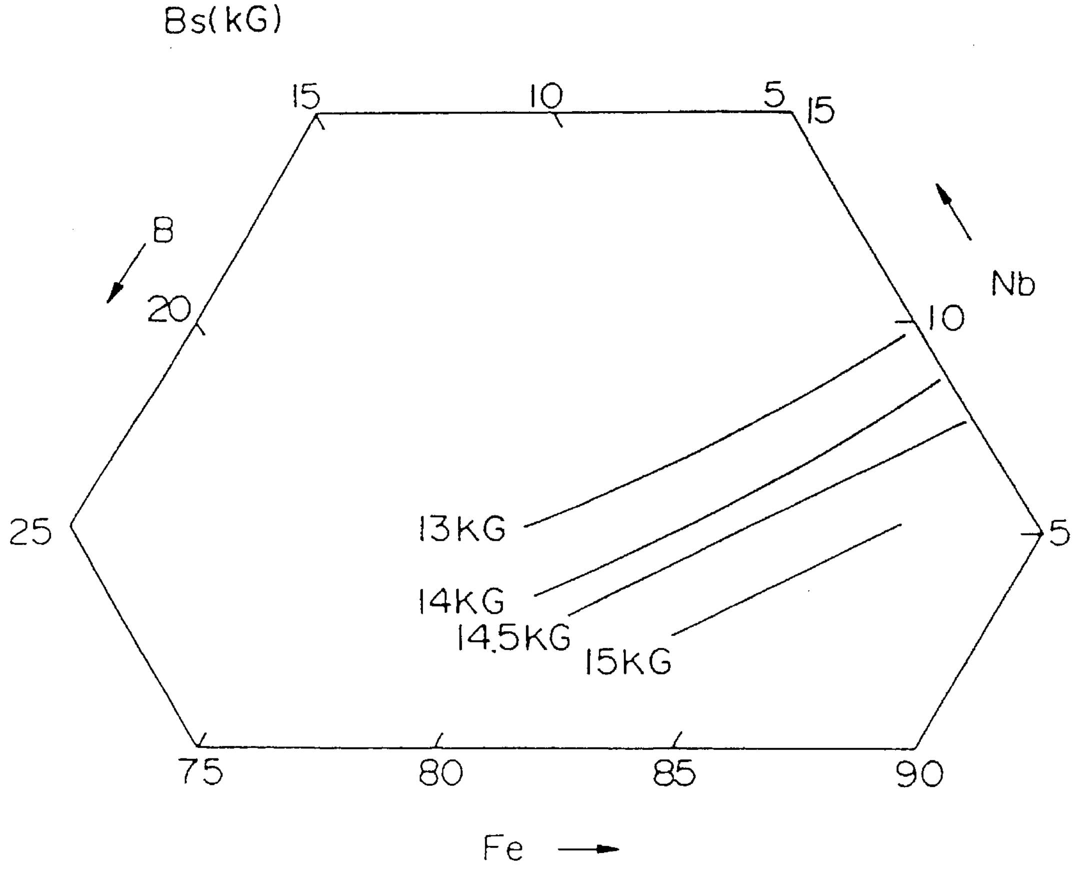
FIG. 32 shows saturation magnetization when the proportion of Fe, that of B and that of Nb are changed in an alloy according to the present invention.

It is clear from FIG. 32 that excellent saturation magnetization of 13 kG to 15 kG can be obtained in the alloy composition range according to the present invention.

The reasons for the limitation of the proportion of Co and that of Ni in the alloy described in compositions 7 and 8 will be described below.

Figure 33:
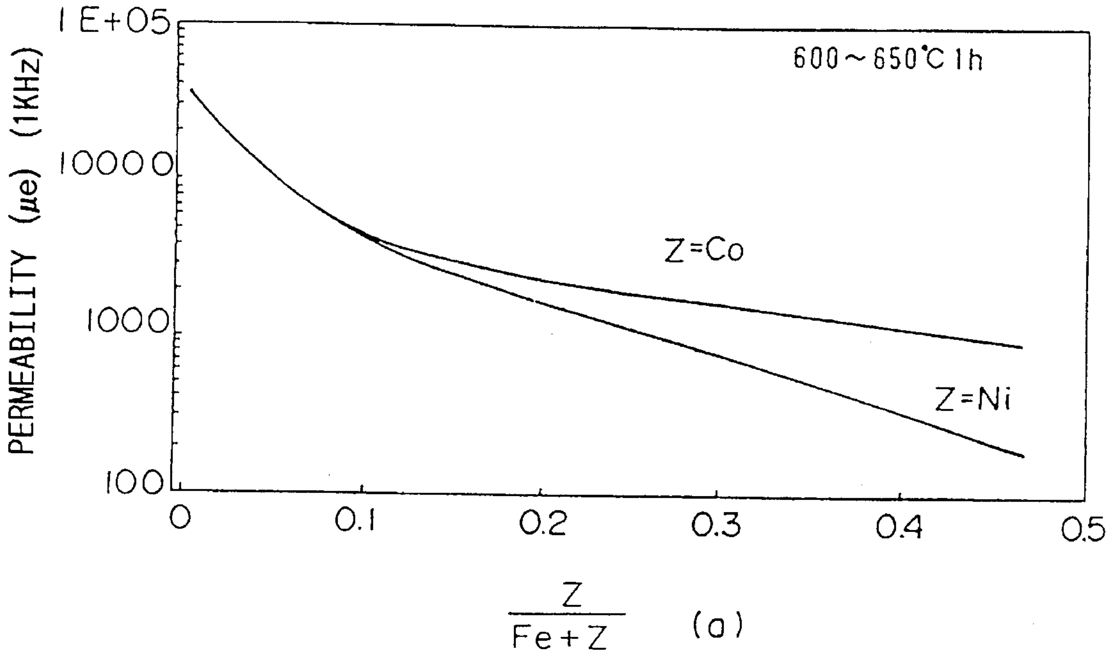
FIG. 33 is a graphic representation showing the relationship between the proportion of Co or Ni and the permeability in an alloy according to the present invention.

FIG. 33 shows the relation between the proportion of Co and that of Ni (1) in the alloy having a composition expressed by $(Fe_{1-a} Z_a)_{84} Nb_7 B_9$ (Z=Co, Ni) and permeability.

It is apparent from the results shown in FIG. 33 that excellent effective permeability of 5000 or above, which is the same as that of the Fe based amorphous alloy, can be obtained when the proportion of Co and the proportion of Ni are 0.1 or above. When a is more than 0.1 atomic percent, the permeability of the alloy rapidly reduces. Therefore, the present inventors limited the proportion of Co and the proportion of Ni in the alloy employed in the present invention to 0.1 or below.

An alloy, such as a Fe—Nb—Ta—B—Cu alloy system, a Fe—Nb—Ti—B alloy system or a Fe—Nb—Ta—Ti—B alloy system, obtained by replacing Nb in the Fe—Nb—B alloy system by a plurality of elements, will be described. Table 16 shows the results of the measurements conducted to examine the magnetic characteristics of the soft magnetic alloy obtained by heat treating the above alloy at a heating rate of 80° to 100° C./min.

TABLE 16

| Alloy composition (atm %) | Permeability μe (1 kHz) | Saturation magnetic flux density Bs (kG) |
|---|---|---|
| $Fe_{84}Nb_7B_9$ | 23500 | 15.3 |
| $Fe_{84}Nb_4Ta_2Ti_1B_9$ | 12000 | 15.0 |
| $Fe_{84}Nb_6Ti_1B_9$ | 12500 | 15.0 |
| $Fe_{84}Nb_6Ta_1B_9$ | 11000 | 14.9 |

It is clear from the results shown in FIG. 16 that similar permeability and saturation magnetization are obtained in the alloys.

It can be seen from Table 16 that Nb in the Fe—Nb—B alloy system can be partially replaced by Ta and/or Ti, e.g., that Nb can be replaced by Nb and Ti, Nb and Ti or Nb, Ta and Ti.

As will be understood from the above description, the soft magnetic alloy having any of compositions 5 through 9 exhibits high permeability, which is equal to or greater than that of the Fe based amorphous alloy, saturation magnetization of about 15 kG, excellent heat resistance and a high hardness.

Thus, the above-described soft magnetic alloy having any of the compositions 5 through 8 is suitable for use as a magnetic core for a noise filter. The use of the soft magnetic alloy as a magnetic core improves performance of the noise filter and reduces size and weight thereof.

EXAMPLE 17

Figure 34A:
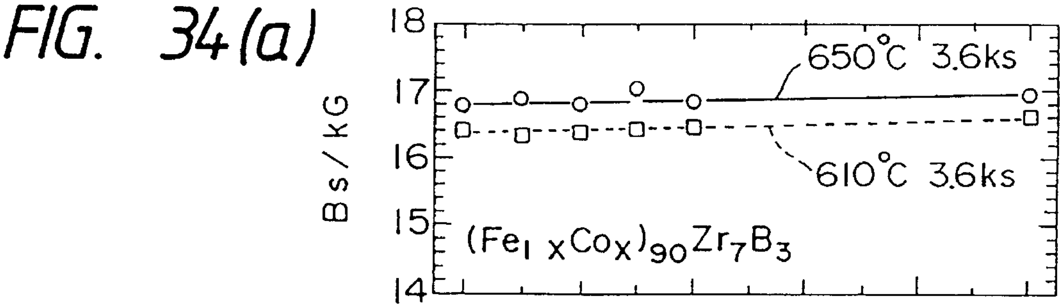
FIG. 34 (*a*) is a graphic representation showing the relationship between the proportion of Co and the saturation magnetization in an alloy according to the present invention.
Figure 34B:
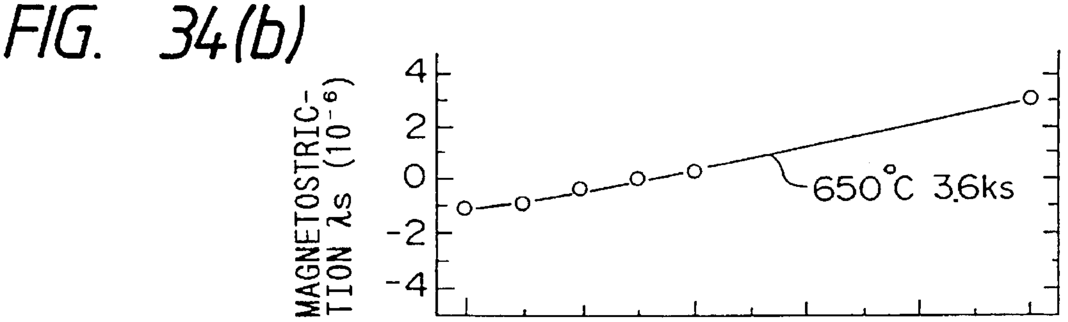
Figure 34C:
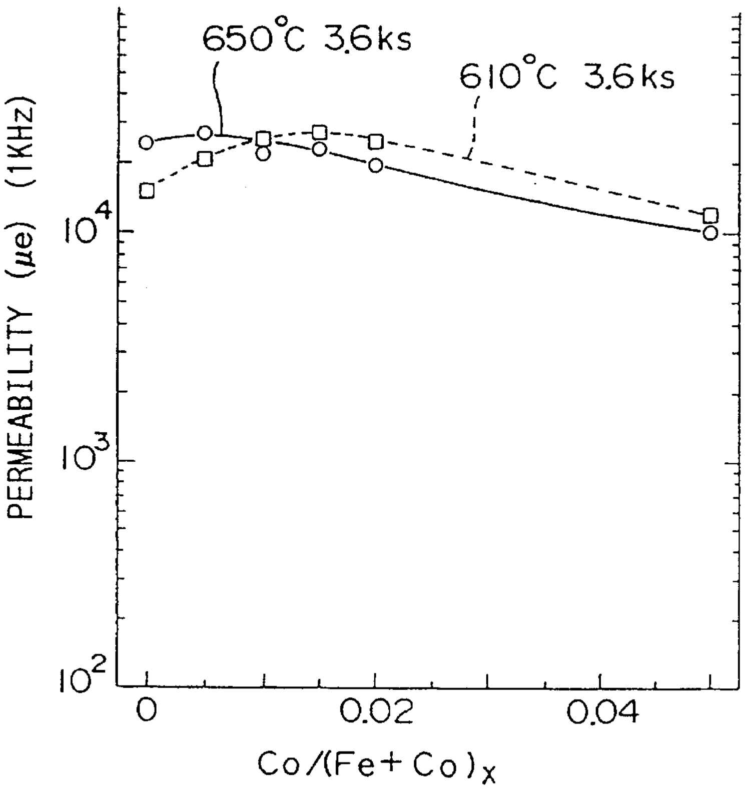

FIG. 34 shows the results of measurements conducted to study how changes in the proportion of Co in an alloy sample having a composition expressed by $(Fe_{1-x} Co_x)_{90} Zr_7 B_3$ affect permeability (μe), magnetostriction (λs) and saturation magnetization (Bs). The measurements were conducted under the same conditions as those of the measurements conducted in the previous examples.

It can be seen from the results shown in FIG. 34 that permeability of 20000 or above can be obtained when the proportion of Co (a) is between 0.005 and 0.03. Saturation magnetization remains at a high value from 16.4 kG to 17 kG when the proportion of Co is changed.

Magnetostriction varies in a range between $-1\times10^{-8}$ and $+3\times10^{-6}$ according to changes in the proportion of Co. It is therefore apparent that magnetostriction can be adjusted by selecting an adequate composition which is achieved by replacing part of the Fe with Co. Thus, magnetostriction adjustment can take into consideration the influence that the pressure applied during resin molding has on magnetostriction.

EXAMPLE 18

Figure 35:
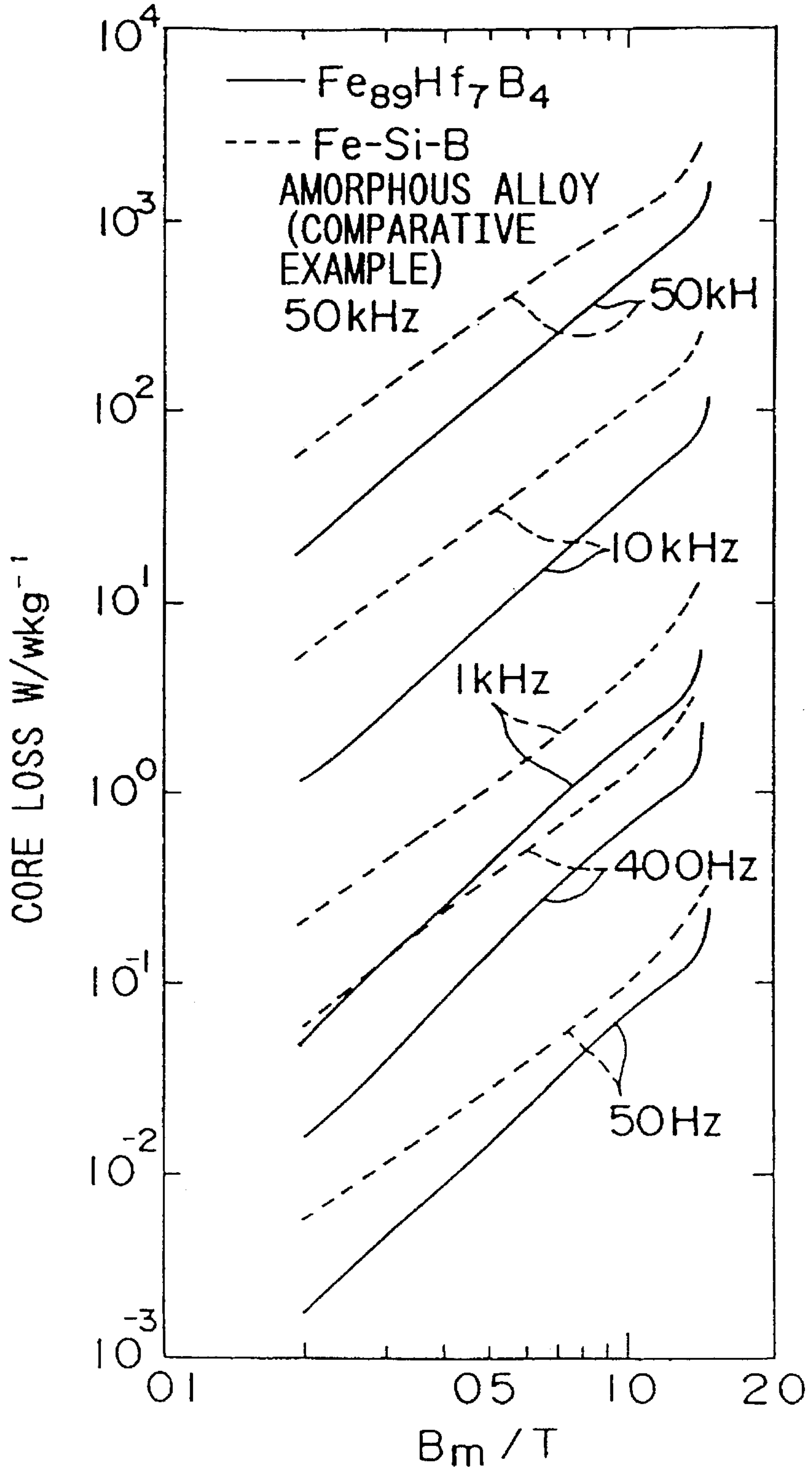
FIG. 35 shows the relationship between the core loss and the heat treating temperature in an alloy according to the present invention.

FIG. 35 shows measurements of core loss in a $Fe_9 Hf_7 B_4$ alloy according to the present invention and in a Fe—Si—B amorphous alloy of a comparative example. Core loss was measured by supplying a sinosoidal current to a wire coiled on a ring-shaped sample in the sin B mode in which Fourier transform is conducted on the measured value.

It is apparent from the results shown in FIG. 35 that the alloy according to the present invention has a core loss less than that of the amorphous alloy of the comparative example at all frequencies including 50 Hz, 400 Hz, 1 kHz, 10 kHz and 50 kHz.

EXAMPLE 19

We manufactured various alloy samples according to the present invention, and examined the relation between the temperature increasing rates during manufacture of such samples and the permeabilities of the manufactured samples. The results of the measurements are shown in FIGS. 36 through 39.

Figure 36:
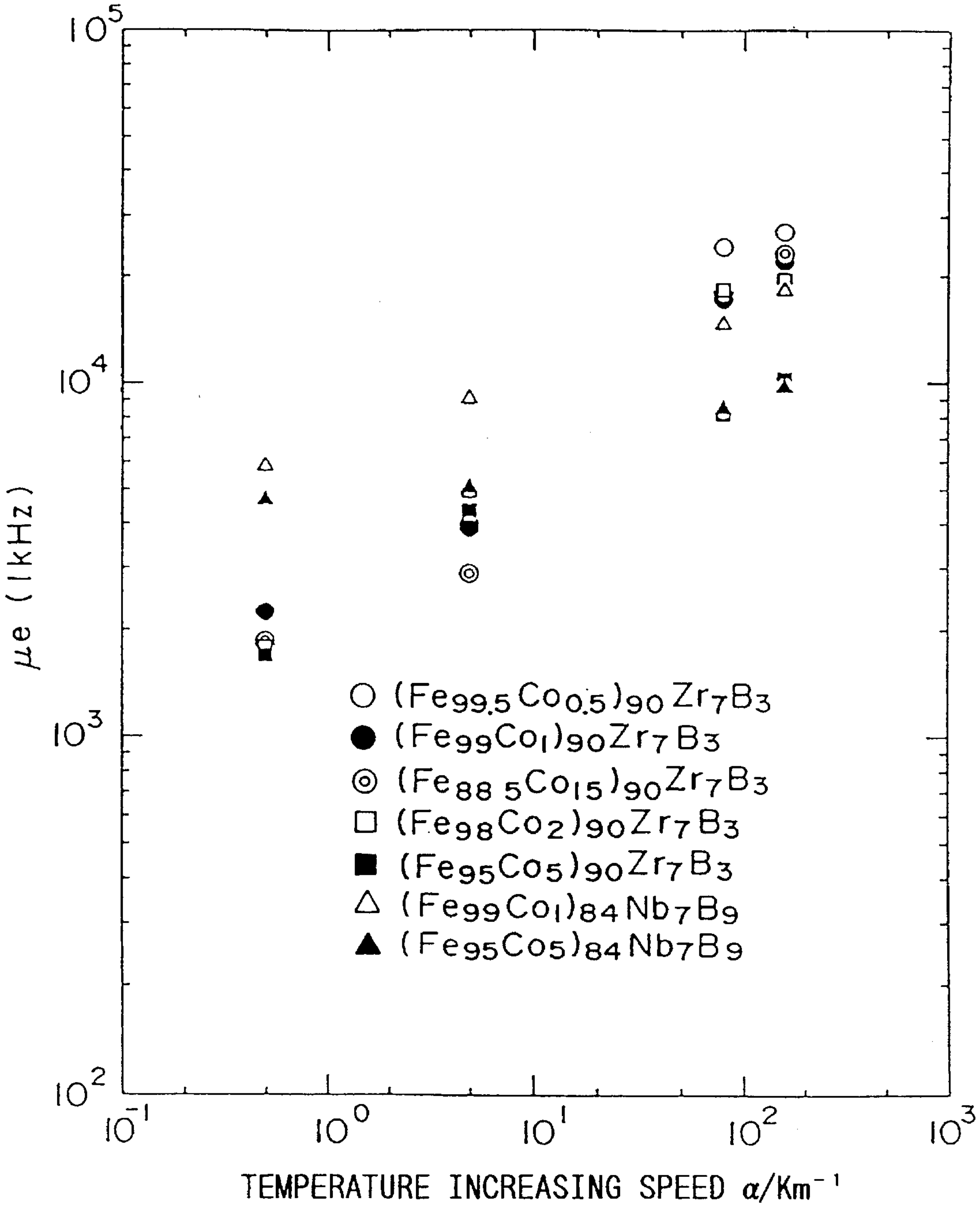
FIG. 36 shows the relationship between the heating rate and the permeability in examples of the alloy according to the present invention.
Figure 37:
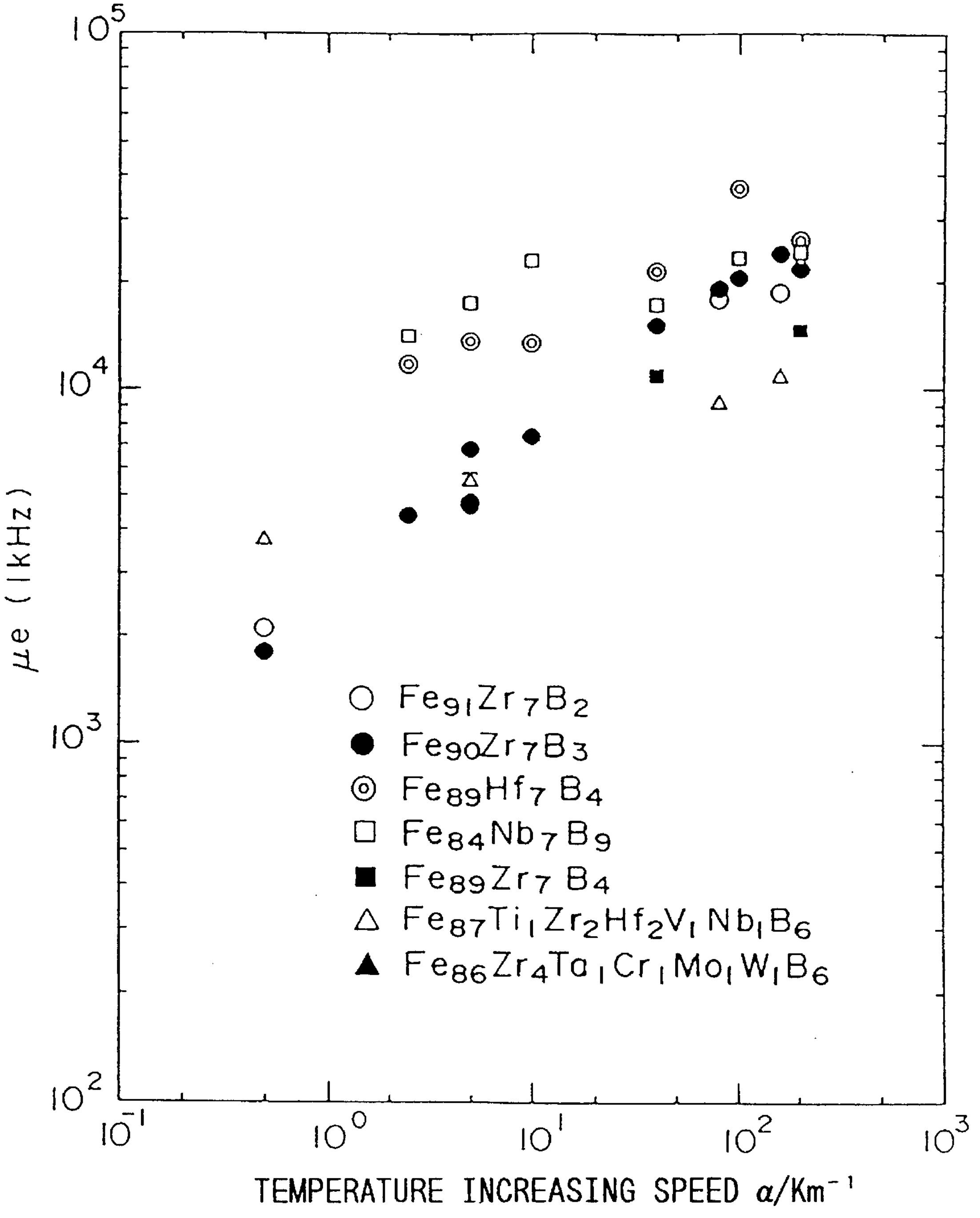
FIG. 37 shows the relationship between the heating rate and the permeability in another examples of the alloy according to the present invention.
Figure 38:
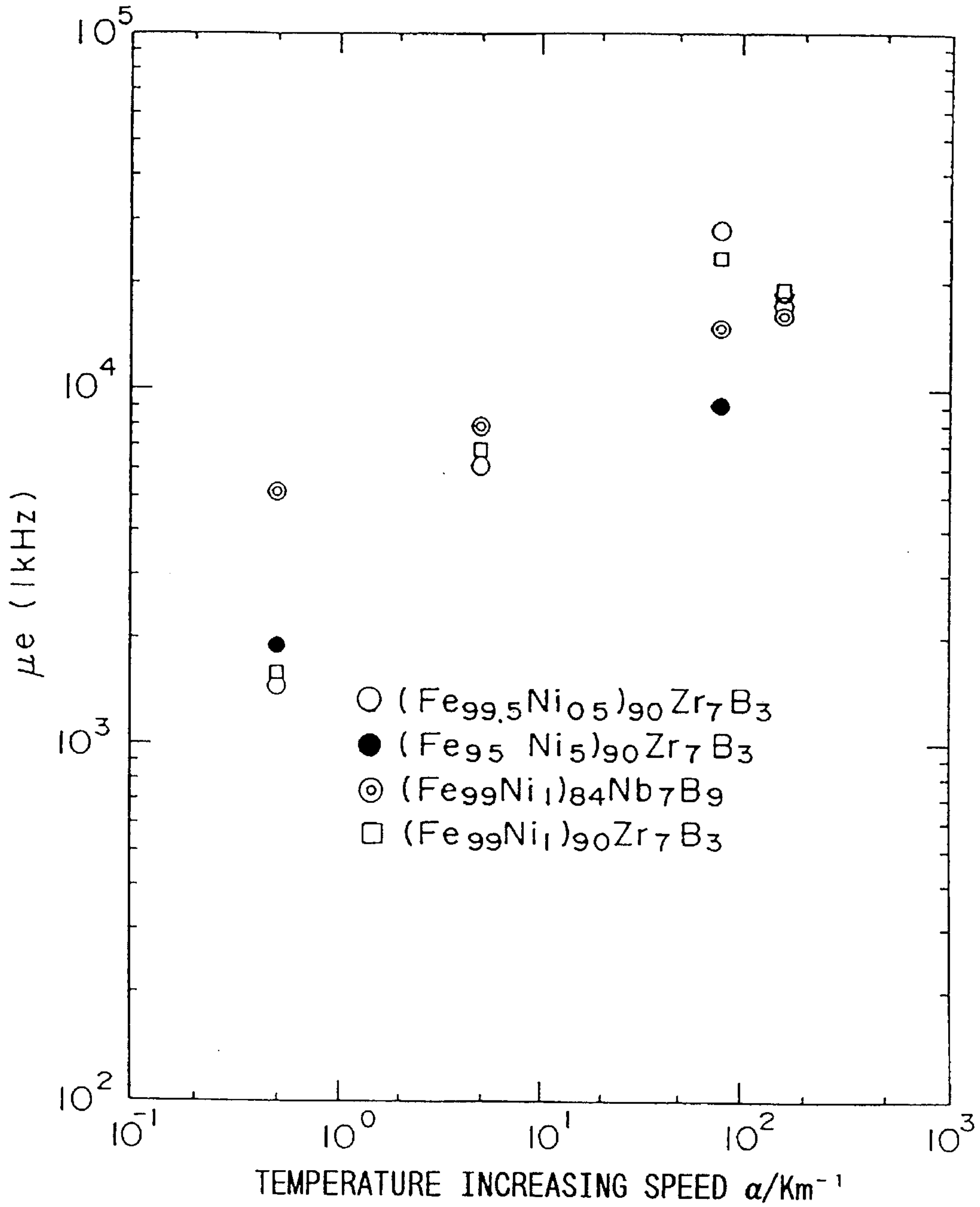
FIG. 38 shows the relationship between the heating rate and the permeability in still another examples of the alloy according to the present invention.
Figure 39:
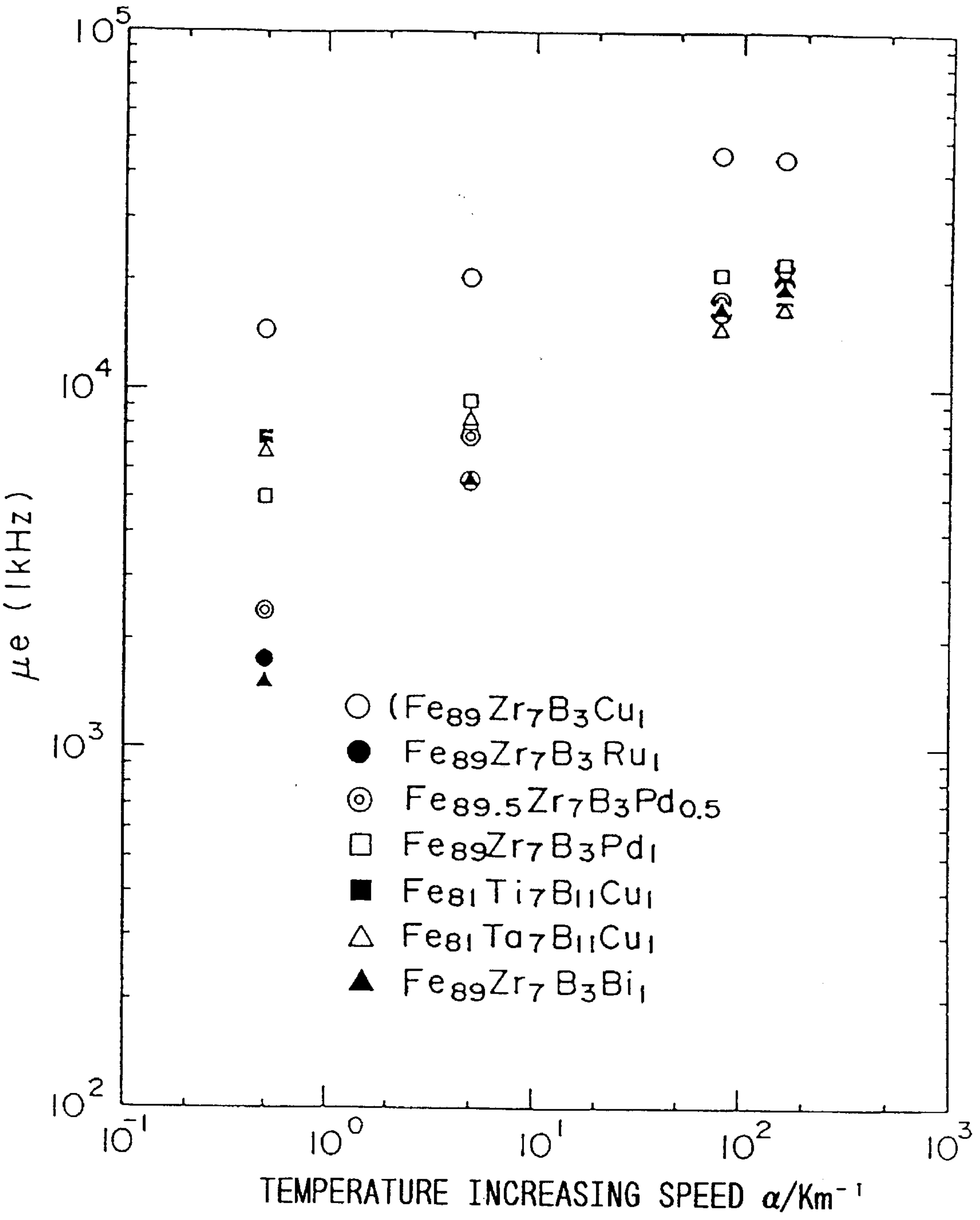
FIG. 39 shows the relationship between the heating rate and the permeability in still another examples of the alloy according to the present invention.

FIG. 36 is a graph showing the relation between the heating rate employed to manufacture a plurality of samples selected from the samples shown in Table 2 and the permeability thereof. FIG. 37 shows the results of the similar measurements conducted on the samples shown in Table 3. FIG. 38 shows the results of the similar measurements conducted on the samples shown in Table 4. FIG. 39 shows the results of the similar measurements conducted on the samples shown in Table 5.

It is clear from the results shown in FIGS. 36 through 39 that for each of the alloys according to the present invention, increasing the heating rate improves permeability.

EXAMPLE 20

Figure 40:
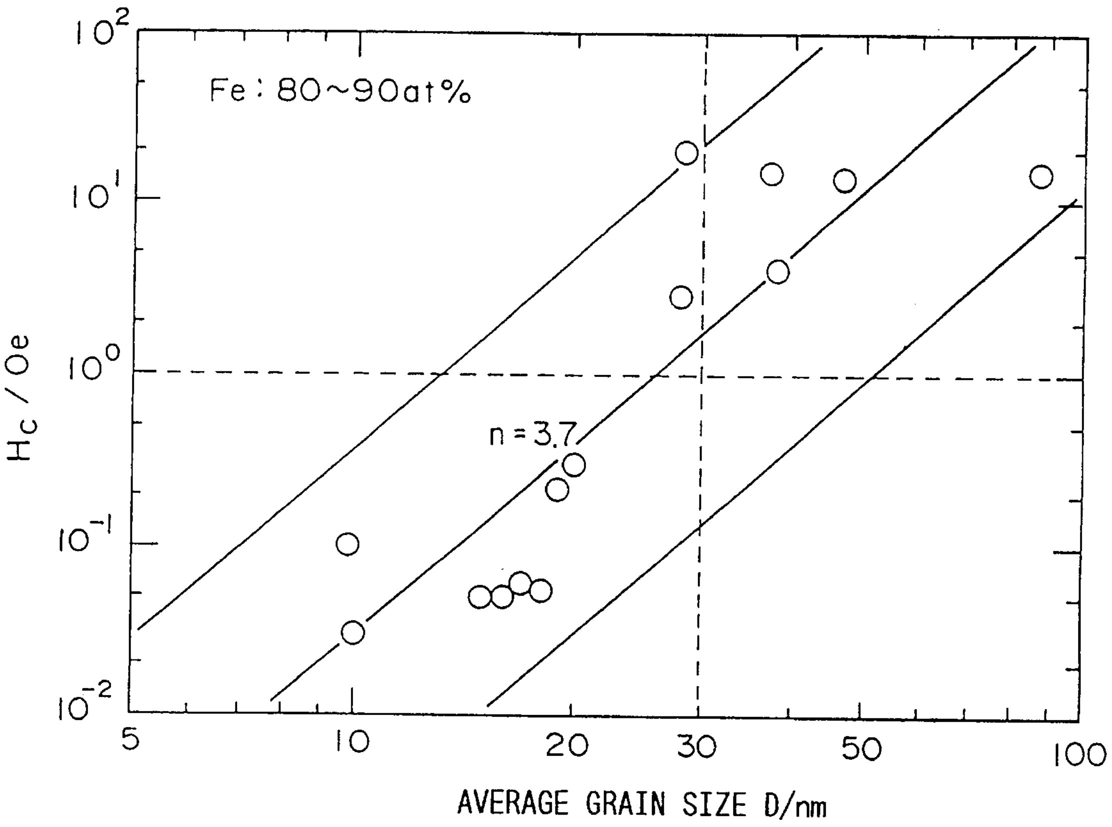
FIG. 40 shows the relationship between the average grain size and the coercive force in an alloy according to the present invention.

FIG. 40 shows the relation between the average grain size of the samples having compositions shown in Table 17 and the coercive force thereof.

TABLE 17

| Alloy composition (atm %) | Average grain size (nm) | Coercive force (Oe) |
|---|---|---|
| $Fe_{84}Nb_7B_9$ | 10 | 0.1 |
| $Fe_{86}Zr_7B_6Cu_1$ | 10 | 0.03 |
| $Fe_{89}Hf_7B_4$ | 15 | 0.07 |
| $(Fe_{0.99}Co_{0.01})_{90}Zr_7B_3$ | 15 | 0.07 |
| $Fe_{91}Zr_7B_2$ | 18 | 0.09 |
| $Fe_{86}B_{14}$ | 28.8 | 4.0 |
| $Fe_{79}Cr_7B_{14}$ | 37.2 | 15.0 |
| $Fe_{78}V_7B_{14}$ | 46.9 | 13.8 |
| $Fe_{83}W_7B_{10}$ | 87.2 | 14.9 |

It is clear from the results shown in FIG. 40 that a low coercive force can be obtained by making the average grain size 30 nm or below.

Attempts have been made by the present inventors to improve magnetic characteristics by improving the heat treatment process of the alloy and thereby obtaining finer grains. According to the theory of crystallization of amorphous alloys (theory of nucleation and growth), fine grains are obtained when the nucleation speed is high and the nucleus growing speed is low. Normally, the nucleation speed and the nucleus growth speed are the function of temperature, and the above-mentioned conditions are accomplished by retaining the alloy at low temperatures for a long time. From this knowledge may be devised a technique of elongating the heat treating time at low temperature regions which is achieved by reducing the heating rate.

However, the present inventors considered increasing the heating rate, which is contrary to the above-described commonly accepted idea, as shown in the following example.

EXAMPLE 21

Figure 41:
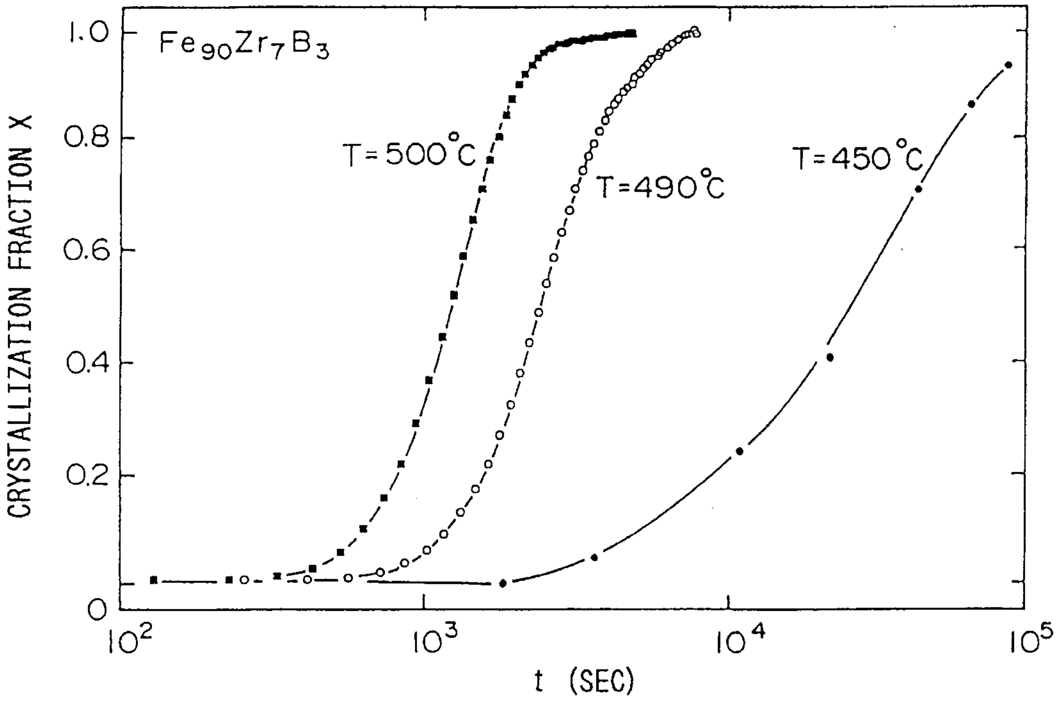
FIG. 41 shows the crystallization fraction in an alloy according to the present invention.

FIG. 41 shows the relation between the time t it takes for a sample having a composition of $Fe_{90}$ $Zr_7$ $B_3$ to be crystallized at a fixed temperature of T and the crystallization fraction (crystal volume fraction).

The time t represented by the abscissa axis of FIG. 41 will be explained. It is known that the crystal volume fraction x and the time t have the relation expressed by the following equation, known as JMA (Johnson-Mehl-Avrami).

$$x=1-\exp(-kt^n)$$

where an exponent n is a variable which differs according to the crystal precipitating mechanism.

Figure 42:
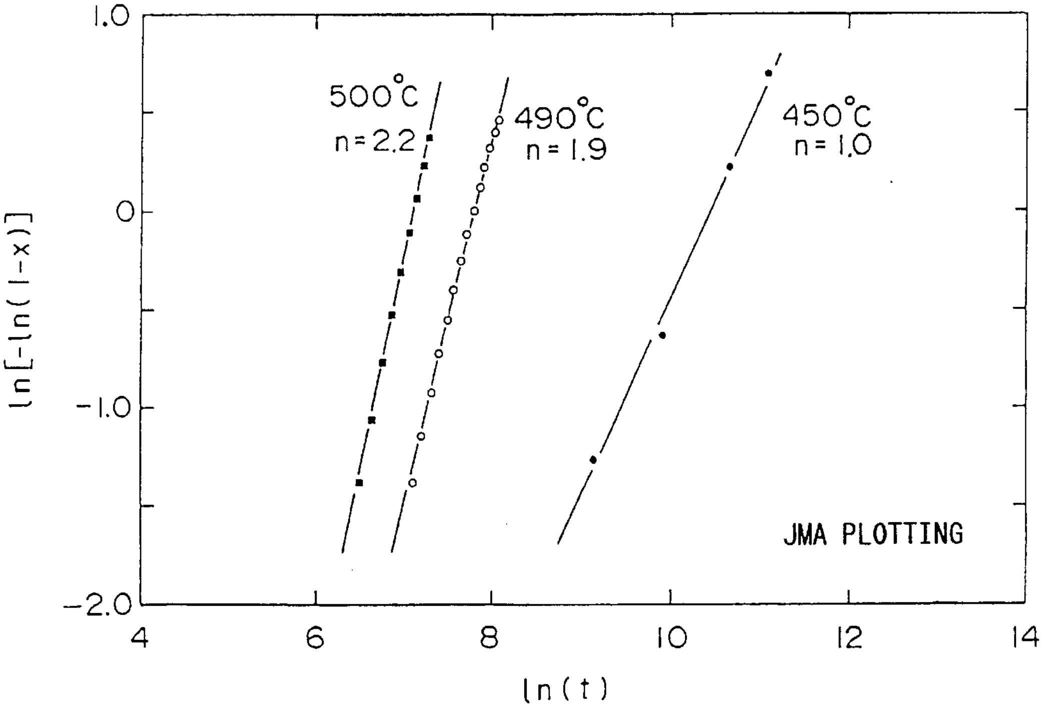
FIG. 42 shows a JMA plot of the alloy shown in FIG. 41.

The logarithms of the crystal fractions shown in FIG. 41 are plotted in FIG. 42 on the basis of the above-described relation. Obtaining the relation shown in FIG. 42 is called JMA plotting. In FIG. 42, an increase in n means that the number of crystal grains has increased and the orientation of the nuclei has become three-dimensional. According to the normally employed crystal growth mechanism for amorphous substances, the grain size is increased by increasing the heating rate.

It is known that n is from 1.5 to 3 when spherical precipitate is uniformly produced. When the alloy is crystallized at 490° C. or above in FIG. 42, n becomes 1.9 to 2.2, which means that a substantially uniform bbc phase has precipitated. When the alloy is crystallized at a low temperature of 450° C., n becomes 1.0, which implies that the precipitated bcc phase is non-uniform. It is thus clear from the results shown in FIG. 42 that in order to obtain uniform fine grains, crystallization at a higher temperature is effective. Since the crystallization temperature of the amorphous alloy is usually raised in proportion to the heating rate, uniform fine structure is expected from raising the heating rate.

Figure 43:
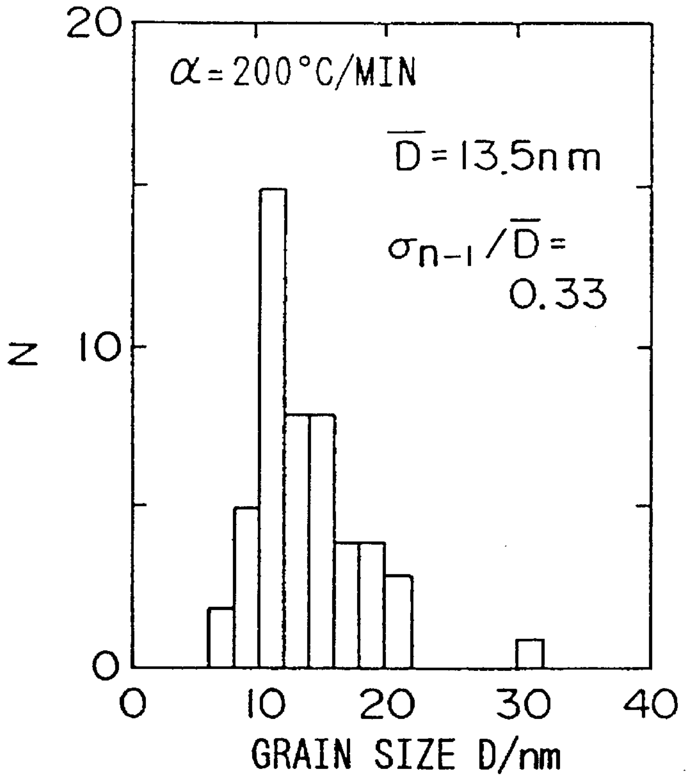
FIG. 43 shows a distribution of grain size in an alloy according to the present invention.

FIG. 43 shows the measurement results of the grain size of the $Fe_{90}$ $Zr_7$ $B_3$ alloy sample according to the present invention obtained at a heating rate $\alpha$=200 ° C./min.

Figure 44:
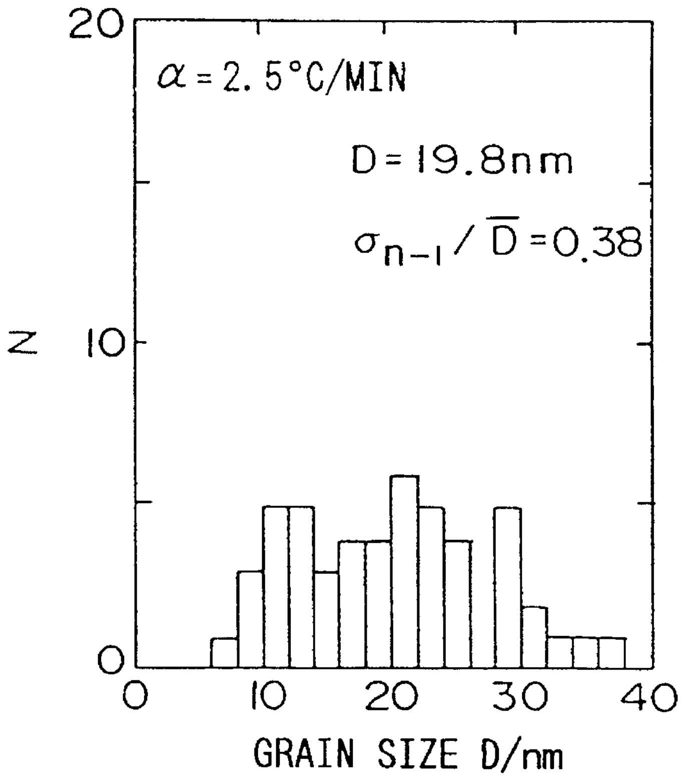
FIG. 44 shows a distribution of grain size in an alloy of Comparative Example.

FIG. 44 shows the measurement results of the grain size of the alloy sample having the same composition as that shown in FIG. 43, obtained at a heating rate $\alpha$=2.5° C./min, which is lower than that employed in FIG. 43.

As can be seen from the grain size distribution of the bcc phase shown in FIGS. 43 and 44, whereas the sample obtained at a heating rate of 200° C./min has a small average grain size and a grain size distribution is sharp and concentrated on a small grain size range, the sample treated at a heating rate of 2.5° C./min has a large average grain size and a broad grain size distribution.

As will be understood from the foregoing description, it is apparent that in the alloy according to the present invention, a small average grain size is obtained by increasing the heating rate, which is contrary to a commonly accepted idea.

EXAMPLE 22

Figure 45:
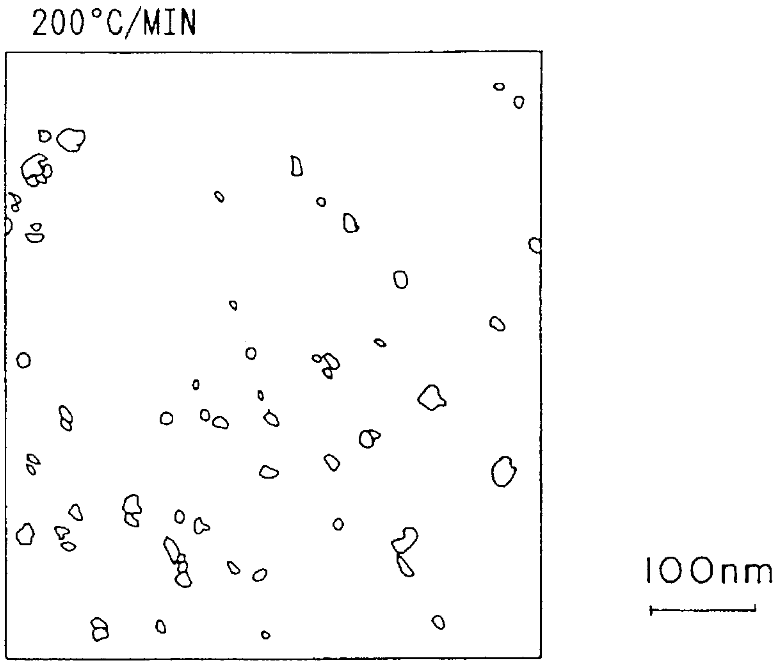
FIG. 45 is a schematic view of a photograph showing the results of the test conducted to specify the grain size in a microscopic photograph which shows the grains of the alloy heat treated at a heating rate of 200° C./min according to the present invention.
Figure 46:
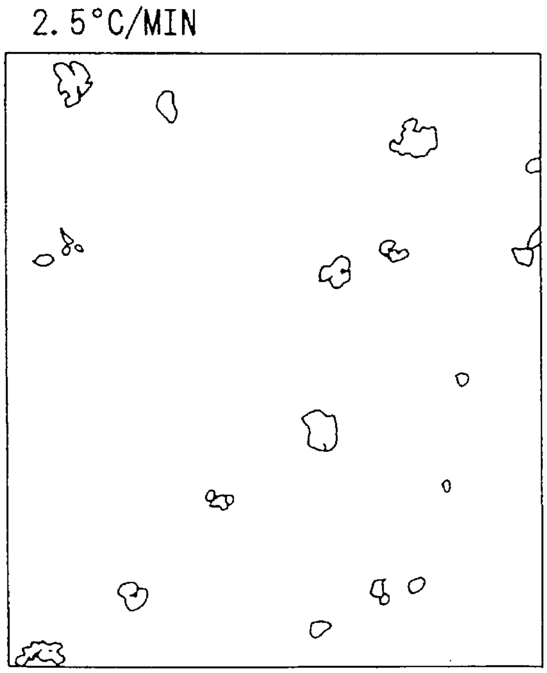
FIG. 46 is a schematic view of a photograph showing the results of the test conducted to specify the grain size in a microscopic photograph which shows the grains of the alloy heat treated at a heating rate of 2.5° C./min according to the present invention.

FIGS. 45 and 46 show the structures of the $Fe_{90}$ $Zr_7$ $B_3$ amorphous alloys obtained using a transmission type electronic microscope to examine the grain size of the alloy structure.

In the results shown in FIGS. 45 and 46, only special crystals are shown, because the structure was observed in a dark-field image. However, the entire structure is composed of the similar crystals.

It is apparent from the results shown in FIGS. 45 and 46 that the alloy structure obtained at a higher heating rate has finer grains than that of the alloy structure obtained at a lower heating rate.

EXAMPLE 23

The present inventors manufactured the samples having compositions shown in Table 18 and conducted corrosion resistance test on them under the conditions of 40° to 60° C. and 96% RH for 96 hours. In Table 18, the samples which did not corrode are indicated by o, those which corroded at 1% of the entire area or less are indicated by Δ, and those which corroded at 1% of the entire area or more are indicated by x.

TABLE 18

| Alloy composition (atm %) | Permeability μ | Corroded state |
|---|---|---|
| $Fe_{89}Zr_7B_3Ru_1$ | 19800 | Δ |
| $Fe_{82.5}Zr_4Nb_3B_{6.5}Cu_1Ru_3$ | 24000 | o |
| $Fe_{84.5}Zr_7B_5Cu_1Cr_{0.5}Ru_2$ | 28000 | o |

TABLE 18-continued

| Alloy composition (atm %) | Permeability μ | Corroded state |
|---|---|---|
| $Fe_{85}Zr_{3.5}Nb_{3.5}B_7Cu_1$ (Comparative example) | 32000 | x |
| $Fe_{80}Zr_7B_6Cu_1Cr_8$ (Comparative example) | 800 | o |

As can be seen from Table 18, the samples according to the present invention exhibited excellent corrosion resistance. It became clear from the results of the test that the addition of 5 atomic percentage or below of Ru and Cr improves corrosion resistance of the alloy according to the present invention without deteriorating the magnetic characteristics.

EXAMPLE 24

Regarding the amorphous alloy samples having compositions shown in Table 20, the measurement results of core loss, magnetostriction (λs) and specific electric resistance (ρ) are shown in Table 20. The thickness (t) of each of the samples is also shown in Table 20. Measurements were conducted on the samples according to the present invention at a heating rate of 80° to 100° C./min and at a heat treating temperature of 650° C. The temperature at which heat treatment was conducted on Fe—Si—B amorphous alloy was 370° C.

TABLE 19

| Structure | $Fe_{90}Zr_7B_3$ bcc | $Fe_{89}Hf_7B_4$ bcc | $Fe_{84}Nb_7B_9$ bcc | Fe—Si—B Amorphous alloy Amorphous |
|---|---|---|---|---|
| $^{w}14/50^{a}$ (w/kg) | 0.21 | 0.14 | 0.19 | 0.24 |
| $^{w}10/400^{a}$ (w/kg) | 0.82 | 0.61 | 0.97 | 1.22 |
| $^{w}10/1\ k^{a}$ (w/kg) | 2.27 | 1.70 | 2.50 | 3.72 |
| $^{w}2/100\ k^{a}$ (w/kg) | 79.7 | 59.0 | 75.7 | 1.68 |
| $\lambda_s \times 10^6$ | $-1._1$ | $-1._2$ | $0._1$ | 27 |
| $\rho \times 10^8$ (Ωm) | 44 | 48 | 58 | 137 |
| t (μm) | 18 | 17 | 22 | 20 |

$^{a}w_{\alpha/\beta}$: Core loss ($\alpha \times 10^{-1}$ T and β Hz)
$^{b}f$ = 1 kHz, Hm = 5 mOe It is clear from Table 19 that the core loss, magnetostriction and specific resistance of the alloy samples according to the present invention are all lower than those of the Fe—Si—B amorphous alloy of Comparative Example.

EXAMPLE 25

A core element 19 shown in FIG. 1 was manufactured using the alloy having a composition expressed by $Fe_{84}$ $Nb_7$ $B_9$, and the manufactured core element 19 was incorporated in an electrical circuit 20 to manufacture a noise filter 22 shown in FIG. 47.

The pulse damping characteristics of the noise filter 22 was measured.

To manufacture the magnetic core, a ribbon was manufactured by the single roll method using the alloy having a composition expressed by $Fe_{84}$ $Nb_7$ $B_9$, the obtained ribbon was coiled in a toroidal fashion into a ring-like form, and that toroidal ribbon was heat treated.

The width of the ribbon was 15 mm, and the thickness thereof was 40 μm. The inner diameter of the annular magnetic core was 10 mm, and the outer diameter thereof was 20 mm.

To measure the pulse attenuation characteristics, the noise filter 22 according to the present invention was It is clear from Table 19 that the core loss, magnetostriction and specific resistance of the amorphous alloy samples according to the present invention are all lower than those of the Fe—Si—B amorphous alloy of Comparative Example.

EXAMPLE 25

A core element 19 shown in FIG. 1 was manufactured using the alloy having a composition expressed by $Fe_{84}$ $Nb_7$ $B_9$, and the manufactured core element 19 was incorporated in an electronic circuit 20 to manufacture a noise filter 22 shown in FIG. 47.

The pulse damping characteristics of the noise filter 22 was measured.

To manufacture the magnetic core, a ribbon was manufactured by the single roll method using the alloy having a composition expressed by $Fe_{84}$ $Nb_7$ $B_9$, the obtained ribbon was coiled in a toroidal fashion into a ring-like form, and that toroidal ribbon was heat treated.

The width of the ribbon was 15 mm, and the thickness thereof was 40 μm. The inner diameter of the annular magnetic core was 10 mm, and the outer diameter thereof was 20 mm.

Figure 48:
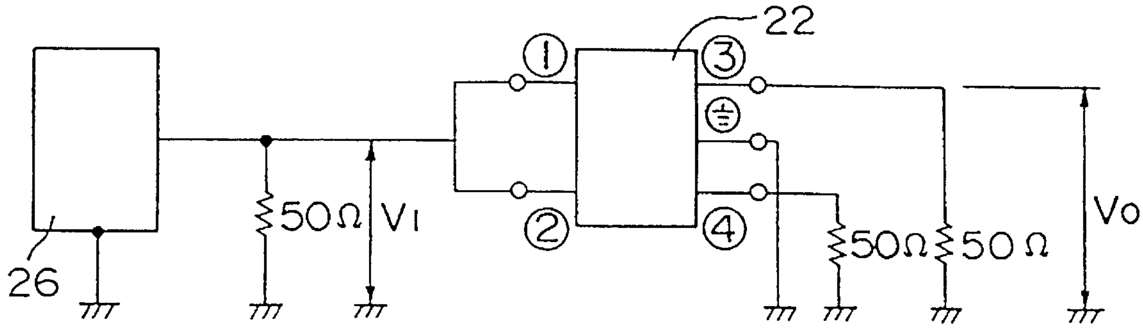
FIG. 48 is a circuit diagram showing a method of measuring the pulse damping characteristics.

To measure the pulse attenuation characteristics, the noise filter 22 according to the present invention was incorporated in a circuit shown in FIG. 48 including a noise simulator 26, and the output voltage of the circuit was measured each time an input voltage having a pulse width of 800 nS was varied by 0.1 KV from 0.1 KV to 2.0 KV.

Measurements were also conducted on Comparative Examples including a conventional magnetic core employing a ferrite and a core employing a Fe-based amorphous alloy.

Figure 49:
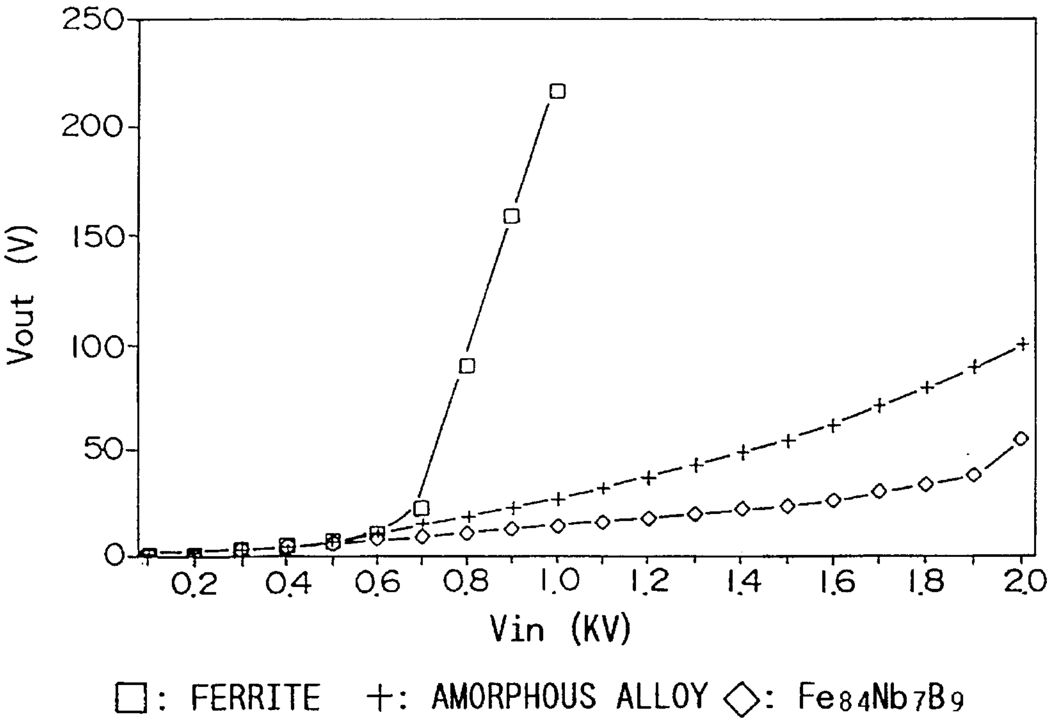
FIG. 49 is a graphic representation showing the results of the pulse attenuation characteristic test.

FIG. 49 shows the results of the measurements. In FIG. 49, the pulse attenuation characteristics of the noise filter employing $Fe_{84}$ $Nb_7$ $B_9$ are shown by -◇-, those of ferrite are shown by -□-, and those of the Fe-based amorphous alloy are shown by -+-.

As can be seen from FIG. 49, whereas the output voltage of the noise filter employing ferrite rapidly increases when the input voltage is about 0.7 KV, that of the noise filter employing $Fe_{84}$ $Nb_7$ $B_9$ remains at 40 V when the input voltage is 2.0 KV. Thus, the noise filter according to the present invention exhibits excellent attenuation characteristics.

The noise filter employing the Fe-based amorphous alloy exhibits better damping characteristics than those of the noise filter employing ferrite but inferior damping characteristics to those of the noise filter according to the present invention.

The noise filter according to the present invention exhibits excellent pulse damping characteristics particularly when the input voltage is high.

EXAMPLE 26

Regarding three types of noise filters manufactured in Example 25, the damping characteristics (static characteristics) in both normal mode and common mode were measured.

Figure 50:
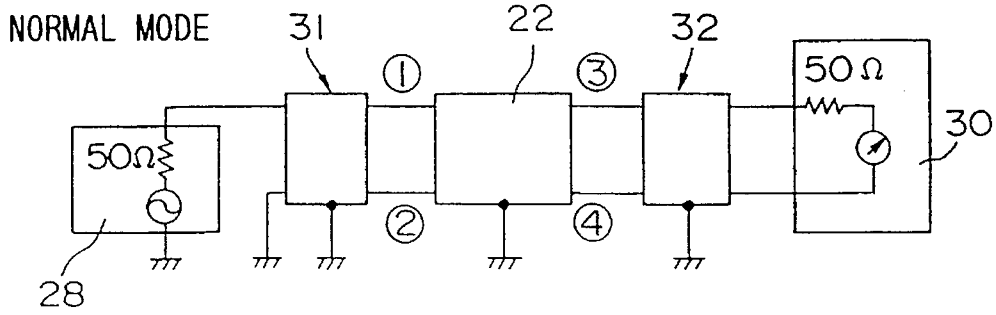
FIG. 50 is a circuit diagram showing a method of measuring the damping characteristics in the normal mode.
Figure 51:
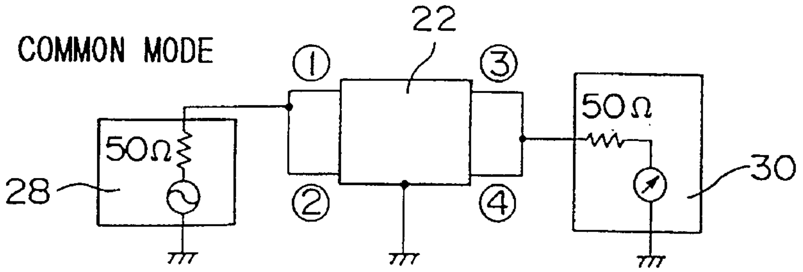
FIG. 51 is a circuit diagram showing a method of measuring the damping characteristics in the common mode.

The measurements in the normal mode are those of the attenuation characteristics of the noise filter incorporated in the circuit shown in FIG. 50 relative to the wavelength, and the measurements in the common mode are those of the damping characteristics of the noise filter incorporated in the circuit shown in FIG. 51 relative to the wavelength. In FIGS. 50 and 51, reference numeral 28 denotes a tracking generator. Reference numeral 30 denotes a spectrum analyzer. Reference numerals 31 and 32 respectively denote a balance unbalance transformer which transforms unbalance to balance and a balance-unbalance transformer which transforms balance to unbalance.

Figure 52:
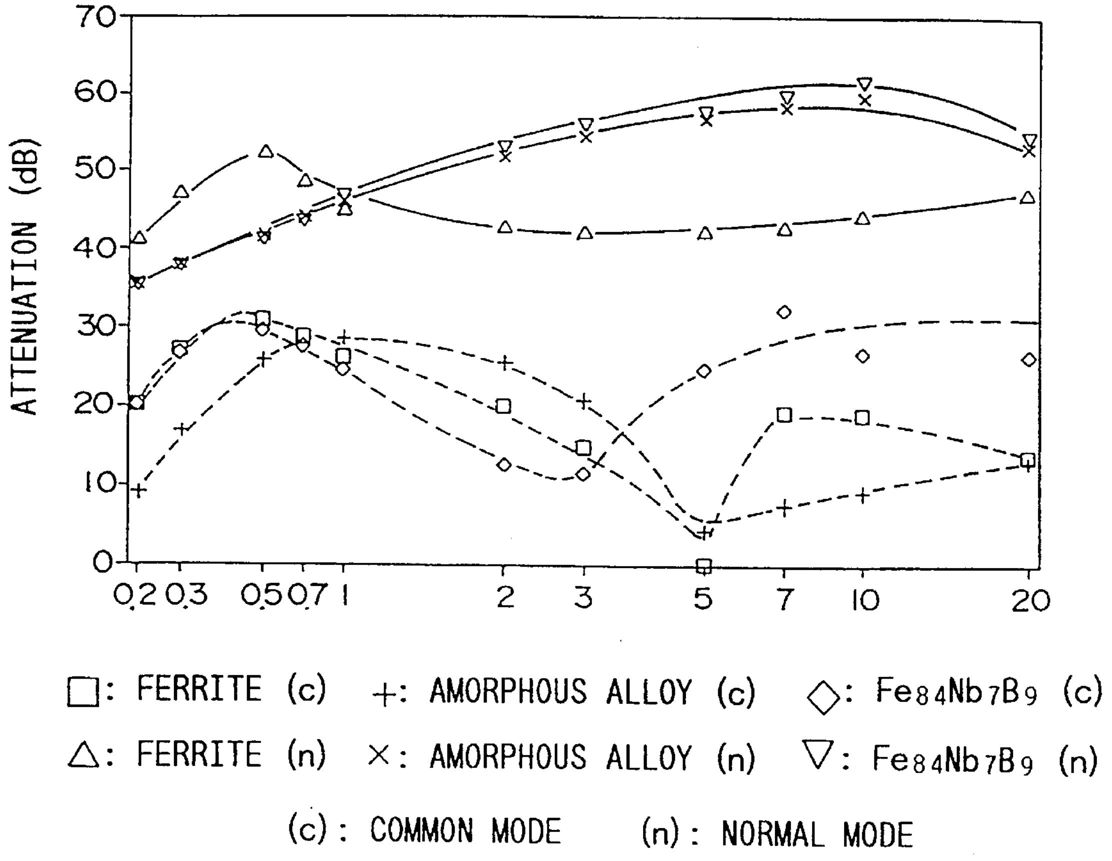
FIG. 52 is a graphic representation showing the results of the attenuation characteristic test.

FIG. 52 shows the results of the measurements. In FIG. 52, the attenuation characteristics of the noise filter employing $Fe_{84}$ $Nb_7$ $B_9$ in the normal mode are indicated by -∇-, those of the noise filter employing ferrite in the normal mode are indicated by -Δ-, and those of the noise filter employing the Fe-based amorphous alloy in the normal mode are indicated by -×-. The attenuation characteristics of the noise filter employing $Fe_{84}$ $Nb_7$ $B_9$ in the common mode are indicated by -◇-, those of the noise filter employing ferrite in the common mode are indicated by -□-, and those of the noise filter employing the Fe-based amorphous alloy in the common mode are indicated by -+-.

As can be seen from FIG. 52, in the normal mode, whereas the noise filter employing ferrite exhibits excellent attenuation characteristics when the frequency is 1 MHz or below, the noise filter employing $Fe_{84}$ $Nb_7$ $B_9$ exhibits excellent attenuation characteristics when the frequency is 1 MHz or above.

In the common mode, the noise filter according to the present invention exhibits similar attenuation characteristics to those of the noise filter employing ferrite when the frequency is 1 MHz or below. When the frequency is 3 MHz or above, the attenuation characteristics of the noise filter according to the present invention are far better than those of the noise filter employing ferrite.

Thus, the noise filter according to the present greatly attenuates high frequency noise.

Generally, a magnetic core of a noise filter for the common mode operation requires a magnetic material having a high permeability, and a magnetic core for a noise filter for the normal mode operation requires high permeability and high saturation magnetization. In the present invention, since the soft magnetic alloy used as the magnetic core exhibits high permeability and high saturation magnetization, the noise filter according to the present invention can thus be applied for both common and normal modes.

As will be understood from the foregoing description, since the noise filter according to the present invention employs, as a magnetic core thereof, a Fe-based soft magnetic alloy exhibiting soft magnetic characteristics as excellent as those of a conventional alloy and exhibiting high permeability and high saturation magnetization, the noise filter exhibits excellent attenuation characteristics and enables the size thereof to be reduced.

Particularly, the noise filter according to the present invention exhibits excellent pulse attenuation characteristics at high input voltages, and excellent damping characteristics at high frequencies.

In the soft magnetic alloy employed in the present invention, permeability can be stably enhanced by performing heat treatment at a heating rate of 1.0° C./min or above.

In the alloy employed in the magnetic core, since both Nb and Ta to be added to the alloy are thermally stable, changes in the properties thereof due to oxidation or reduction during manufacture are less. This is advantageous for manufacture of the magnetic core.

What is claimed is:

1. A noise filter comprising:

an annular magnetic core made of a soft magnetic alloy ribbon consisting of Fe, B and at least one element selected from a group consisting of Ti, Zr, Hf, V, Nb, Ta, Mo, W, Cr, Ru, Rh, Ir, Co and Ni, wherein at least 50% of said soft magnetic alloy ribbon is composed of fine grains of body-centered cubic structure having an average grain size of 30 nm or below;

a casing for accommodating said magnetic core;

a pair of coils separated from each other; and an electrical circuit connecting to a core element made up of said magnetic core, said casing and said coils.

2. A noise filter according to claim 1, wherein an insulating material fixes said magnetic core to said casing.

3. A noise filter according to claim 1, wherein said soft magnetic alloy ribbon has a composition expressed by the following general formula:

$$Fe_b\ B_{My}$$

where M is at least one element selected from a group consisting of Ti, Zr, Hf, V, Nb, Ta, Mo and W combined with Zr and/or Hf, and b, x and y are atomic percentages which respectively satisfy 75<b<93, 0.5<x<10, and 4<y<9.

4. A noise filter according to claim 1, wherein said soft magnetic alloy ribbon has a composition expressed by the following general formula:

$$Fe_b\ B_x\ M_y\ X_u$$

where M is at least one element selected from a group consisting of Ti, Zr, Hf, V, Nb, Ta, Mo and W combined with Zr and/or Hf, X is at least one element selected from a group consisting of Cr, Ru, Rh and Ir, and b, x, y and u are atomic percentages which respectively satisfy 75<b<93, 0.5<x<10, 4<y<9, and u≦5.

5. A noise filter according to claim 1, wherein said soft magnetic alloy ribbon has a composition expressed by the following general formula:

$$(Fe_{1-a}\ Z_a)_b\ B_x\ M_y$$

where Z is Co and/or Ni, M is at least one element selected from a group consisting of Ti, Zr, Hf, V, Nb, Ta, Mo and W combined with Zr and/or Hf, and a, b, x and y are atomic percentages which respectively satisfy a<0.1, 75<b<93, 0.5<x<10, and 4<y<9.

6. A noise filter according to claim 1, wherein said soft magnetic alloy ribbon has a composition expressed by the following general formula:

$$(Fe_{1-a}\ Z_a)_b\ B_x\ M_y\ X_u$$

where Z is Co and/or Ni, M is at least one element selected from a group consisting of Ti, Zr, Hf, V, Nb, Ta, Mo and W combined with Zr and/or Hf, X is at least one element selected from a group consisting of Cr, Ru, Rh and Ir, and a, b, x and y are atomic percentages which respectively satisfy a<0.1, 75<b93, 0.5<x<10, 4<y<9, and u<5.

7. A noise filter according to claim 1, wherein said soft magnetic alloy ribbon has a composition expressed by the following general formula:

$$Fe_b\ B_x\ M'_y$$

where M' is at least one element selected from a group consisting of Ti, V, Nb, Ta, Mo and W combined with Nb, and b, x and y are atomic percentages which respectively satisfy 75<b<93, 6.5<x<10, and 4<y<9.

8. A noise filter according to claim 1, wherein said soft magnetic alloy ribbon has a composition expressed by the following general formula:

$$Fe_b\ B_x\ M'_y\ X_u$$

where M' is at least one element selected from a group consisting of Ti, V, Nb, Ta, Mo and W combined with Nb, X is at least one element selected from a group consisting of Cr, Ru, Rh and Ir, and b, x, y and u are atomic percentages which respectively satisfy 75<b<93, 6.5<x<10, 4<y<9, and u<5.

9. A noise filter according to claim 1, wherein said soft magnetic alloy ribbon has a composition expressed by the following general formula:

$$(Fe_{1-a}\ Z_a)_b\ B_x\ M'_y$$

where Z is Co and/or Ni, M' is at least one element selected from a group consisting of Ti, V, Nb, Ta, Mo and W combined with Nb, and a, b, x and y are atomic percentages which respectively satisfy a<0.1, 75<b<93, 6.5<x<10, and 4<y<9.

10. A noise filter according to claim 1, wherein said soft magnetic alloy ribbon has a composition expressed by the following general formula:

$$(Fe_{1-a}\ Z_a)_b\ B_x\ M'_y\ X_u$$

where Z is Co and/or Ni, M' is at least one element selected from a group consisting of Ti, V, Nb, Ta, Mo and W combined with Nb, X is at least one element selected from a group consisting of Cr, Ru, Rh and Ir, and a, b, x, y and u are atomic percentages which respectively satisfy a<0.1, 75<b<93, 6.5<x<10, 4<y<9, and u<5.

11. A noise filter comprising:

an annular magnetic core made of a soft magnetic alloy ribbon consisting of Fe, B, and at least one element selected from a group consisting of Ti, Zr, Hf, V, Nb, Ta, Mo, W, Cr, Ru, Rh, Ir, Co, Ni, Cu, Ag, Au, Pd, Pt and Bi, wherein at least 50% of said soft magnetic alloy ribbon is composed of fine grains of body-centered cubic structure having an average grain size of 30 nm or below, and wherein the soft magnetic alloy ribbon is wound in a plurality of layers such that surfaces of adjacent layers are in direct contact;

a casing for accommodating said magnetic core;

a pair of coils separated from each other; and an electrical circuit connecting to a core element made up of said magnetic core, said casing and said coils.

12. A noise filter according to claim 11, wherein said soft magnetic alloy ribbon has a composition expressed by the following general formula:

$$Fe_b\ B_x\ M_y\ T_z$$

where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, and b, x, y and z are atomic percentages which respectively satisfy 75<b<93, 0.5 <x18, 4<y<10, and z<4.5.

13. A noise filter according to claim 12, wherein 0.2<z<4.5.

14. A noise filter according to claim 11, wherein said soft magnetic alloy ribbon has a composition expressed by the following general formula:

$$Fe_b\ B_x\ M_y\ T{=}X_u$$

where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and Ir, and b, x, y, z and u are atomic percentages which respectively satisfy 75<b<93, 0.5<x18, 4<y<10, z<4.5, and u<5.

15. A noise filter according to claim 14, wherein 0.2<z<4.5.

16. A noise filter according to claim 11, wherein said soft magnetic alloy ribbon has a composition expressed by the following general formula:

$$(Fe_{1-a}\ Z_a)_b\ B_x\ M_y\ T_z$$

where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, and a, b, x, y and z are atomic percentages which respectively satisfy a<0.1, 75<b<93, 0.5<x<18, 4<y<10, and z<4.5.

17. A noise filter according to claim 16, wherein 0.2<z<4.5.

18. A noise filter according to claim 11, wherein said soft magnetic alloy ribbon has a composition expressed by the following general formula:

$$(Fe_{1-a}\ Z_a)_b\ B_x\ M_y\ T_z\ X_u$$

where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and Ir, and a, b, x, y, z and u are atomic percentages which respectively satisfy a<0.1, 75<b<93, 0.5<x<18, 4<y<10, z<4.5 and u<5.

19. A noise filter according to claim 18, wherein 0.2<z<4.5.

20. A noise filter according to claim 11, wherein said soft magnetic alloy ribbon has a composition expressed by the following general formula:

$$Fe_b\ B_x\ M'_y\ T_z$$

where M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, and b, x, y and z are atomic percentages which respectively satisfy 75<b<93, 6.5<x<18, 4<y<10, and z<4.5.

21. A noise filter according to claim 20, wherein 0.2<z<4.5.

22. A noise filter according to claim 11, wherein said soft magnetic alloy ribbon has a composition expressed by the following general formula:

$$Fe_b\ B_x\ M'_y\ T_z\ X_u$$

where M' is at least one element selected from a group consisting of Ti, V, Nb, Ta, Mo and W combine with any of Ti, Nb and Ta, T is at least one element selected from a group consisting of Cu, Ag, Au, Pd, Pt and Bi, X is at least one element selected from a group consisting of Cr, Ru, Rh and Ir, and b, x, y, z and u are atomic percentages which respectively satisfy 75<b<93, 6.5<x<18, 4<y<10, z<4.5, and u<5.

23. A noise filter according to claim 22, wherein 0.2<z<4.5.

24. A noise filter according to claim 11, wherein said soft magnetic alloy ribbon has a composition expressed by the following general formula:

$$(Fe_{1-a} Z_a)_b B_x M'_y T_z$$

where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, and a, b, x, y and z are atomic percentages which respectively satisfy a<0.1, 75<b<93, 6.5<x<18, 4<y<10, and z<4.5.

25. A noise filter according to claim 24, wherein 0.2<z<4.5.

26. A noise filter according to claim 11, wherein said soft magnetic alloy ribbon has a composition expressed by the following general formula:

$$(Fe_{1-a} Z_a)_b B_x M'_y T_z X_u$$

where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, X is at least one element selected from a group consisting of Cr, Ru, Rh and Ir, and a, b, x, y, z and u are atomic percentages which respectively satisfy a<0.1, 75<b<93, 6.5<x18, 4<y<10, z<4.5, and u<5.

27. A noise filter according to claim 26, wherein 0.2<z<4.5.

28. A magnetic core comprising a soft magnetic alloy ribbon consisting of Fe, B and at least one element selected from a group consisting of Ti, Zr, Hf, V, Nb, Ta, Mo, W, Cr, Ru, Rh, Ir, Co and Ni, wherein at least 50% of said soft magnetic alloy ribbon is composed of fine grains of body-centered cubic structure having an average grain size of 30 nm or below.

29. The magnetic core of claim 28, wherein said soft magnetic alloy ribbon has a composition expressed by the following general formula:

$$Fe_b B_x M_y X_u$$

where M is at least one element selected from a group consisting of Ti, Zr, Hf, V, Nb, Ta, Mo and W combined with Zr and/or Hf, X is at least one element selected from a group consisting of Cr, Ru, Rh and Ir, and b, x, y and u are atomic percentages which respectively satisfy 75<b<93, 0.5<x5 10, 4<y<9, and u<5.

30. The magnetic core of claim 28, wherein said soft magnetic alloy ribbon has a composition expressed by the following general formula:

$$(Fe_{1-a} Z_a)_b B_x M_y$$

where Z is Co and/or Ni, M is at least one element selected from a group consisting of Ti, Zr, Hf, V, Nb, Ta, Mo and W combined with Zr and/or Hf, and a, b, x and y are atomic percentages which respectively satisfy a<0.1, 75<b<93, 0.5<x<10, and 4<y<9.

31. The magnetic core of claim 28, wherein said soft magnetic alloy ribbon has a composition expressed by the following general formula:

$$(Fe_{1-a} Z_a)_b B_x M_y X_u$$

where Z is Co and/or Ni, M is at least one element selected from a group consisting of Ti, Zr, Hf, V, Nb, Ta, Mo and W combined with Zr and/or Hf, X is at least one element selected from a group consisting of Cr, Ru, Rh and Ir, and a, b, x and y are atomic percentages which respectively satisfy a<0.1, 75<b<93, 0.5<x<10, 4<y<9, and u<5.

32. The magnetic core of claim 28, wherein said soft magnetic alloy ribbon has a composition expressed by the following general formula:

$$Fe_b B_x M'_y$$

where M' is at least one element selected from a group consisting of Ti, V, Nb, Ta, Mo and W combined with Nb, and b, x and y are atomic percentages which respectively satisfy 75<b<93, 6.5<x<10, and 4<y<9.

33. The magnetic core of claim 28, wherein said soft magnetic alloy ribbon has a composition expressed by the following general formula:

$$Fe_b B_x M'_y X_u$$

where M' is at least one element selected from a group consisting of Ti, V, Nb, Ta, Mo and W combined with Nb, X is at least one element selected from a group consisting of Cr, Ru, Rh and Ir, and b, x, y and u are atomic percentages which respectively satisfy 75<b<93, 6.5<x<10, 4<y<9, and u<5.

34. The magnetic core of claim 28, wherein said soft magnetic alloy ribbon has a composition expressed by the following general formula:

$$(Fe_{1-a} Z_a)_b B_x M'_y$$

where Z is Co and/or Ni, M' is at least one element selected from a group consisting of Ti, V, Nb, Ta, Mo and W combined with Nb, and a, b, x and y are atomic percentages which respectively satisfy a<0.1, 75<b93, 6.5<x10, and 4<9.

35. The magnetic core of claim 28, wherein said soft magnetic alloy ribbon has a composition expressed by the following general formula:

$$(Fe_{1-a} Z_a)_b B_x M'_y X_u$$

where Z is Co and/or Ni, M' is at least one element selected from a group consisting of Ti, V, Nb, Ta, Mo and W combined with Nb, X is at least one element selected from a group consisting of Cr, Ru, Rh and Ir, and a, b, x, y and u are atomic percentages which respectively satisfy a<0.1, 75<b93, 6.5<x10, 4<y<9, and u<5.

36. The magnetic core of claim 28, wherein said soft magnetic alloy ribbon has a composition expressed by the general formula:

$$Feb B_x M_y$$

where M is at least one element selected from a group consisting of Ti, Zr, Hf, V, Nb, Ta, Mo and W combined with Zr and/or Hf, and b, x and y are atomic percentages which respectively satisfy 75<b<93, 0.5<x<10, and 4<y<9.

37. A magnetic core comprising a soft magnetic alloy ribbon consisting of Fe, B, and at least one element selected from a group consisting of Ti, Zr, Hf, V, Nb, Ta, Mo, W, Cr, Ru, Rh, Ir, Co, Ni, Cu, Ag, Au, Pd, Pt and Bi, wherein at least 50% of said soft magnetic alloy ribbon is composed of fine grains of body-centered cubic structure having an average grain size of 30 nm or below, and wherein the soft magnetic alloy ribbon is wound in a plurality of layers such that surfaces of adjacent layers are in direct contact.

38. The magnetic core of claim 37, wherein said soft magnetic alloy ribbon has a composition expressed by the following general formula:

$$Fe_b B_x M_y T_z X_u$$

where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and Ir, and b, x, y, z and u are atomic percentages which respectively satisfy $75<b<93$, $0.5<x<18$, $4<y<10$, $z<4.5$, and $u<5$.

39. The magnetic core of claim 38, wherein $0.2<z<4.5$.

40. The magnetic core of claim 37, wherein said soft magnetic alloy ribbon has a composition expressed by the following general formula:

$$(Fe_{1-a} Z_a)_b B_x M_y T_z$$

where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, and a, b, x, y and z are atomic percentages which respectively satisfy $a<0.1$, $75<b<93$, $0.5<x18$, $4<y<10$, and $z4.5$.

41. The magnetic core of claim 40, wherein $0.2<z<4.5$.

42. The magnetic core of claim 37, wherein said soft magnetic alloy ribbon has a composition expressed by the following general formula:

$$(Fe_{1-a} Z_a)_b B_x M_y T_z X_u$$

where Z is Co and/or Ni, M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, X is at least one element selected from a group consisting of Cr, Ru, Rh and Ir, and a, b, x, y, z and u are atomic percentages which respectively satisfy $a<0.1$, $75<b<93$, $0.5<x18$, $4<y<10$, $z<4.5$ and $u<5$.

43. The magnetic core of claim 42, wherein $0.2<z<4.5$.

44. The magnetic core of claim 37, wherein said soft magnetic alloy ribbon has a composition expressed by the following general formula:

$$Fe_b B_x M'_y T_z$$

where M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, and b, x, y and z are atomic percentages which respectively satisfy $75<b<93$, $6.5<x18$, $4<y<10$, and $z<4.5$.

45. The magnetic core of claim 44, wherein $0.2<z<4.5$.

46. The magnetic core of claim 37, wherein said soft magnetic alloy ribbon has a composition expressed by the following general formula:

$$Fe_b B_x M'_y T_z X_u$$

where M' is at least one element selected from a group consisting of Ti, V, Nb, Ta, Mo and W combine with any of Ti, Nb and Ta, T is at least one element selected from a group consisting of Cu, Ag, Au, Pd, Pt and Bi, X is at least one element selected from a group consisting of Cr, Ru, Rh and Ir, and b, x, y, z and u are atomic percentages which respectively satisfy $75<b<93$, $6.5<x18$, $4<y<10$, $z<4.5$, and $u<5$.

47. The magnetic core of claim 46, wherein $0.2<z<4.5$.

48. The magnetic core of claim 37, wherein said soft magnetic alloy ribbon has a composition expressed by the following general formula:

$$(Fe_{1-a} Z_a)_b B_x M'_y T_z$$

where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, and a, b, x, y and z are atomic percentages which respectively satisfy $a<0.1$, $75<b<93$, $6.5<x18$, $4<y10$, and $z<4.5$.

49. The magnetic core of claim 48, wherein $0.2<z<4.5$.

50. The magnetic core of claim 37, wherein said soft magnetic alloy ribbon has a composition expressed by the following general formula:

$$(Fe_{1-a} Z_a)_b B_x M'_y T_z X_u$$

where Z is Co and/or Ni, M' is at least one element selected from a group consisting of Ti, V, Nb, Ta, Mo and W combined with any of Ti, Nb and Ta, T is at least one element selected from a group consisting of Cu, Ag, Au, Pd, Pt and Bi, X is at least one element selected from a group consisting of Cr, Ru, Rh and Ir, and a, b, x, y, z and u are atomic percentages which respectively satisfy $a<0.1$, $75<b<93$, $6.5<x<18$, $4<y<10$, $z<4.5$, and $u<5$.

51. The magnetic core of claim 50, wherein $0.2<z<4.5$.

52. The magnetic core of claim 37, wherein said soft magnetic alloy ribbon has a composition expressed by the following general formula:

$$Fe_b B_x M_y T_z$$

where M is at least one element selected from a group consisting of Ti, Zr, Hf, V, Nb, Ta, Mo and W combined with Zr and/or Hf, T is at least one element selected from a group consisting of Cu, Ag, Au, Pd, Pt and Bi, and b, x, y and z are atomic percentages which respectively satisfy $75<b<93$, $0.5<x<18$, $4<y<10$, and $z<4.5$.

53. The magnetic core of claim 52, wherein $0.2<z<4.5$.

* * * * *

UNITED STATES PATENT AND TRADEMARK OFFICE
CERTIFICATE OF CORRECTION

PATENT NO. : 5,619,174
DATED : April 8, 1997
INVENTOR(S) : Kimura, Youichi; Makino, Akihiro; Masumoto, Tsuyoshi; Inoue, Akihisa It is certified that error appears in the above-identified patent and that said Letters Patent is hereby corrected as shown below:

Col. 32, line 21, delete "$Fe_bBM_y$" and insert --$Fe_bB_xM_y$--

Col. 34, line 1, delete "T=" and insert --$T_2$--

Delete "<" and insert "≤" in the following locations:

Col. 32, lines 26, 36, 37, 46, 47, and 59
Col. 33, lines 2, 12, 13, 23, 24, 33, 34, 61, 62, and 64
Col. 34, lines 8, 9, 11, 23, 24, 26, 39, 40, 42, 53, and 55
Col. 35, lines 2, 3, 5, 16, 17, 19, 31, 32, 35, 52, 53, 63, and 64
Col. 36, lines 7, 16, 26, 27, 37, 47, 48, and 58
Col. 37, lines 12, 13, 14, 26, 27, 40, 41, 42, 53, and 54
Col. 38, lines 12, 13, 14, 25, 26, 27, 39, 40, 41, 51, 52, and 53

Signed and Sealed this

Ninth Day of September, 1997

Attest:

Bruce Lehman

BRUCE LEHMAN

*Attesting Officer* *Commissioner of Patents and Trademarks*